US012787645B2

(12) United States Patent
Lomenzo et al.

(10) Patent No.: US 12,787,645 B2
(45) Date of Patent: Nov. 3, 2026

(54) SWITCHABLE NONVOLATILE PYROELECTRIC DEVICE

(71) Applicant: NaMLab gGmbH, Dresden (DE)

(72) Inventors: Patrick Dominic Lomenzo, Dresden (DE); Uwe Schröder, Dresden (DE)

(73) Assignee: NaMLab gGmbH, Dresden (DE)

( * ) Notice: Subject to any disclaimer, the term of this patent is extended or adjusted under 35 U.S.C. 154(b) by 947 days.

(21) Appl. No.: 18/104,524

(22) Filed: Feb. 1, 2023

(65) Prior Publication Data

US 2024/0260472 A1 Aug. 1, 2024

(51) Int. Cl.
*H10N 19/00* (2026.01)

(52) U.S. Cl.
CPC .................................... *H10N 19/00* (2023.02)

(58) Field of Classification Search
CPC ............ H10N 19/00; H10N 15/10; G01J 5/34
See application file for complete search history.

(56) References Cited

U.S. PATENT DOCUMENTS 10,056,393 B2 8/2018 Schröder et al.

FOREIGN PATENT DOCUMENTS

JP 2024140551 A * 3/2023 ................ G01J 1/02

OTHER PUBLICATIONS

English translation of JP2024140551A (Year: 2023).*
Mart et al., "Enhanced pyroelectric response at morphotropic and field-induced phase transitions in ferroelectric hafnium oxide thin films", APL Materials 9, 051120 (2021); https://doi.org/10.1063/5.0051329, 8 pages.
Lomenzo et al., "Universal Curie constant and pyroelectricity in doped ferroelectric HfO2 thin films", Nano Energy 74, 104733 (2020); https://doi.org/10.1016/j.nanoen.2020.104733, 10 pages.
Lomenzo et al., "Memory Window Enhancement in Antiferroelectric RAM by Hf Doping in $ZrO_2$,", IEEE Electron Device Letters 43, 9, 1447 (2022); 10.1109/LED.2022.3189159 or https:/ieeexplore.ieee.org/document/9817142, 4 pages.
Smith et al., "Pyroelectric response in crystalline hafnium zirconium oxide (Hf1-xZrxO2) thin films", Appl. Phys. Lett. 110, 072901 (2017); https://doi.org/10.1063/1.4976519, 6 pages.

* cited by examiner

*Primary Examiner* — Changhyun Yi
(74) *Attorney, Agent, or Firm* — Edell, Shapiro & Finnan, LLC

(57) ABSTRACT

Described are thermal-to-electrical signal transducers including band-gap materials with a pinched or double hysteresis loop (DHL) charge-voltage characteristic in a pyroelectric device that have electrically switchable active (on) and inactive (off) pyroelectric states. DHL materials include field induced ferroelectrics (FFE), Kittel-type antiferroelectric (KAFE), defect-biased ferroelectric (DBFE), and ferroelastic switching (FES) materials. The pyroelectric device includes a material stack with a DHL material layer between two electrodes. A built-in electric field is required for the application of the device, which can be induced by electrodes having different workfunctions. Pyroelectric devices employing the DHL material stack include pyroelectric detectors, thermal imaging systems, infrared sensors, and energy harvesters. Nonvolatile pyroelectric switches can replace choppers in uncooled pyroelectric arrays, achieve reprogrammable thermal sensor pixel size and image resolution, and yield infrared detectors with multiple reprogrammable detection paths and spatial scanning of the environment.

20 Claims, 42 Drawing Sheets

SWITCHABLE NONVOLATILE PYROELECTRIC DEVICE

TECHNICAL FIELD

The present disclosure relates generally to switchable nonvolatile pyroelectric devices and circuits and systems employing the same.

BACKGROUND

A ferroelectric (FE) is an insulating or semiconducting material that has a spontaneous electric polarization. The application of an electric field can change the direction of the spontaneous polarization whereby the permanent electric dipole moments align with the direction of the electric field. The electric field needed to switch the spontaneous polarization is called the coercive field. The persistence of a temperature sensitive polar state enables ferroelectrics to exhibit the pyroelectric effect whereby incident electromagnetic radiation, often in the infrared spectrum, is converted into an electric signal.

A ferroelectric phase is formed from a high temperature paraelectric parent phase. The high temperature paraelectric phase exhibits no or insignificant spontaneous electric polarization, has a linear dielectric constant at low applied electric fields, and therefore has no pyroelectric response in the absence of an electric field.

A phase transition from the paraelectric phase to the ferroelectric phase occurs when cooling the material through the Curie temperature, $T_C$. Phase transitions involving a ferroelectric phase depend on the thermodynamic stability of the material, which can be influenced by temperature, internal or external stress and strains, and electric fields. A temperature induced phase transition from a polarized ferroelectric phase to a nonpolar paraelectric phase yields an irreversible giant pyroelectric effect. Since the ferroelectric phase must be polarized with an electric field each time after cooling below the Curie temperature and the giant pyroelectric effect is highly nonlinear, temperature induced phase transitions are not good candidates for passive (uncooled) pyroelectric sensors and arrays.

First order phase transitions can take place in the presence of an electric field. Such phase transitions can be reversed by heating or cooling the material through the Curie temperature, but the thermal path of the phase transition may deviate when the critical transition temperatures $T_0$ and $T_1$ differ. $T_0$ is the critical temperature of the paraelectric phase and demarcates the temperature below which the paraelectric phase cannot exist. $T_1$ is the critical temperature of the ferroelectric phase and demarcates the temperature above which the ferroelectric phase cannot exist. When $T_1$ and $T_0$ differ, the phase transition is of first order and the material exhibits a maximum thermal hysteresis defined by the difference of $T_1$ and $T_0$.

When the temperature of material is between $T_C$ and $T_1$, the ferroelectric phase is metastable and the paraelectric phase is stable. The application of an electric field can cause the ferroelectric phase to become stable and the paraelectric phase to become metastable or unstable. When the application or removal of an electric field causes a phase transition between a paraelectric and a ferroelectric phase, a reversible field-induced first-order phase transition occurs. First-order phase transitions include paraelectric-to-ferroelectric, ferroelectric-to-paraelectric, antipolar-to-ferroelectric, and ferroelectric-to-antipolar transitions. The electric-field driven first-order phase transitions thus enables electric field control of polar and nonpolar/antipolar phases that correspond to pyroelectric and non-pyroelectric states respectively.

The discovery of ferroelectric barium titanate ($BaTiO_3$) triggered an increase in research on ferroelectric materials, since it was widely recognized that the existence of robust, chemically stable, and relatively inert ferroelectric crystals can yield a wide variety of electronic devices, sensors, and actuators. Reversible changes in the spontaneous polarization with temperature give rise to the primary pyroelectric response, which has been used for infrared (IR) detectors, sensors, and transducers in prior art. Changes in the temperature of ferroelectrics lead to the generation of a pyroelectric voltage or current, which can be deployed in open-circuit, short-circuit, or in various circuit configurations well-known in those skilled in the art. The spontaneous polarization is present in the ferroelectric phase, but not in the paraelectric or antipolar phase of the material, thus, the primary pyroelectric response is present in the ferroelectric phase and absent in the paraelectric or antipolar phase.

All ferroelectric phases are also pyroelectric phases, but pyroelectric phases are not necessarily ferroelectric. A ferroelectric phase is a polar, non-centrosymmetric phase in which the spontaneous polarization direction can be changed with an electric field. In contrast, a pyroelectric phase is not ferroelectric if it has a polar, non-centrosymmetric phase where the spontaneous polarization direction cannot be changed with an electric field.

A material that exhibits antiferroelectric (AFE) properties is understood by those skilled in the art as a crystal whose structure can be considered as (i) being composed of two sub-lattices polarized spontaneously in antiparallel directions or (ii) a material in which a reversible paraelectric-to-ferroelectric phase transition can be induced with an electric field. A conventional perovskite example for an AFE material would be $PbZrO_3$. Some refer to class (ii) of antiferroelectrics to be 'field-induced ferroelectrics', although this distinction is not made here since the electrical and pyroelectric device performance is practically indistinguishable with regard to these two classes of microscopic configurations, both exhibiting double hysteresis loops (DHL). Class (i) and (ii) will both be referred to as 'AFE' without distinction.

An antiferroelectric material is both ferroelectric and pyroelectric when the ferroelectric phase is induced with an electric field, but the paraelectric or antipolar phase, in the absence of an electric field, is neither ferroelectric nor pyroelectric.

With the discovery of the ferroelectric properties of silicon doped hafnium oxide ($Si:HfO_2$), the compatibility of pyroelectric-based embedded and integrated IR sensors and detectors to complementary metal-oxide-semiconductor (CMOS) processes is significantly enhanced. Traditional pyroelectric and ferroelectric materials, such as lead zirconate titanate (PZT) and lithium tantalite, are difficult to integrate due to compatibility issues with CMOS processing and poor scalability. The discovery of the ferroelectric properties in doped hafnium oxide has changed the outlook for embedded and integrated IR sensors and detectors. After reaching CMOS compatibility and state-of-the-art scalability with 3-dimensional trench capacitors, doped-$HfO_2$ and $Hf_{1-x}Zr_xO_2$ were confirmed to exhibit pyroelectric properties that can be used in may be deployed as individual pixels and/or forming a plurality of infrared sensitive pixels.

Typically, $HfO_2$ based ferroelectric capacitors must be doped and exist in a crystalline form to exhibit ferroelectric properties. Doping can be used to obtain antiferroelectric-like or antiferroelectric properties. In the $Hf_{1-x}Zr_xO_2$ oxide system (HZO), a higher $ZrO_2$ content in the HZO layer, causes stronger AFE-like properties with a signature double polarization-voltage (P-V) hysteresis, sometimes referred to as a pinched hysteresis loop. Pinched or antiferroelectric hysteresis characteristics will be generically referred to as double hysteresis loops (DHL) throughout this application. Since the antiferroelectric doped $HfO_2$-based and HZO-based can exhibit a pyroelectric response when the ferroelectric phase is induced with an electric field, a pyroelectric voltage or current can be turned off and on by changing the phase of the material from a paraelectric or antipolar phase to a ferroelectric phase, respectively.

Since ferroelectric materials always contain a spontaneous polarization, the generation of a pyroelectric current or voltage cannot in principle be turned off and on with an electric field, which is a limitation of the prior art. A macroscopic nonpolar state across a ferroelectric capacitor is, moreover, difficult to achieve and unstable with an equal fraction of up and down ferroelectric domains because small perturbations near the coercive field yield a net dipole moment that will then give rise to a pyroelectric response. Ferroelectrics are not capable of distinguishable and thermodynamically stable on and off pyroelectric states.

A pyroelectric on-state is defined as the generation of a pyroelectric current or voltage with a change in temperature of the pyroelectric material. A pyroelectric off-state is defined as the absence or near-absence of a pyroelectric current or voltage with a change in temperature of the pyroelectric material.

In both class (i) and (ii) of antiferroelectric materials, commonly referred to as antipolar or field-induced ferroelectrics, respectively, a pyroelectric on-state and a pyroelectric off-state can be induced with an electric field. The charge-voltage characteristic hysteresis curves of these materials displaying charge polarization depending on an external field (e.g., by an external voltage) exhibit a double hysteresis loop (DHL) where the charge-voltage characteristic has a first hysteresis loop in the positive voltage regime, a second hysteresis loop in the negative voltage regime, and the charge is linearly related to voltage in the immediate vicinity of 0 volts (corresponding to the absence of an electric field). These types of materials do not have a stable pyroelectric on-state without the presence of an electric field because the ferroelectric phase transitions into the paraelectric or antipolar phase when the electric field is removed. Without the presence of an electric field, AFE materials exhibit an extremely weak or nonexistent pyroelectric response. Therefore, prior art has not been able to incorporate DHL materials into passive infrared detectors and thermal imaging systems.

Prior art pyroelectric devices exhibit a metal-insulator-metal (MIM) capacitor structure. In these devices, the capacitor comprises two opposing parallel metal layers (electrodes) with similar workfunctions and a ferroelectric layer existing in between the electrodes. This conventional pyroelectric capacitor structure permits the generation and extraction of electric charge with changes in temperature of the insulating or semiconducting ferroelectric material. The conducting electrode layers used in MIM capacitors are characterized by similar workfunction materials for both electrodes, which results in either a small or insignificant built-in electric field within the ferroelectric, yielding symmetric or only slightly asymmetric P-V hysteresis loops.

FIG. 1A is a plot of the charge-voltage relationship 101 for ferroelectric materials. In the as-fabricated state (i), regardless of whether the ferroelectric is crystalline after deposition or after a subsequent exposure to elevated temperature, the net dipole moment of the material is zero or insignificant compared to the saturated state. The application of an electric field pointing toward the first electrode aligns the switchable dipoles toward the first electrode (ii) causing the hysteresis loop to saturate. A remanent polarization with ferroelectric dipoles pointing toward the first electrode persists after the removal of the applied electric field (iii). The application of an electric field pointing toward the second electrode aligns the switchable dipoles toward the second electrode (iv) causing the hysteresis loop to saturate. A remanent polarization with ferroelectric dipoles pointing toward the second electrode persists after the removal of the applied electric field (v).

FIG. 1B is a diagram illustrating the initial state of a layered device having a ferroelectric (FE) material placed between a first conducting material serving as a second electrode 102 and a second conducting material serving as a first electrode 103. The polarization orientation 104 of the as-fabricated FE material is shown to be in random directions (the initial state corresponding to state i in 101).

FIG. 1C is a diagram illustrating a layered device having a ferroelectric (FE) material placed between a second electrode 102 and a first electrode 103 with an electric field. The polarization orientation 105 of the FE material under an applied electric field pointing to the first electrode is shown to have its switchable dipoles pointing in the same direction as the saturation electric field (corresponding to state ii in 101).

FIG. 1D is a diagram illustrating a layered device having a ferroelectric (FE) material placed between a second electrode 102 and a first electrode 103 without an electric field. A remanent polarization state 106 of the ferroelectric material persists with no applied electric field and its switchable dipoles yield a net polarization pointing toward the first electrode (corresponding to state iii in 101).

FIG. 1E is a diagram illustrating a layered device having a ferroelectric (FE) material placed between a second electrode 102 and a first electrode 103 with an electrical field pointing to the second electrode. The polarization orientation 107 of the FE material under an applied electric field pointing to the second electrode is shown to have its switchable dipoles pointing in the same direction as the saturation electric field (corresponding to state iv in 101).

FIG. 1F is a diagram illustrating a layered device having a ferroelectric (FE) material placed between a second electrode 102 and a first electrode 103 again with no electrical field. A remanent polarization of the ferroelectric material persists 108 with no applied electric field and its switchable dipoles yield a net polarization pointing toward the second electrode (corresponding to state v in 101).

FIG. 2A depicts a layered device incorporated into an electrical circuit including a ferroelectric material placed in between a second electrode 102 and a first electrode 103. The second electrode 102 is connected by a conductor to one terminal of the load 203 and the first electrode 103 is connected to another terminal of the load 203. The load 203 comprises of one or more passive or active circuit elements. When the load 203 is removed or replaced with a conducting element, the layered device is in an open circuit or short circuit configuration, respectively. The ferroelectric layer 106 is depicted in a zero-applied electric field state with a remanent polarization wherein the dipoles point toward the first electrode 103. A change in temperature generates an electric current $I_p$ 201 and a voltage $V_p$ 202 due to the temperature dependency of the dipoles in the FE layer 106. The pyroelectric current is described by the change in polarization with temperature, $$I_p = A\frac{dP}{dT},$$

where A is the area of the ferroelectric capacitor, P is the ferroelectric polarization, and T is the temperature.

FIG. 2B depicts a layered device incorporated into an electrical circuit including a ferroelectric material placed in between a second electrode 102 and a first electrode 103. The second electrode 102 is connected by a conductor to one terminal of the load 203 and the first electrode 103 is connected to another terminal of the load 203. The load 203 comprises of one or more passive or active circuit elements. When the load 203 is removed or replaced with a conducting element, the layered device is in an open circuit or short circuit configuration, respectively. The ferroelectric layer 108 is depicted in a zero-applied electric field state with a remanent polarization wherein the dipoles point toward the second electrode 102. A change in temperature generates an electric current $I_p$ 204 and a voltage $V_p$ 205 due to the temperature dependency of the dipoles in the FE layer 108.

Infrared or thermal imaging systems contain a plurality of pyroelectric pixels that can detect infrared radiation and produce an image discernible by the human eye. Any particular scene contains objects with different thermal signatures where the emitted infrared radiation can be used to construct a visual representation from a plurality of infrared sensing pixels.

The basic components of a thermal imaging system usually include optics for collecting and focusing infrared radiation from the environment, an infrared detecting material used to construct a plurality of thermal sensors that convert infrared radiation into electrical signals, and electronics for amplifying and processing the electrical signal into a visual display or an appropriate storage medium. To provide a background reference signal, most thermal imagers include a chopper that rotates to cyclically change whether environmental radiation is transmitted or blocked from reaching the thermal sensors.

Choppers are used in infrared detection and imaging systems to provide contrast for slow-moving or static objects. The chopper blades rotate over the pyroelectric elements to shield and allow the transmission of environmental electromagnetic radiation to the elements during certain time periods, creating active and inactive pyroelectric states. The maximum readout frequency of the signals in a thermal pixel array with a chopper is limited to the frequency of the mechanical rotation of the chopper blades.

Thermal imaging systems are often categorized as uncooled or cooled. Uncooled thermal imaging systems operate based on a temperature change of the pyroelectric materials that produces a voltage change at the device terminals as caused by infrared radiation striking the thermal sensors. Cooled detectors typically rely on an internal photoelectron effect that produces a voltage with incident infrared radiation. Uncooled thermal imaging systems that have thermal sensors which generate a voltage due to a change in temperature often includes thermal isolation between the thermal sensors and the integrated substrate as well as peripheral circuitry for appropriate responsivity to infrared radiation. Reduction of thermal cross-talk between IR sensing pixels may be aided by thermal isolation between pixels.

Other applications that employ pyroelectric materials as thermal sensors include gas spectroscopy and IR detectors.

Pyroelectric materials employed in prior art applications consist of ferroelectric films that are not able to be electrically toggled into persistent pyroelectric and non-pyroelectric states. The toggling of pyroelectric and non-pyroelectric states can lead to pyroelectric switches, thermal logic devices, new readout techniques for imaging, adjustable pixel resolution, and power-saving features thermal sensors.

SUMMARY

Described herein is a new concept for a pyroelectric transducer that incorporates a polar, antipolar, and/or nonpolar material with a band gap (BG) material) and characterized with pinched or double P-V hysteresis loops (DHL) with the application of an external electric field. All dielectrics and most semiconductors are BG materials. For the devices described further herein it is of advantage that the band gap of the BG material is 0.8 eV or larger. Polar, antipolar, and/or nonpolar BG materials which may exhibit pinched or double P-V hysteresis behavior as a result of an applied external electric voltage include, but are not limited to: anti-ferroelectric (AFE), field-induced ferroelectric (FFE), relaxor ferroelectric (RFE), ferroelastic switching (FES), and defect-biased ferroelectric (DBFE) materials. Polar, antipolar, and/or nonpolar DHL materials with a band gap include: Fluorite structured materials such as (i) $HfO_2$, $ZrO_2$, $ZrO_2$ and/or $HfO_2$ doped with one or more of the following: Al, Ti, Si, Gd, La, Sr, Ge, Y, Sc, Ca, and perovskite-based materials such as (ii) $Pb_{1-x}La_x(Zr_{1-y}Ti_y)O_3$, $PbZrO_3$, $BaTiO_3$, $Pb(Zr_{1-y}Ti_y)O_3$. The inventive concept disclosed herein enables elements employing a polar, antipolar, and/or nonpolar DHL material with a band gap to be used as a nonvolatile pyroelectric switch with 'ON' and 'OFF' pyroelectric states. In one particular enabling device configuration, a device comprises a polar, antipolar, and/or nonpolar band gap material incorporated within a capacitor geometry whereby electrode materials of different workfunctions compose the parallel conducting plates. According to the inventive concepts described herein, the difference of the material workfunctions between the opposing electrodes establishes a built-in (internal) electric field that facilitates enduring and electrically-switchable nonvolatile states between polar (pyroelectric) and nonpolar (non-pyroelectric) modes of operation. The inventive concept enables the integration and deployment of nonvolatile pyroelectric switches for sensing, detection, imaging, and energy harvesting applications.

The inventive integration concept of a nonvolatile pyroelectric switch (NVPS) described herein provides new functionality to a passive transduction element that has several advantages over conventional passive pyroelectric materials. This includes a stack comprising a polar, antipolar, and/or nonpolar DHL material with a band gap sandwiched between electrodes with asymmetric workfunction values needed for the creation of a built-in bias field that enables distinguishable active (on) and inactive (off) pyroelectric states.

The pyroelectric transducing element is operated as a passive device after it has been electrically switched into either an active pyroelectric state (ON) or an inactive pyroelectric state (OFF) while no external electric field is being applied. The term "no external electric field" means that no external voltage is applied to the pyroelectric transducing element. However, the meaning of no external electric field does not exclude the case where an internal electrical field is present, e.g., static charges included in the layers of the transducing element or by different workfunctions of electrodes used in the transducing element. The transducing element may also be operated in the presence of an external electric field whereby the active (ON) or inactive (OFF) pyroelectric state persists in the presence of the external field. The transducing element operated in the presence of an external electric field is in an active mode and will consume more power compared to the transducing element operated in the zero-field (passive) mode because it is understood that an external voltage is applied to the pyroelectric transducing element to achieve an external electric field. The passive operation mode of the transducing element is beneficial for battery operated and wireless devices due to the lower power consumption when compared to an active transducing mode. Because of the advantages of using the pyroelectric transducing element in the passive mode or zero-field mode, the following disclosed examples are illustrative described in the passive mode or zero-field mode. Those skilled in the art can modify and practice these examples where the transducing element is operated in the presence of an external electric field having the benefit of the teaching herein.

The integration concept and stack described herein utilizes materials composed of different workfunctions for the electrode materials of the pyroelectric device and replaces the ferroelectric material used in the prior art with an antiferroelectric material. To establish nonvolatile pyroelectric and non-pyroelectric states, a shift of the P-V hysteresis curve must be established through the presence of an internal, built-in electric field such that a point along one of the two hysteresis loops of the charge-voltage characteristic coincides with the zero applied voltage condition to enable the DHL material to persist, in the absence of an external electric field, in a pyroelectric on-state and in a pyroelectric off-state. The electric field can be generated by electrode materials with a workfunction difference in the range of 0.1-3.5 eV. In alternative configurations, the internal electric field can be achieved by electric charge stored in the DHL polar, antipolar, and/or nonpolar band gap material itself, static defect charge, surface charge, or with the introduction of an additional layer that introduces surface charge.

Prior art $HfO_2$ based ferroelectric capacitors have a relatively short electric-field cycling endurance most notably observed by early breakdown of the devices between $10^3$-$10^8$ electric field cycles. Significantly higher cycling endurance (>$10^{10}$ cycles) has been demonstrated in pinched and DHL AFE doped-$HfO_2$ and $ZrO_2$-based films, including Si-doped $HfO_2$ and $Hf_{1-x}Zr_xO_2$. In $Hf_{1-x}Zr_xO_2$ (HZO), more significant pinching or DHL properties are present at Zr-rich compositions (x>0.6) as seen by the progressive development of a double P-V hysteresis loop. The emergence of double P-V hysteresis loops is strongly correlated with improved electric field cycling endurance, which is beneficial for pyroelectric devices that are toggled between ON and OFF states.

The introduction of interfacial layers can additionally be employed to prevent grain boundaries spanning from one electrode interface to the opposing electrode interface. Such interfacial layers can be inserted into a dielectric $ZrO_2$ layer to segregate the crystalline structure at the interfacial layer/dielectric boundary. The aforementioned grain-boundary engineering can block defect movement along grain boundaries, resulting in improved cycling endurance and breakdown characteristics. As a particular example, an $Al_2O_3$ or other high band gap dielectric interlayer with high crystallization temperature can improve certain aspects related to the performance of the pinched or DHL capacitors. Furthermore, an $Al_2O_3$ interlayer decreases the grain size of the polar, antipolar, and/or nonpolar layer which is a band gap material and therefore improves the variability of the device for mass manufacturing.

$ZrO_2$ based thin films with or without interlayers are fully CMOS compatible, can be incorporated into 3-dimensional structures, and are readily available in existing semiconductor DRAM processes. Moreover, a polar, antipolar, and/or nonpolar band-gap material, such as $ZrO_2$, has a higher electric field cycling endurance (lifetime) than a doped ferroelectric $HfO_2$ material. Similar behavior is achievable for other materials that display signature double P-V hysteresis, regardless of the particular band-gap material classifications that can include antipolar phases, field-induced ferroelectrics, relaxor ferroelectrics, or other material classifications where a double or pinched P-V hysteresis is observed.

To enable nonvolatile and electric-field switchable pyroelectric ON and OFF states, the presence of an internal electric field within the polar, antipolar, and/or nonpolar band-gap material shifts the P-V double hysteresis loop to center either the positive or negative hysteresis such that at zero external electric field, a distinguishable nonpolar and polar state can be observed. Specifically, a point along either the positive or negative hysteresis loop of the charge-voltage characteristic is shifted to coincide with the zero applied voltage condition to enable the DHL material to persist, in the absence of an external electric field, in a pyroelectric on-state and in a pyroelectric off-state. The internal electric field can be generated by electrode materials with a workfunction difference of about 1 eV as a particular example for 10 nm $ZrO_2$-based DHL polar, antipolar, and/or nonpolar band-gap material, which yields a voltage shift on the order of 1V. The particular workfunction difference needed to achieve the inventive concept will depend on the polar, antipolar, and/or nonpolar band-gap material composition, crystal structure, thickness, and operating temperature. This inventive device configuration results in a pyroelectric device where the pyroelectric signal can be toggled between ON and OFF states through the combination of a persistent internal electric field and the transient application of an external electric field.

In addition to the previously discussed pyroelectric applications, the inventive integration of the pyroelectric switches can be incorporated into ultra-low power systems, infrared camera and radars with scanning and directional functionalities, tracking and surveillance systems, gas sensors, security and encryption keys, as well as autonomous systems such as drones and automobiles that make use of the ON and OFF pyroelectric states. Chopper functionality can be replaced by switching the pyroelectric elements into ON and OFF states, greatly reducing the packaging and system complexity and enhancing electronic scanning performance in pyroelectric arrays.

Besides pyroelectric applications, the inventive device stack with different workfunction electrode materials proposed herein can be used for energy harvesting devices, piezoelectric devices, supercapacitors, thermal logic devices, and other devices using polar, antipolar, and/or nonpolar band-gap materials with pinched or double-hysteresis loop properties of the band-gap material in which a polar and nonpolar state can be switched with an applied electric field and persist due to the continuous presence of an internal electric field within the device.

It is to be understood that the polar, antipolar, and/or nonpolar material is described in this disclosure as a polar, antipolar, and/or nonpolar band-gap material. The material used in the devices are incorporated in layers, films or deposits. The material can be of mono crystalline, polycrystalline or films combined out of polycrystalline and amorphous type of material. It is further understood that the polar, antipolar, and/or nonpolar material is only a part or entirety of a layer giving the layer the properties described herein. In addition it is to be understood that that the polar, antipolar, and/or nonpolar film could be a multi-layer film and could include additions layers not of the type of polar, antipolar, and/or nonpolar material.

Specific examples of the device described herein could involve a lateral layered stack parallel to the surface of wafer or substrate. In other devices the layered stack could be vertical to the surface of a wafer or substrate. In specific implementations, the layered stack could be a combination of lateral and vertical orientations to the surface of a wafer or substrate or of any direction of the surface of a wafer or substrate.

DETAILED DESCRIPTION

Described herein is a new concept for integration of a double hysteresis loop (DHL) material in a pyroelectric device. These materials are characterized by a double hysteresis loop during the application of an external electric field. Materials that exhibit such behavior as a result of an applied external electric field are grouped under the term antiferroelectrics (AFE), which may include field induced ferroelectrics (FFE), antipolar Kittel-type antiferroelectrics (KAFE), defect-biased ferroelectric (DBFE) materials, and ferroelastic switching (FES) materials.

In the following, a detailed description based on referencing the figures is presented. It is to be understood that the features of the various example implementations described herein may be combined with each other, unless specifically noted otherwise. The examples hereinafter disclosed are not intended to be exhaustive or limit the scope of the described concepts to the precise forms disclosed in the following description. Rather, the disclosed examples are chosen and described so that others skilled in the art may utilize its teachings.

Figure 3A:
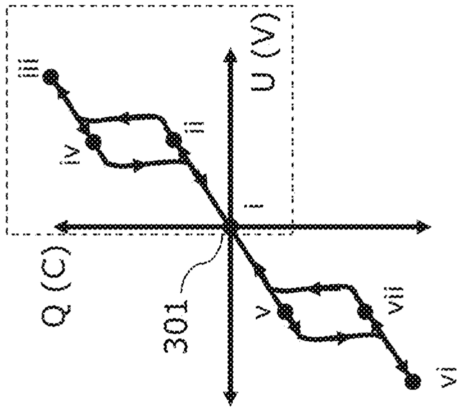
FIG. 3A illustrates charge as a function of voltage for a double hysteresis loop material with charge-voltage characteristics where the positive hysteresis branch is demarcated to depict the material in states i, ii, iii, and iv.

FIG. 3A illustrates the charge-voltage characteristics of a DHL material with the positive voltage hysteresis branch 301 demarcated in dotted lines. The positive voltage hysteresis branch 301 encompasses DHL states i, ii, iii, and iv.

Figure 3B:
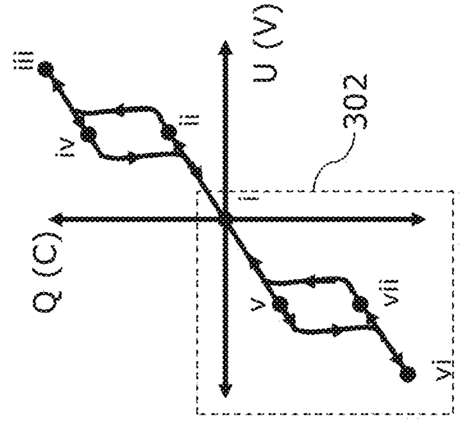
FIG. 3B illustrates charge as a function of voltage for a double hysteresis loop material with charge-voltage characteristics where the negative hysteresis branch is demarcated to depict the material in states i, v, vi, and vii in FIG. 3A.

FIG. 3B illustrates the charge-voltage characteristics of a DHL material with the negative voltage hysteresis branch 302. The negative voltage hysteresis branch 302 encompasses DHL states i, v, vi, and vii.

Figure 4D:
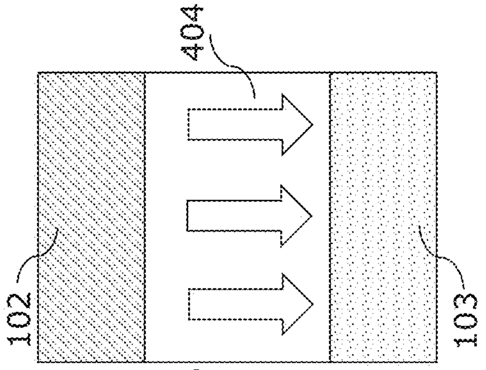
FIG. 4D illustrates the FFE material in the ferroelectric phase with the polarization pointing towards the first electrode when the electric field strength is smaller than the forward transition field and larger than the backward transition field. The diagram corresponds to state iv in the charge-voltage plot given in FIG. 3A.
Figure 4C:
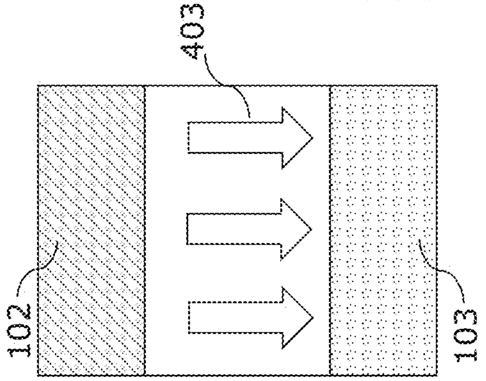
FIG. 4C illustrates the FFE material in the ferroelectric phase with the polarization pointing towards the first electrode when the electric field strength is larger than the forward transition field. The diagram corresponds to state iii in the charge-voltage plot given in FIG. 3A.
Figure 4B:
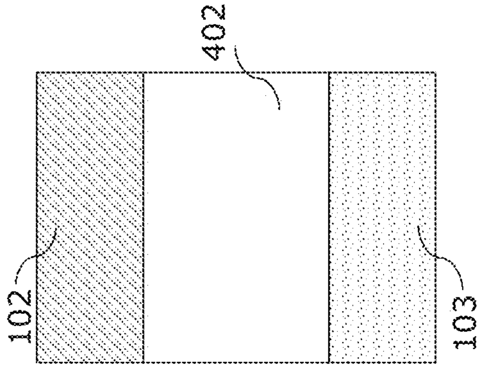
FIG. 4B illustrates the FFE material in a paraelectric phase when the electric field strength is lower than the forward transition field. The diagram corresponds to state ii in the charge-voltage plot given in FIG. 3A.
Figure 4A:
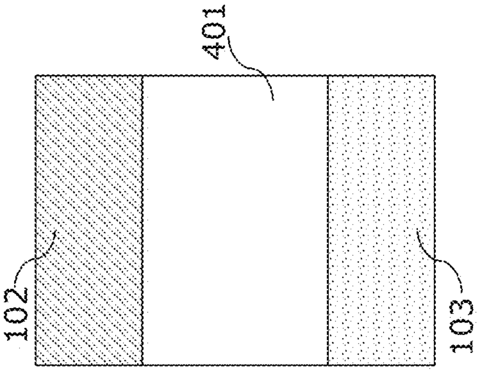
FIG. 4A illustrates a field-induced ferroelectric (FFE) material in a paraelectric phase without the presence of an electric field. The diagram corresponds to state i in the charge-voltage plot given in FIG. 3A.

FIG. 4A shows a layered device having a field-induced ferroelectric (FFE) material layer 401 placed between a second electrode 102 and a first electrode 103. The diagram illustrates an FFE material layer 401 in a paraelectric phase in the absence of an electric field. The depiction corresponds to DHL state i in positive voltage hysteresis branch 301 in FIG. 3A.

FIG. 4B shows a layered device having a field-induced ferroelectric (FFE) material layer 402 placed between a second electrode 102 and a first electrode 103. The diagram illustrates an FFE material layer 402 in a paraelectric phase in the presence of an electric field below the forward transition field. The depiction corresponds to DHL state ii in positive voltage hysteresis branch 301 in FIG. 3A.

FIG. 4C shows a layered device having a field-induced ferroelectric (FFE) material layer 403 placed between a second electrode 102 and a first electrode 103. The diagram illustrates an FFE material layer 403 that underwent an electric-field driven phase transition from a paraelectric phase to a ferroelectric phase. The ferroelectric phase is formed with its dipoles oriented with the electric field direction, pointing towards the first electrode. The electric field strength required to induce the ferroelectric phase from the paraelectric phase is called the forward transition field. The depiction corresponds to DHL state iii in positive voltage hysteresis branch 301 in FIG. 3A.

FIG. 4D shows a layered device having a field-induced ferroelectric (FFE) material layer 404 placed between a second electrode 102 and a first electrode 103. The diagram illustrates an FFE material layer 404 that underwent an electric-field driven phase transition from a paraelectric phase to a ferroelectric phase. The electric field strength is smaller than the forward transition field but larger than the backward transition field, causing the ferroelectric phase to be retained with the polarization pointing toward the first electrode. The depiction corresponds to state iv in the positive voltage hysteresis branch 301 in FIG. 3A. Upon removing the electric field, the FFE material transitions to the paraelectric phase in accordance with DHL state i in the positive voltage hysteresis branch 301 in FIG. 3A.

Figure 5A:
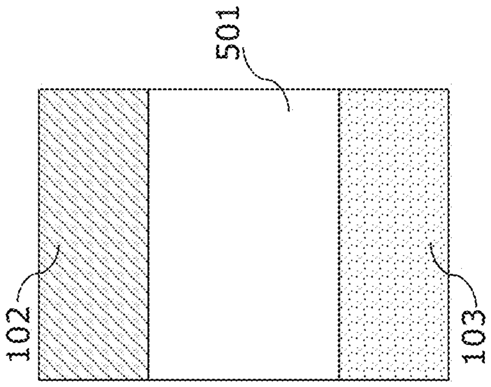
FIG. 5A illustrates the FFE material in a paraelectric phase without the presence of an electric field. The diagram corresponds to state i in the charge-voltage plot given in FIG. 3B.

FIG. 5A shows a layered device having a field-induced ferroelectric (FFE) material layer 501 placed between a second electrode 102 and a first electrode 103. The diagram illustrates an FFE material layer 501 in a paraelectric phase in the absence of an electric field. The depiction corresponds to DHL state i in the negative voltage hysteresis branch 302.

Figure 5B:
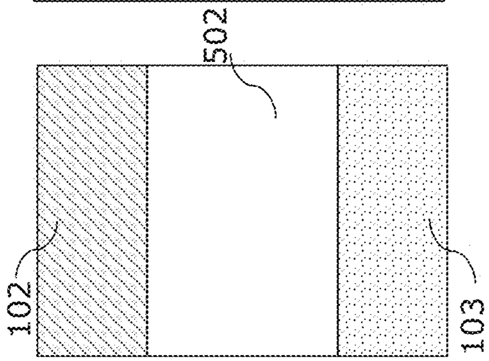
FIG. 5B illustrates the FFE material in a paraelectric phase when the electric field strength is lower than the forward transition field. The diagram corresponds to state v in the charge-voltage plot given in FIG. 3B.

FIG. 5B shows a layered device having a field-induced ferroelectric (FFE) material layer 502 placed between a second electrode 102 and a first electrode 103. The diagram illustrates an FFE material layer 502 in a paraelectric phase in the presence of an electric field below the forward transition field. The depiction corresponds to DHL state v in the negative voltage hysteresis branch 302 in FIG. 3B.

Figure 5C:
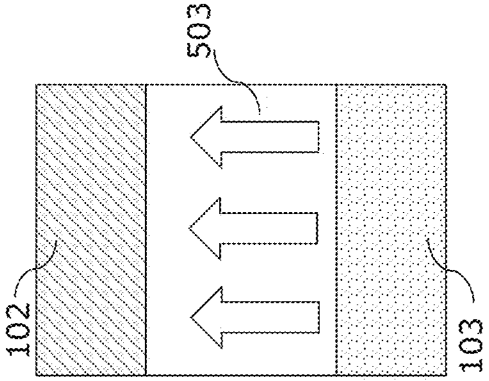
FIG. 5C illustrates the FFE material in the ferroelectric phase with the polarization pointing towards the second electrode when the electric field strength is larger than the forward transition field. The diagram corresponds to state vi in the charge-voltage plot given in FIG. 3B.

FIG. 5C shows a layered device having a field-induced ferroelectric (FFE) material layer 503 placed between a second electrode 102 and a first electrode 103. The diagram illustrates an FFE material layer 503 that underwent an electric-field driven phase transition from a paraelectric phase to a ferroelectric phase. The ferroelectric phase is formed with its dipoles oriented with the electric field direction, pointing towards the second electrode. The electric field strength required to induce the ferroelectric phase from the paraelectric phase is called the forward transition field. The depiction corresponds to DHL state vi in the negative voltage hysteresis branch 302 in FIG. 3B.

Figure 5D:
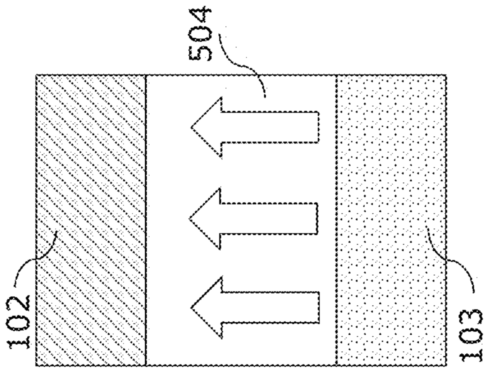
FIG. 5D illustrates the FFE material in the ferroelectric phase with the polarization pointing towards the second electrode when the electric field strength is smaller than the forward transition field and larger than the backward transition field. The diagram corresponds to state iv in the charge-voltage plot given in FIG. 3B.

FIG. 5D shows a layered device having a field-induced ferroelectric (FFE) material layer 504 placed between a second electrode 102 and a first electrode 103. The diagram illustrates an FFE material layer 504 that underwent an electric-field driven phase transition from a paraelectric phase to a ferroelectric phase. The electric field strength is smaller than the forward transition field but larger than the backward transition field, causing the ferroelectric phase to be retained with the polarization pointing toward the second electrode. The depiction corresponds to state vii in the negative voltage hysteresis branch 302 in FIG. 3B. Upon removing the electric field, the FFE material transitions to the paraelectric phase in accordance with DHL state i in the negative voltage hysteresis branch 302 in FIG. 3B.

Figure 6D:
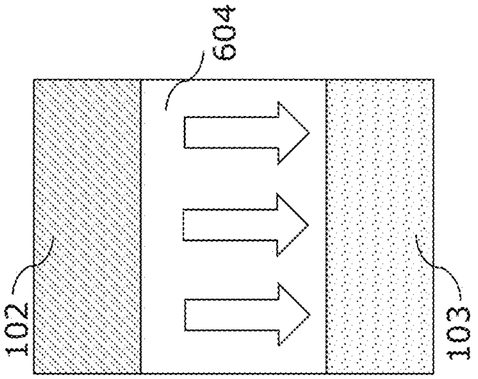
FIG. 6D illustrates the KAFE material in the ferroelectric phase with the polarization pointing towards the first electrode when the electric field strength is smaller than the forward transition field and larger than the backward transition field. The diagram corresponds to state iv in the charge-voltage plot given in FIG. 3A.
Figure 6C:
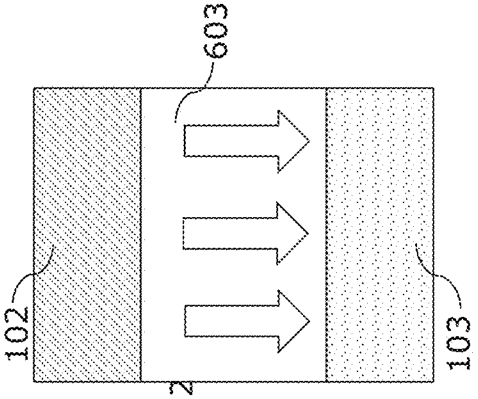
FIG. 6C illustrates the KAFE material in the ferroelectric phase with the polarization pointing towards the first electrode when the electric field strength is larger than the forward transition field. The diagram corresponds to state iii in the charge-voltage plot given in FIG. 3A.
Figure 6B:
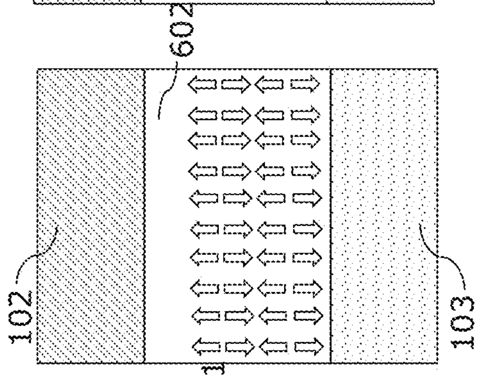
FIG. 6B illustrates the KAFE material in an antipolar phase or antipolar domain configuration when the electric field strength is lower than the forward transition field. The diagram corresponds to state ii in the charge-voltage plot given in FIG. 3A.
Figure 6A:
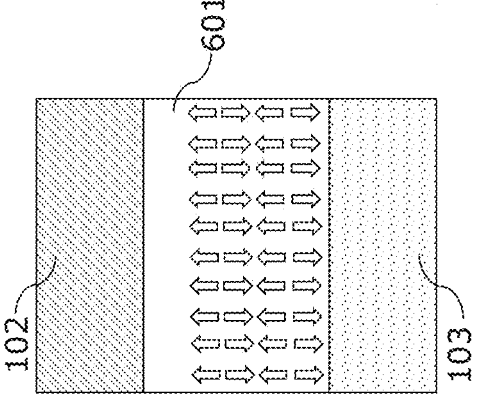
FIG. 6A illustrates a Kittel-type antiferroelectric (KAFE) material in an antipolar phase or antipolar domain configuration without the presence of an electric field. The diagram corresponds to state i in the charge-voltage plot given in FIG. 3A.

FIG. 6A illustrates a layered device having a Kittel-type antipolar antiferroelectric (KAFE) material layer 601 placed between a second electrode 102 and a first electrode 103. The KAFE material layer 601 has an antipolar phase or antipolar domain arrangement when there is no electric field. The antipolar phase has a negligible permanent dipole moment compared to the material's polar phase due to the antipolar arrangement of sub-lattices or antipolar coupling of domains. The depiction corresponds to DHL state i in the positive voltage hysteresis branch 301 in FIG. 3A.

FIG. 6B shows a layered device having a Kittel-type antipolar antiferroelectric (KAFE) material layer 602 placed between a second electrode 102 and a first electrode 103. The diagram illustrates an antipolar phase or domain arrangement that behaves linearly in the presence of an electric field pointing towards the first electrode that has a magnitude smaller than the forward transition field strength. The electric dipole moment is induced by the product of the antipolar phase permittivity and the applied electric field, subsequently vanishing if the electric field is removed. The depiction corresponds to DHL state ii in the positive voltage hysteresis branch 301 in FIG. 3A.

FIG. 6C shows a layered device having a Kittel-type antipolar antiferroelectric (KAFE) material layer 603 placed between a second electrode 102 and a first electrode 103. The diagram illustrates a ferroelectric material layer 603 that underwent an electric-field driven phase transition from an antipolar phase or antipolar domain configuration. The ferroelectric phase is formed with its dipoles oriented with the electric field direction, pointing towards the first electrode. The electric field required to induce the ferroelectric phase from the antipolar phase is called the forward transition field. The depiction corresponds to DHL state iii in the positive voltage hysteresis branch 301 in FIG. 3A.

FIG. 6D shows a layered device having a Kittel-type antipolar antiferroelectric (KAFE) material layer 604 placed between a second electrode 102 and a first electrode 103. The diagram illustrates a KAFE material layer 604 that underwent an electric-field driven phase transition from an antipolar phase. The electric field strength is smaller than the forward transition field but larger than the backward transition field, causing the ferroelectric phase to be retained with the polarization pointing toward the first electrode. The depiction corresponds to DHL state iv in the positive voltage hysteresis branch 301 in FIG. 3A. Upon removing the electric field, the material is in the antipolar phase in accordance with DHL state i in the positive voltage hysteresis branch 301 in FIG. 3A.

Figures 7A, 7B, 7C, 7D:
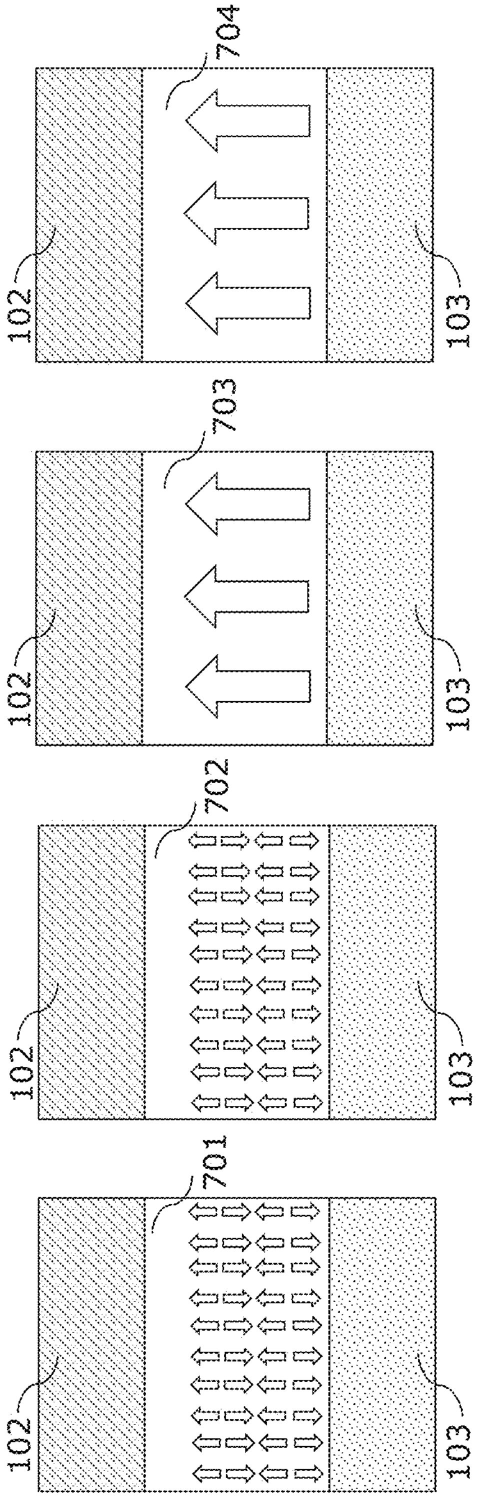
FIG. 7A illustrates the KAFE material in an antipolar phase or antipolar domain configuration without the presence of an electric field. The diagram corresponds to state i in the charge-voltage plot given in FIG. 3B.
FIG. 7B illustrates the KAFE material in an antipolar phase or antipolar domain configuration when the electric field strength is lower than the forward transition field. The diagram corresponds to state v in the charge-voltage plot given in FIG. 3B.
FIG. 7C illustrates the KAFE material in the ferroelectric phase with the polarization pointing towards the second electrode when the electric field strength is larger than the forward transition field. The diagram corresponds to state vi in the charge-voltage plot given in FIG. 3B.
FIG. 7D illustrates the KAFE material in the ferroelectric phase with the polarization pointing towards the second electrode when the electric field strength is smaller than the forward transition field and larger than the backward transition field. The diagram corresponds to state vii in the charge-voltage plot given in FIG. 3B.

FIG. 7A shows a layered device having a Kittel-type antipolar antiferroelectric (KAFE) material layer 701 placed between a second electrode 102 and a first electrode 103. The material has an antipolar phase or antipolar domain arrangement when there is no electric field. The antipolar phase has a negligible permanent dipole moment compared to the material's polar phase due to the antipolar arrangement of sub-lattices or antipolar coupling of domains. The depiction corresponds to DHL state i in the negative voltage hysteresis branch 302 in FIG. 3B.

FIG. 7B shows a layered device having a Kittel-type antipolar antiferroelectric (KAFE) material layer 702 placed between a second electrode 102 and a first electrode 103. The diagram illustrates an antipolar phase or domain arrangement that behaves linearly in the presence of an electric field pointing towards the second electrode that has a magnitude smaller than the forward transition field strength. The dipole moment is induced by the product of the antipolar phase permittivity and the applied electric field, subsequently vanishing if the electric field is removed. The depiction corresponds to DHL state v in the negative voltage hysteresis branch 302 in FIG. 3B.

FIG. 7C shows a layered device having a Kittel-type antipolar antiferroelectric (KAFE) material layer 703 placed between a second electrode 102 and a first electrode 103. The diagram illustrates a ferroelectric phase that underwent an electric-field driven phase transition from an antipolar phase or antipolar domain configuration. The ferroelectric phase is formed with its dipoles oriented with the electric field direction, pointing towards the second electrode. The electric field required to induce the ferroelectric phase from the antipolar phase is called the forward transition field. The depiction corresponds to DHL state vi in the negative voltage hysteresis branch 302 in FIG. 3B.

FIG. 7D shows a layered device having a Kittel-type antipolar antiferroelectric (KAFE) material layer 704 placed between a second electrode 102 and a first electrode 103. The diagram illustrates a ferroelectric phase that underwent an electric-field driven phase transition from an antipolar phase. The electric field strength is smaller than the forward transition field but larger than the backward transition field, causing the ferroelectric phase to be retained with the polarization pointing toward the second electrode. The depiction corresponds to DHL state vii in the negative voltage hysteresis branch 302 in FIG. 3B. Upon removing the electric field, the material is in the antipolar phase in accordance with state i in the negative voltage hysteresis branch 302 in FIG. 3B.

Figures 8A, 8B, 8C, 8D:
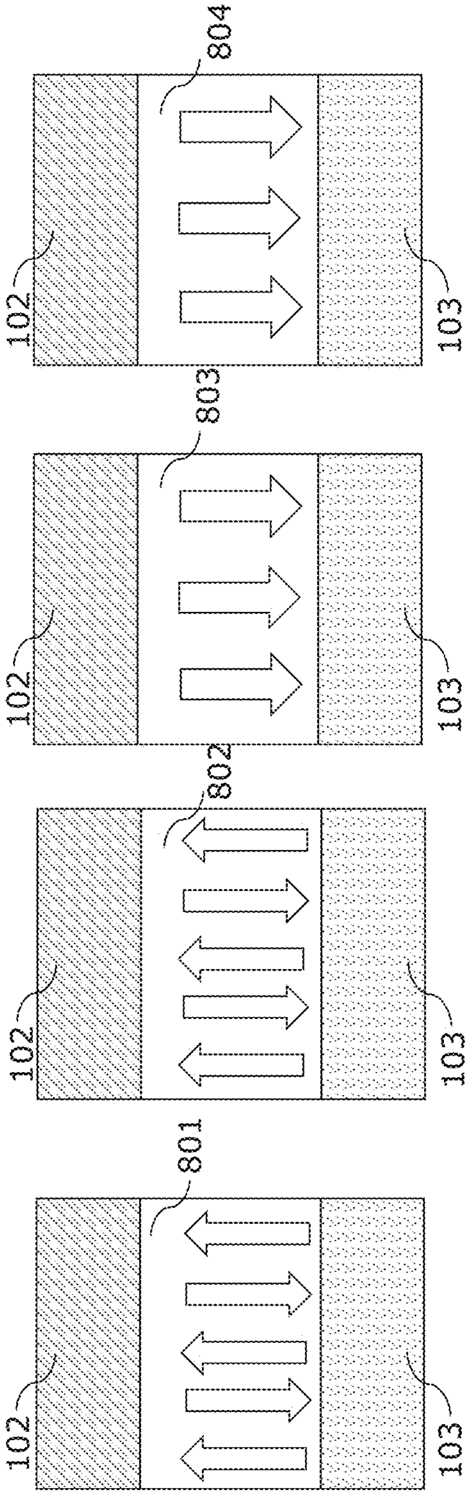
FIG. 8A illustrates a defect-biased ferroelectric (DBFE) material where ferroelectric domains point in antiparallel directions toward the first and second electrodes without the presence of an electric field. The diagram corresponds to state i in the charge-voltage plot given in FIG. 3A.
FIG. 8B illustrates the DBFE material where ferroelectric domains point in antiparallel directions toward the first and second electrodes when the electric field strength is lower than the forward coercive field. The diagram corresponds to state ii in the charge-voltage plot given in FIG. 3A.
FIG. 8C illustrates the DBFE material where the switchable ferroelectric domains yield a net polarization pointing towards the first electrode when the electric field strength is larger than the forward coercive field. The diagram corresponds to state iii in the charge-voltage plot given in FIG. 3A.
FIG. 8D illustrates the DBFE material where the switchable ferroelectric domains yield a net polarization pointing towards the first electrode when the electric field strength is smaller than the forward coercive field and larger than the backward coercive field. The diagram corresponds to state iv in the charge-voltage plot given in FIG. 3A.

FIG. 8A shows a layered device having a defect-biased ferroelectric (DBFE) material layer 801 placed between a second electrode 102 and a first electrode 103. The material has a ferroelectric phase where ferroelectric domains are imprinted in opposite directions in the absence of an electric field. Due to the antiparallel arrangement of the ferroelectric domains throughout the device area, a zero or negligible net polarization exists. The depiction corresponds to DHL state i in the positive voltage hysteresis branch 301 in FIG. 3A.

FIG. 8B shows a layered device having a defect-biased ferroelectric (DBFE) material layer 802 placed between a second electrode 102 and a first electrode 103. The diagram illustrates the antiparallel arrangement of ferroelectric domains of DBFE material layer 802 that lead to a linear band-gap material response in the presence of an electric field pointing towards the first electrode that has a magnitude smaller than the coercive field for domains pinned pointing in the direction of the second electrode. The dipole moment is induced by the product of the non-switching ferroelectric phase permittivity and the applied electric field, subsequently vanishing if the electric field is removed. The depiction corresponds to DHL state ii in the positive voltage hysteresis branch 301 in FIG. 3A.

FIG. 8C shows a layered device having a defect-biased ferroelectric (DBFE) material layer 803 placed between a second electrode 102 and a first electrode 103. The diagram illustrates a DBFE material layer 803 that underwent ferroelectric switching from an antiparallel domain arrangement to an oriented domain arrangement with a net polarization. The polarization is formed with dipoles oriented with the electric field direction, pointing towards the first electrode. The electric field required to induce ferroelectric switching corresponds to a group of ferroelectric domains that are defect-biased with a defect internal field pointing toward the second electrode and a coercive field that is the summed with the internal defect bias field. The depiction corresponds to DHL state iii in the positive voltage hysteresis branch 301 in FIG. 3A.

FIG. 8D shows a layered device having a defect-biased ferroelectric (DBFE) material layer 804 placed between a second electrode 102 and a first electrode 103. The diagram illustrates a DBFE material layer 804 that underwent ferroelectric switching from an antiparallel domain arrangement to an oriented domain arrangement with a net polarization. The electric field strength is smaller than the forward transition field but larger than the backward transition field, causing the ferroelectric phase to be retained with the polarization pointing toward the first electrode. Upon lowering the electric field strength below the backward transition field, a group of ferroelectric domains switches such that the polarization of these domains points to the second electrode, in alignment with the defect bias field, whereas another group of domains stays pointing toward the first electrode, in alignment with the respective defect electric field. The depiction corresponds to DHL state iv in the positive voltage hysteresis branch 301 in FIG. 3A. Upon removing the electric field, the material is in an antiparallel ferroelectric domain arrangement in accordance with DHL state i in the positive voltage hysteresis branch 301 in FIG. 3A.

Figure 9D:
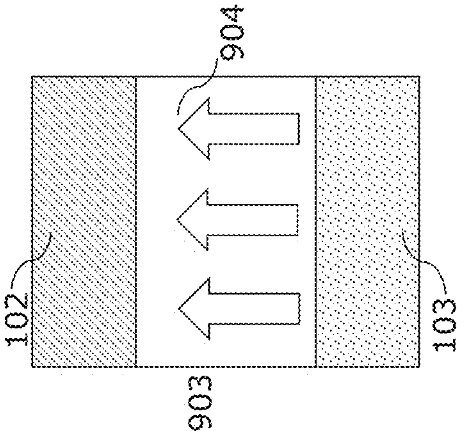
FIG. 9D illustrates the DBFE material where the switchable ferroelectric domains yield a net polarization pointing towards the second electrode when the electric field strength is smaller than the forward coercive field and larger than the backward coercive field. The diagram corresponds to state vii in the charge-voltage plot given in FIG. 3B.
Figure 9C:
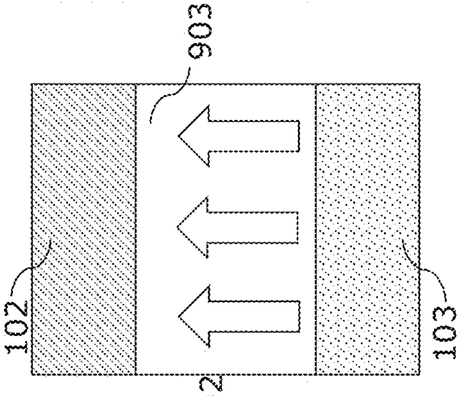
FIG. 9C illustrates the DBFE material where the switchable ferroelectric domains yield a net polarization pointing towards the second electrode when the electric field strength is larger than the forward coercive field. The diagram corresponds to state vi in the charge-voltage plot given in FIG. 3B.
Figure 9B:
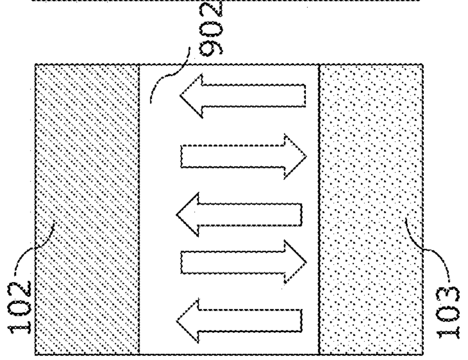
FIG. 9B illustrates the DBFE material where ferroelectric domains point in antiparallel directions toward the first and second electrodes when the electric field strength is lower than the forward coercive field. The diagram corresponds to state v in the charge-voltage plot given in FIG. 3B.
Figure 9A:
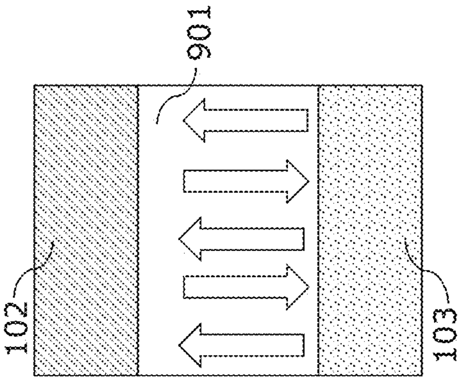
FIG. 9A illustrates the DBFE material where ferroelectric domains point in antiparallel directions toward the first and second electrodes without the presence of an electric field. The diagram corresponds to state i in the charge-voltage plot given in FIG. 3B.

FIG. 9A shows a layered device having a defect-biased ferroelectric (DBFE) material layer 901 placed between a second electrode 102 and a first electrode 103. The material has a ferroelectric phase where ferroelectric domains are imprinted in opposite directions in the absence of an electric field in the DBFE material layer 901. Due to the antiparallel arrangement of the ferroelectric domains throughout the device area, a zero or negligible net polarization exists. The depiction corresponds to DHL state i in the negative voltage hysteresis branch 302 in FIG. 3B.

FIG. 9B shows a layered device having a defect-biased ferroelectric (DBFE) material layer 902 placed between a second electrode 102 and a first electrode 103. The diagram illustrates the antiparallel arrangement of ferroelectric domains in DBFE material layer 902 that lead to a linear band-gap material response in the presence of an electric field pointing towards the second electrode that has a magnitude smaller than the coercive field for domains pinned pointing in the direction of the first electrode. The dipole moment is induced by the product of the non-switching ferroelectric phase permittivity and the applied electric field, subsequently vanishing if the electric field is removed. The depiction corresponds to DHL state v in the negative voltage hysteresis branch 302 in FIG. 3B.

FIG. 9C shows a layered device having a defect-biased ferroelectric (DBFE) material layer 903 placed between a second electrode 102 and a first electrode 103. The diagram illustrates a DBFE material layer 903 that underwent ferroelectric switching from an antiparallel domain arrangement to an oriented domain arrangement with a net polarization. The polarization is formed with dipoles oriented with the electric field direction, pointing towards the second electrode. The electric field required to induce ferroelectric switching corresponds to a group of ferroelectric domains that are defect-biased with a defect internal field pointing to the first electrode and a coercive field that is the summed with the internal defect bias field. The depiction corresponds to DHL state vi in negative voltage hysteresis branch 302 in FIG. 3B.

FIG. 9D shows a layered device having a defect-biased ferroelectric (DBFE) material layer 904 placed between a second electrode 102 and a first electrode 103. The diagram illustrates a DBFE material layer 904 that underwent ferroelectric switching from an antiparallel domain arrangement to an oriented domain arrangement with a net polarization. The electric field strength is smaller than the forward transition field but larger than the backward transition field, causing the ferroelectric phase to be retained with the polarization pointing toward the second electrode. Upon lowering the electric field strength below the backward transition field, a group of ferroelectric domains switches such that the polarization of these domains points to the first electrode, in alignment with the defect bias field, whereas another group of domains stays pointing toward the second electrode, in alignment with the respective defect electric field. The depiction corresponds to DHL state vii in the negative voltage hysteresis branch 302 in FIG. 3B. Upon removing the electric field, the material is in an antiparallel ferroelectric domain arrangement in accordance with DHL state i in the negative voltage hysteresis branch 302 in FIG. 3B.

Figure 10D:
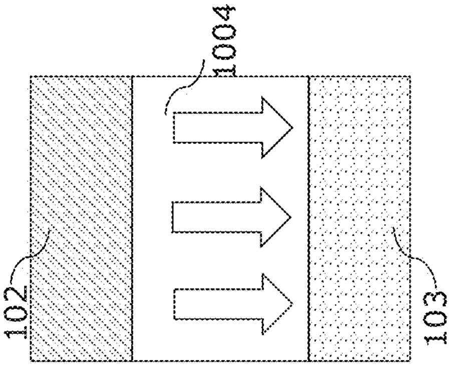
FIG. 10D illustrates the FES material where the ferroelectric domains remain with a net polarization pointing towards the first electrode when the electric field strength is smaller than the forward coercive field and larger than the backward coercive field. The diagram corresponds to state iv in the charge-voltage plot given in FIG. 3A.
Figure 10C:
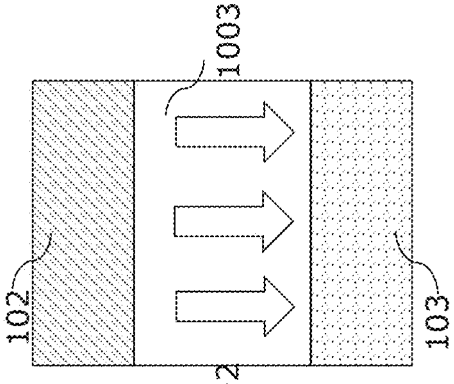
FIG. 10C illustrates the FES material where in-plane ferroelectric domains have reoriented yielding a net polarization pointing towards the first electrode when the electric field strength is larger than the forward switching field. The diagram corresponds to state iii in the charge-voltage plot given in FIG. 3A.
Figure 10B:
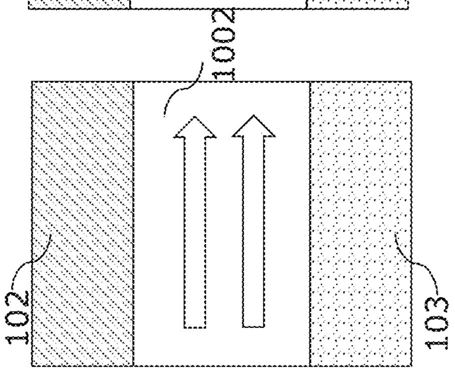
FIG. 10B illustrates the FES material where ferroelectric domains point in the plane of the film when the electric field strength is lower than the forward switching field. The diagram corresponds to state ii in the charge-voltage plot given in FIG. 3A.
Figure 10A:
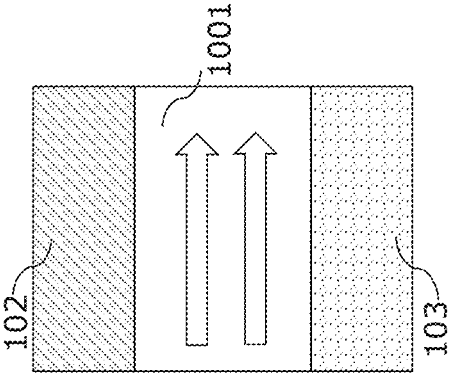
FIG. 10A illustrates a ferroelastic switching (FES) material where ferroelectric domains point in the plane of the film without the presence of an electric field. The diagram corresponds to state i in the charge-voltage plot given in FIG. 3A.

FIG. 10A shows a layered device having a ferroelastic switching (FES) material layer 1001 placed between a second electrode 102 and a first electrode 103. The material has a ferroelectric phase where ferroelectric domains point along the in-plane directions of the film in the absence of an electric field. Due to the ferroelectric domains pointing within the plane of the film, a zero or negligible net polarization exists in the out-of-plane direction. The depiction corresponds to DHL state i in the positive voltage hysteresis branch 301 in FIG. 3A.

FIG. 10B shows a layered device having a ferroelastic switching (FES) material layer 1002 placed between a second electrode 102 and a first electrode 103. The diagram illustrates the in-plane alignment of ferroelectric domains of the FES material layer 1002 that lead to a linear band-gap material response in the presence of an electric field pointing towards the first electrode that has a magnitude smaller than the forward ferroelastic switching field. The dipole moment is induced by the product of the non-switching ferroelectric phase permittivity and the applied electric field, subsequently vanishing if the electric field is removed. The depiction corresponds to DHL state ii in the positive voltage hysteresis branch 301 in FIG. 3A.

FIG. 10C shows a layered device having a ferroelastic switching (FES) material layer 1003 placed between a second electrode 102 and a first electrode 103. The diagram illustrates an FES material layer 1003 that underwent ferroelastic switching from an in-plane domain arrangement to an out-of-plane oriented domain arrangement with a net out-of-plane polarization. The polarization is formed with dipoles oriented with the electric field direction, pointing towards the first electrode. Ferroelastic switching corresponds to a mechanical strain change in the film, resulting in a significant inverse piezoelectric effect. The depiction corresponds to DHL state iii in the positive voltage hysteresis branch 301 in FIG. 3A.

FIG. 10D shows a layered device having a ferroelastic switching (FES) material layer 1004 placed between a second electrode 102 and a first electrode 103. The diagram illustrates an FES material layer 1004 that underwent ferroelastic switching from an in-plane domain arrangement to an out-of-plane oriented domain arrangement with a net out-of-plane polarization. The electric field strength is smaller than the forward switching field but larger than the backward switching field, causing the ferroelectric domains to be retained with the polarization pointing toward the first electrode. Upon lowering the electric field strength below the backward switching field, ferroelastic switching occurs where the domains are realigned pointing in-plane and resulting in a zero or insignificant out-of-plane net polarization. The depiction corresponds to DHL state iv in the positive voltage hysteresis branch 301 in FIG. 3A. Upon removing the electric field, the material is in an in-plane ferroelectric domain arrangement in accordance with DHL state i in the positive voltage hysteresis branch 301 in FIG. 3A.

Figure 11D:
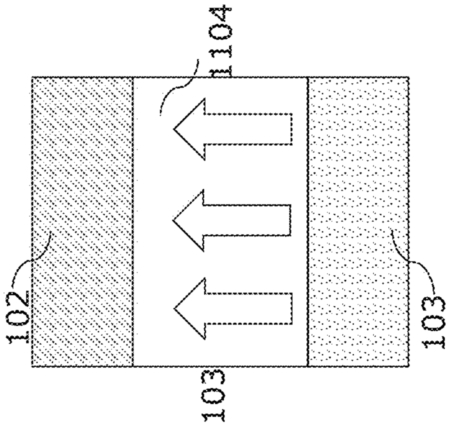
FIG. 11D illustrates the FES material where the switchable ferroelectric domains yield a net polarization pointing towards the second electrode when the electric field strength is smaller than the forward switching field and larger than the backward switching field. The diagram corresponds to state vii in the charge-voltage plot given in FIG. 3B.
Figure 11C:
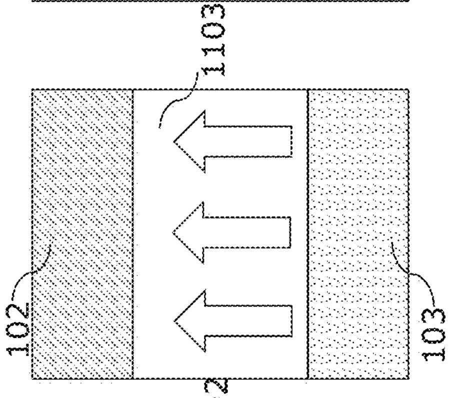
FIG. 11C illustrates the FES material where in-plane ferroelectric domains have reoriented yielding a net polarization pointing towards the second electrode when the electric field strength is larger than the forward switching field. The diagram corresponds to state vi in the charge-voltage plot given in FIG. 3B.
Figure 11B:
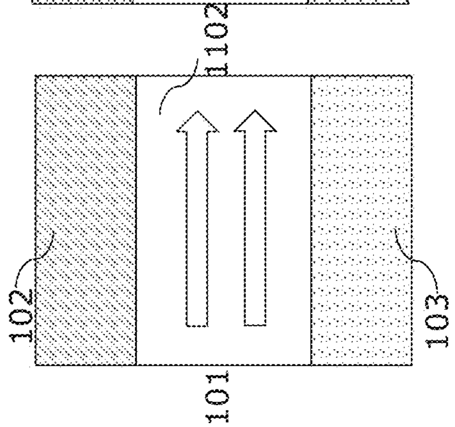
FIG. 11B illustrates the FES material where ferroelectric domains point in the plane of the film when the electric field strength is lower than the forward switching field. The diagram corresponds to state v in the charge-voltage plot given in FIG. 3B.
Figure 11A:
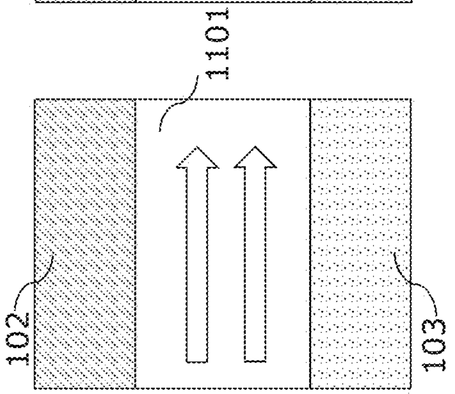
FIG. 11A illustrates the FES material where ferroelectric domains point in the plane of the film without the presence of an electric field. The diagram corresponds to state i in the charge-voltage plot given in FIG. 3B.

FIG. 11A shows a layered device having a ferroelastic switching (FES) material layer 1101 placed between a second electrode 102 and a first electrode 103. The material has a ferroelectric phase where ferroelectric domains point along the in-plane directions of the film in the absence of an electric field. Due to the ferroelectric domains pointing within the plane of the film, a zero or negligible net polarization exists in the out-of-plane direction. The depiction corresponds to DHL state v in the negative voltage hysteresis branch 302 in FIG. 3B.

FIG. 11B shows a layered device having a ferroelastic switching (FES) material layer 1102 placed between a second electrode 102 and a first electrode 103. The diagram illustrates the in-plane alignment of ferroelectric domains of the FES material layer 1102 that lead to a linear band-gap material response in the presence of an electric field pointing towards the second electrode that has a magnitude smaller than the forward ferroelastic switching field. The dipole moment is induced by the product of the non-switching ferroelectric phase permittivity and the applied electric field, subsequently vanishing if the electric field is removed. The depiction corresponds to DHL state vi in the negative voltage hysteresis branch 302 in FIG. 3B.

FIG. 11C shows a layered device having a ferroelastic switching (FES) material layer 1103 placed between a second electrode 102 and a first electrode 103. The diagram illustrates an FES material layer 1103 that underwent ferroelastic switching from an in-plane domain arrangement to an out-of-plane oriented domain arrangement with a net out-of-plane polarization. The polarization is formed with dipoles oriented with the electric field direction, pointing towards the second electrode. Ferroelastic switching corresponds to a mechanical strain change in the film, resulting in a significant inverse piezoelectric effect. The depiction corresponds to DHL state vi in the negative voltage hysteresis branch 302 in FIG. 3B.

FIG. 11D shows a layered device having a ferroelastic switching (FES) material layer 1104 placed between a second electrode 102 and a first electrode 103. The diagram illustrates a an FES material layer 1104 that underwent ferroelastic switching from an in-plane domain arrangement to an out-of-plane oriented domain arrangement with a net out-of-plane polarization. The electric field strength is smaller than the forward switching field but larger than the backward switching field, causing the ferroelectric domains to be retained with the polarization pointing toward the second electrode. Upon lowering the electric field strength below the backward switching field, ferroelastic switching occurs where the domains are realigned pointing in-plane and resulting in a zero or insignificant out-of-plane net polarization. The depiction corresponds to DHL state vii in the negative voltage hysteresis branch 302 in FIG. 3B. Upon removing the electric field, the material is in an in-plane ferroelectric domain arrangement in accordance with DHL state i in the negative voltage hysteresis branch 302 in FIG. 3B.

Figure 12B:
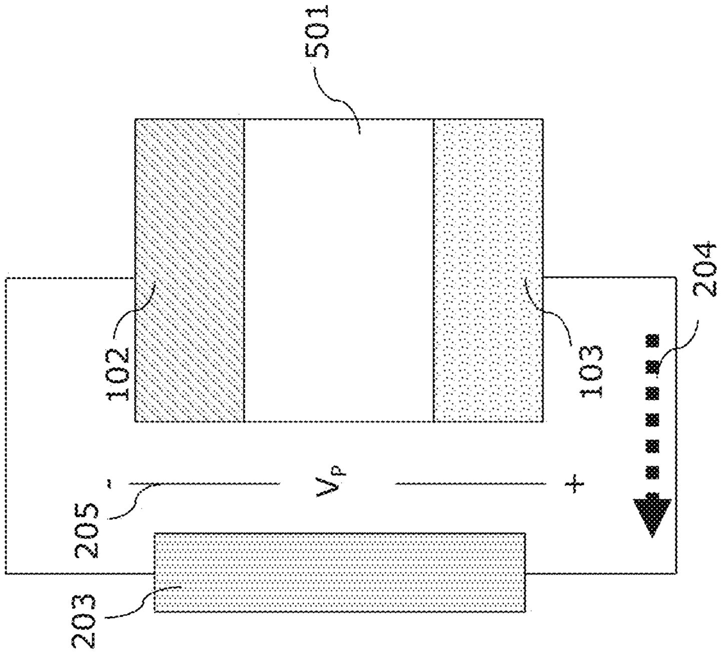
FIG. 12B illustrates a field-induced ferroelectric capacitor in the paraelectric phase. The FFE capacitor is incorporated into a circuit as a pyroelectric element, although the pyroelectric current is suppressed due to the zero-field paraelectric state.
Figure 12A:
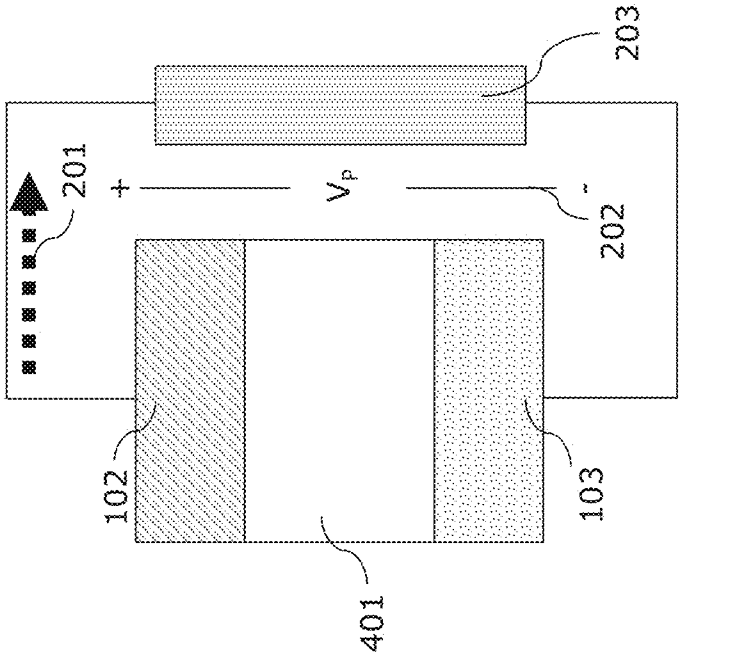
FIG. 12A illustrates a field-induced ferroelectric capacitor in the paraelectric phase. The FFE capacitor is incorporated into a circuit as a pyroelectric element, although the pyroelectric current is suppressed due to the zero-field paraelectric state.

FIG. 12A depicts a layered device comprising an FFE material layer 401 sandwiched between a second electrode 102 and a first electrode 103. The layered device is incorporated into a circuit where the second electrode 102 and first electrode 103 are connected to two different terminals of a load 203. Due to the paraelectric phase of the zero-field FFE material layer 401, a temperature change does not produce an electric current $I_p$ 201 ($I_p \approx 0$) nor a voltage $V_p$ 202 ($V_p \approx 0$).

FIG. 12B depicts a layered device comprising an FFE material layer 501 sandwiched between a second electrode 102 and a first electrode 103. The layered device is incorporated into a circuit where the second electrode 102 and first electrode 103 are connected to two different terminals of a load 203. Due to the paraelectric phase of the zero-field FFE material layer 501, a temperature change does not produce an electric current $I_p$ 204 ($I_p \approx 0$) nor a voltage $V_p$ 205 ($V_p \approx 0$).

Figure 13B:
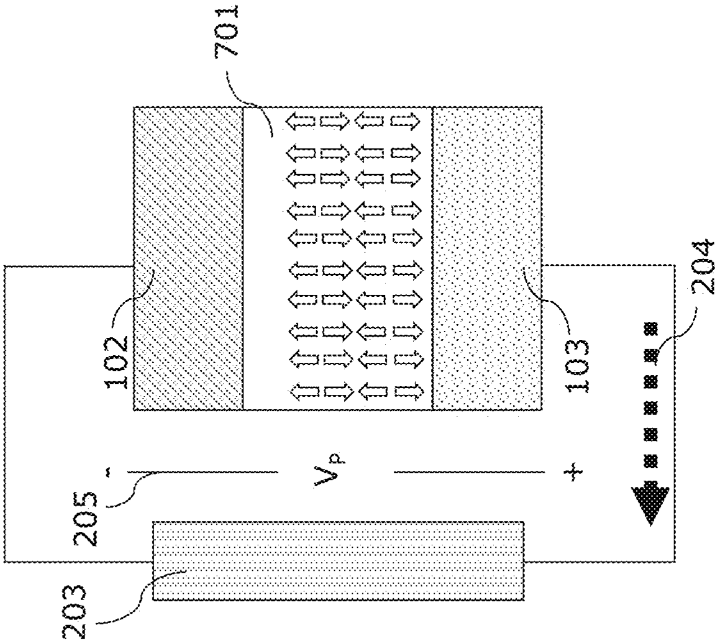
FIG. 13B illustrates a Kittel-type antiferroelectric capacitor in the antipolar phase. The KAFE capacitor is incorporated into a circuit as a pyroelectric element, although the pyroelectric current is suppressed due to the zero-field antipolar state.
Figure 13A:
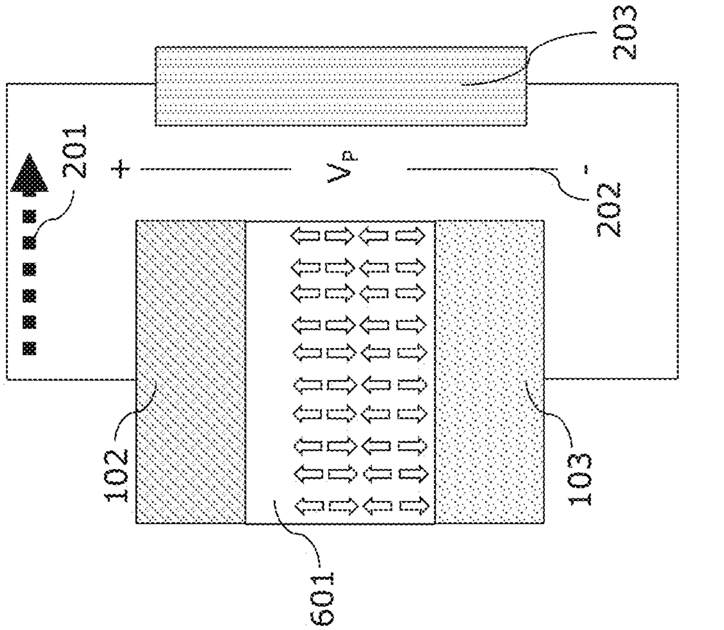
FIG. 13A illustrates a Kittel-type antiferroelectric capacitor in the antipolar phase. The KAFE capacitor is incorporated into a circuit as a pyroelectric element, although the pyroelectric current is suppressed due to the zero-field antipolar state.

FIG. 13A depicts a layered device comprising a KAFE material layer 601 sandwiched between a second electrode 102 and a first electrode 103. The layered device is incorporated into a circuit where the second electrode 102 and first electrode 103 are connected to two different terminals of a load 203. Due to the antipolar phase or antipolar domain configuration of the zero-field KAFE material layer 601, a temperature change does not produce an electric current $I_p$ 201 ($I_p \approx 0$) nor a voltage $V_p$ 202 ($V_p \approx 0$).

FIG. 13B depicts a layered device comprising a KAFE material layer 701 sandwiched between a second electrode 102 and a first electrode 103. The layered device is incorporated into a circuit where the second electrode 102 and first electrode 103 are connected to two different terminals of a load 203. Due to the antipolar phase or antipolar domain configuration of the zero-field FFE material layer 701, a temperature change does not produce an electric current $I_p$ 204 ($I_p \approx 0$) nor a voltage $V_p$ 205 ($V_p \approx 0$).

Figure 14B:
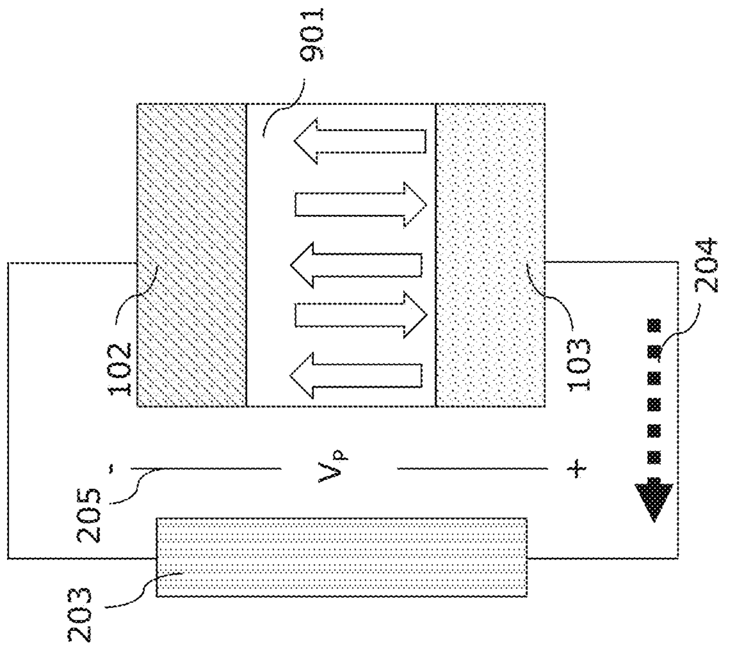
FIG. 14B illustrates a defect-biased ferroelectric capacitor in a mixed domain state with an approximately net zero polarization. The DBFE capacitor is incorporated into a circuit as a pyroelectric element, although the pyroelectric current is suppressed due to the small zero-field net polarization state.
Figure 14A:
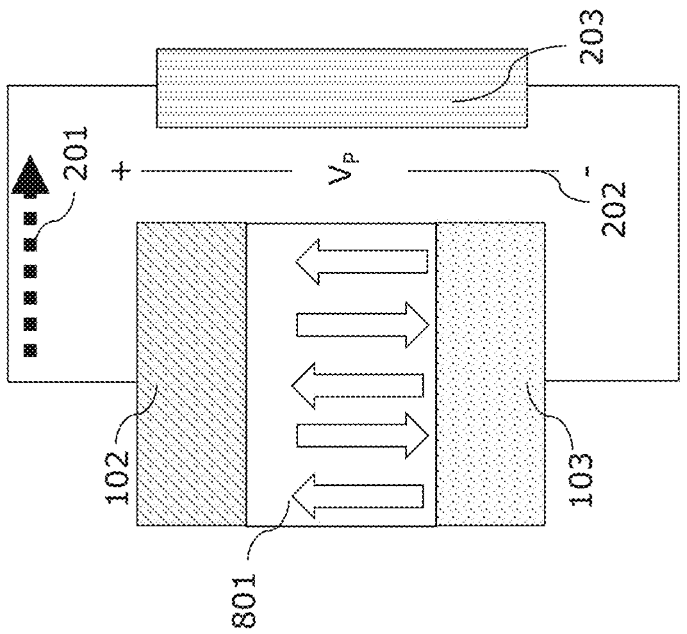
FIG. 14A illustrates a defect-biased ferroelectric capacitor in a mixed domain state with an approximately net zero polarization. The DBFE capacitor is incorporated into a circuit as a pyroelectric element, although the pyroelectric current is suppressed due to the small zero-field net polarization state.

FIG. 14A depicts a layered device comprising a DBFE material layer 801 sandwiched between a second electrode 102 and a first electrode 103. The layered device is incorporated into a circuit where the second electrode 102 and first electrode 103 are connected to two different terminals of a load 203. Due to the antiparallel domain configuration of the zero-field DBFE material layer 801, a temperature change does not produce an electric current $I_p$ 201 ($I_p \approx 0$) nor a voltage $V_p$ 202 ($V_p \approx 0$).

FIG. 14B depicts a layered device comprising a DBFE material layer 901 sandwiched between a second electrode 102 and a first electrode 103. The layered device is incorporated into a circuit where the second electrode 102 and first electrode 103 are connected to two different terminals of a load 203. Due to the antiparallel domain configuration of the zero-field DBFE material layer 901, a temperature change does not produce an electric current $I_p$ 204 ($I_p \approx 0$) nor a voltage $V_p$ 205 ($V_p \approx 0$).

Figure 15B:
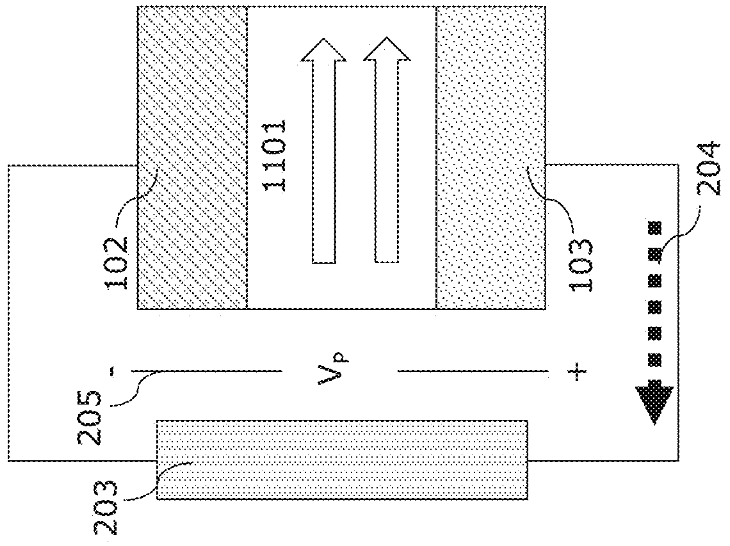
FIG. 15B illustrates a ferroelastic-switching (FES) capacitor with the ferroelectric domains aligned in the plane of the film and negligible net polarization in the out-of-plane direction. The FES capacitor is incorporated into a circuit as a pyroelectric element, although the pyroelectric current is suppressed due to the small zero-field net polarization state.
Figure 15A:
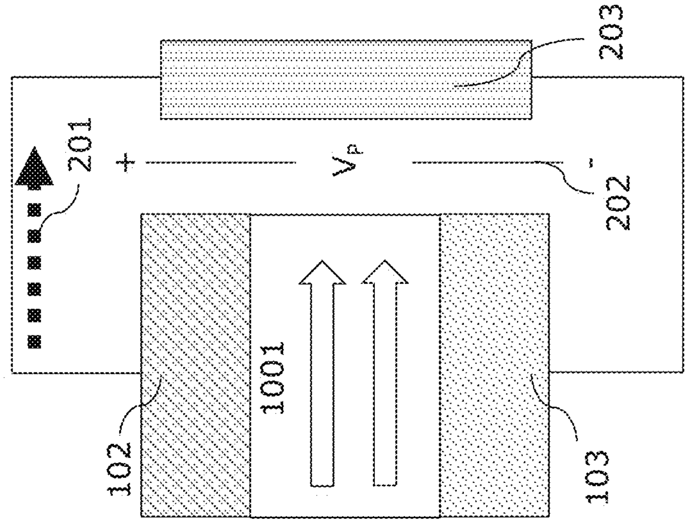
FIG. 15A illustrates a ferroelastic-switching (FES) capacitor with the ferroelectric domains aligned in the plane of the film and negligible net polarization in the out-of-plane direction. The FES capacitor is incorporated into a circuit as a pyroelectric element, although the pyroelectric current is suppressed due to the small zero-field net polarization state.

FIG. 15A depicts a layered device comprising an FES material layer 1001 sandwiched between a second electrode 102 and a first electrode 103. The layered device is incorporated into a circuit where the second electrode 102 and first electrode 103 are connected to two different terminals of a load 203. Due to the in-plane domain configuration of the zero-field FES material layer 1001, a temperature change does not produce an electric current $I_p$ 201 ($I_p \approx 0$) nor a voltage $V_p$ 202 ($V_p \approx 0$).

FIG. 15B depicts a layered device comprising an FES material layer 1101 sandwiched between a second electrode 102 and a first electrode 103. The layered device is incorporated into a circuit where the second electrode 102 and first electrode 103 are connected to two different terminals of a load 203. Due to the antiparallel domain configuration of the zero-field FES material layer 1101, a temperature change does not produce an electric current $I_p$ 204 ($I_p \approx 0$) nor a voltage $V_p$ 205 ($V_p \approx 0$).

The DHL material can be of a field-induced ferroelectric type of layer comprising $Zr_aX_bO_2$, with X being an element of the periodic table with a smaller ionic radius than Zr and a>0, b>0. Suitable X elements can be one or more of Hf, Si, Al, Ge, elements of the second group of the periodic table and a>0, b>0. In addition to this combination, the DHL material layer may comprise $Hf_aX_bO_2$, with X being an element of the periodic table with a smaller ionic radius than Hf and a>0, b>0. Suitable elements for this combination can be one of the elements within the second group of periodic table (Zr, Si, Al, Ge) where the a>0, b<0 as before. The DHL material layer can be in the thickness range between 0.5 nm and 50 mm.

Another possibility for the DHL material can be of a field-induced ferroelectric type comprising a pure $ZrO_2$ layer or comprising a $ZrO_2$ or $HfO_2$ based dielectric material.

The DHL material is formed on a conductive layer (first electrode 103). The DHL material layer (401, 501, 601, 701, 801, 901, 1001, 1101) and the interfacial layer, if available, and the conductive layer (first electrode 103) and another conductive layer (second electrode 102), if available, form the layer stack. In each case, the DHL material layer (401, 501, 601, 701, 801, 901, 1001, 1101) can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer including the ferroelectric material as described herein (i.e., oxygen and at least one of Hf and Zr), where growth of the layer can be poly-crystalline. Any suitable number and types of precursors may be utilized to introduce elements such as Hf and Zr into the layer 401, 501, 601, 701, 801, 901, 1001, 1101 utilizing any of the deposition techniques as described herein. The layer 401, 501, 601, 701, 801, 901, 1001, 1101 is formed to have a suitable thickness, e.g., in the range from about 1 nm to 500 nm. In one example, the thickness range of layer 401, 501, 601, 701, 801, 901, 1001, 1101 can be within the range from about 1 nm to about 15 nm.

In addition, the material of the DHL material layer 401, 501, 601, 701, 801, 901, 1001, 1101 can be formed to include, in addition to the antiferroelectric or ferroelectric material, dopants or further additives that may support the crystallization of the layer 401, 501, 601, 701, 801, 901, 1001, 1101 into a state having DHL properties. The additives can be included with the precursor materials, e.g., so as to be included during formation of the layer.

Alternatively, the additives can be introduced into the formed layer 401, 501, 601, 701, 801, 901, 1001, 1101 by ion implantation or any other suitable process. A concentration of the further additives within the layer may be set within a range from about 0.05 at. % (atomic percent, as measured by ratio of additive atoms to ferroelectric material atoms) to about 30 at. %, within a range from about 0.05 at. % to about 10 at. %, within a range from about 0.05 at % to about 5 at %, within a range from about 0.5 at % to about 3.5 at %, or a range from about 1 at % to about 3.5 at %. In general, the amount of the further additives may depend on the thickness of the layer 401, 501, 601, 701, 801, 901, 1001, 1101. When increasing the thickness of the layer 401, 501, 601, 701, 801, 901, 1001, 1101, the concentration of the further additives may also have to be increased to achieve a desired crystallization having DHL properties.

Any suitable additives may be provided within the ferroelectric material of layer 401, 501, 601, 701, 801, 901, 1001, 1101 including, without limitation, any one or more of N, C, Si, Al, Ge, Sn, Sr, Mg, Ca, Sr, Ba, Ti, Zr, Hf, Gd, Sc, La (e.g., providing Zr as an additive in a $HfO_2$ layer), Ti, and any one or more of the rare earth elements (e.g., Y, Gd, etc.). In particular, it has been determined that certain additives having an atomic radius that is about the same as or greater than Hf are particularly suitable as dopants for optimizing ferroelectric (FE) properties of the ferroelectric material of layer 401, 501, 601, 701, 801, 901, 1001, 1101 when utilizing Hf in the layer. In contrast, certain additives having an atomic radius smaller than Hf can cause DHL properties at phase boundaries between the monoclinic and tetragonal/cubic phases of $HfO_2$. It has further been determined that additives having an atomic radius about the same as or greater than Hf can be doped at larger ranges of concentrations within the ferroelectric material of layer 401, 501, 601, 701, 801, 901, 1001, 1101 in relation to other additives while still supporting FE properties of the ferroelectric material of layer 401, 501, 601, 701, 801, 901, 1001, 1101. Other additives having the same valence as Hf can also be beneficial as dopants to reduce charge trapping characteristics of the ferroelectric material of layer 401, 501, 601, 701, 801, 901, 1001, 1101 by reducing open bonds within the $HfO_2$ host lattice of the material.

After the layers have been formed, an anneal process is carried out at one or more suitable temperatures and for one or more suitable time periods to achieve a suitable amount of crystallization for the DHL material within the DHL material of layer 401, 501, 601, 701, 801, 901, 1001, 1101. In particular, the anneal process is carried out to heat the DHL material of layer 401, 501, 601, 701, 801, 901, 1001, 1101 to a temperature that is above the crystallization temperature of the DHL material so as to at least partially alter its crystal state from amorphous to crystalline, thus resulting in a crystallized oxide within the ferroelectric material of layer 401, 501, 601, 701, 801, 901, 1001, 1101. A crystallization temperature may be chosen in a range of, e.g., from about 300° C. to about 1,200° C. depending on the thermal budget of the used devices. A preferred crystallization temperature for the annealing process is at a temperature that is above the onset of crystallization for the ferroelectric material (when the DHL material is still amorphous, i.e., after the layer 401, 501, 601, 701, 801, 901, 1001, 1101 is deposited) and is further greater than about 350° C., or at a temperature that is above the onset of crystallization for the DHL material and is further greater than about 300° C. The time period for annealing can be from about 0.01 second to about 12 hours. These annealing temperature ranges induce partial or full crystallization of the ferroelectric material of layer 401, 501, 601, 701, 801, 901, 1001, 1101.

A third possibility for the DHL material can be of a Kittel-type material like $PbZrO_3$.

A fourth possibility are ferroelectric materials that have many defects that cause oppositely oriented pinned domains, defect-biased ferroelectrics.

A fifth possibility are double hysteresis loop materials in which ferroelastic switching is the cause of the DHL.

A sixth possibility for the DHL material can be of a relaxor type ferroelectric material (e.g., $BaTiO_3$ or $PbMg_{1/3}Nb_{2/3}O_3$).

Described herein is an inventive approach for integration of a DHL material as a pyroelectric transducer. Based on this approach, a pyroelectric device concept is disclosed. Each pyroelectric device comprises a DHL material sandwiched between parallel electrodes with different workfunctions. According to the inventive concepts described herein, a pyroelectric device that can be switched between pyroelectric ON and pyroelectric OFF states is enabled by the difference of the workfunction values between electrodes that induce a built-in electric field. In addition, a new stack comprising a interlayer material is described.

In the following, the basic principles of the DHL pyroelectric devices shown in FIGS. 16, 17A, and 17B will be elucidated.

Integration of a DHL material between two electrodes with different workfunctions induces a built-in electric field needed for centering, relative to 0 volts, the position of one of the two charge-voltage loops of the charge-voltage characteristic. This shifting enables the usage of the DHL material as a material for nonvolatile pyroelectric switches using of one of the two charge-voltage loops. Centering one of the two hysteresis loops around zero volts by internal electric field biasing with different workfunction materials enables the usage and integration of a DHL material in a two state, nonvolatile pyroelectric device, which preserves the active and inactive pyroelectric states even after the removal of an external electric field.

Figure 1B:
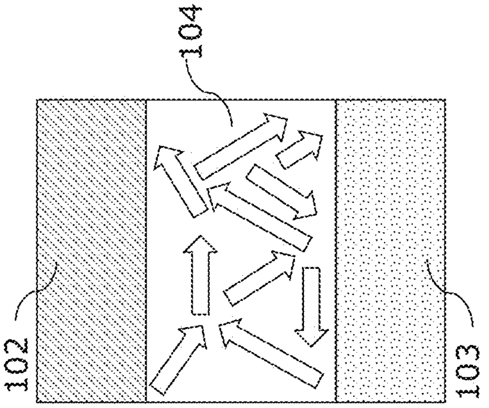
FIG. 1B illustrates a ferroelectric capacitor in a random domain state (i) before external electric fields have been applied.
Figure 1A:
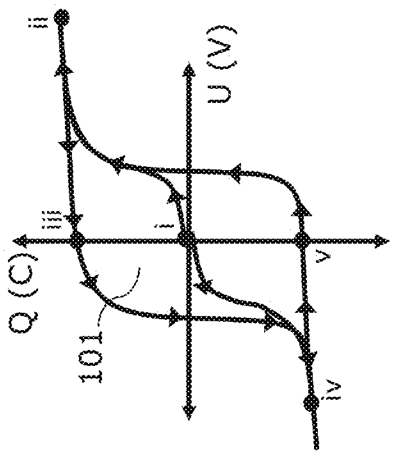
FIG. 1A illustrates a ferroelectric charge-voltage hysteresis loop showing the initial random domain state (i) before electric field exposure, the saturated ferroelectric states (ii, iv) with an electric field, and the remanent polarization states (iii, v) when the electric field is zero.
Figure 1D:
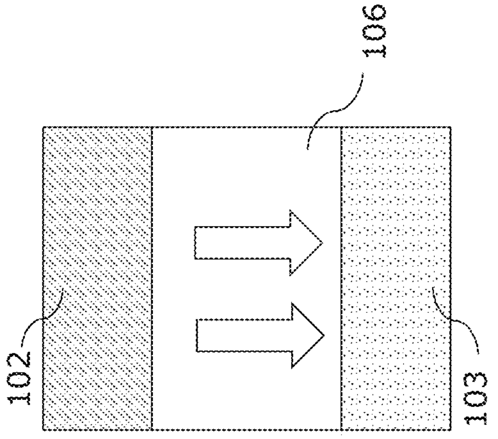
FIG. 1D illustrates a ferroelectric capacitor with remanent polarization (iii) where the ferroelectric dipoles point in the direction of the first electrode with no applied electric field.
Figure 1C:
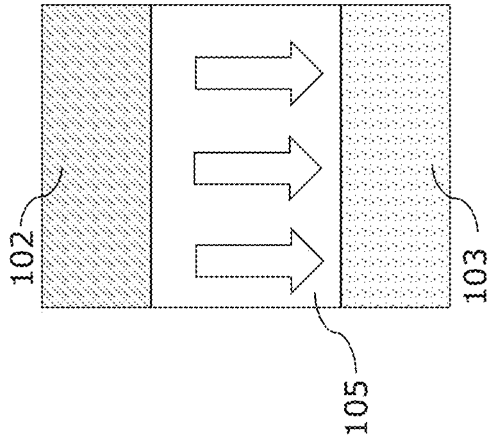
FIG. 1C illustrates a saturated ferroelectric capacitor during the application of an electric field (ii) where the ferroelectric dipoles point in the direction of the first electrode.
Figure 1F:
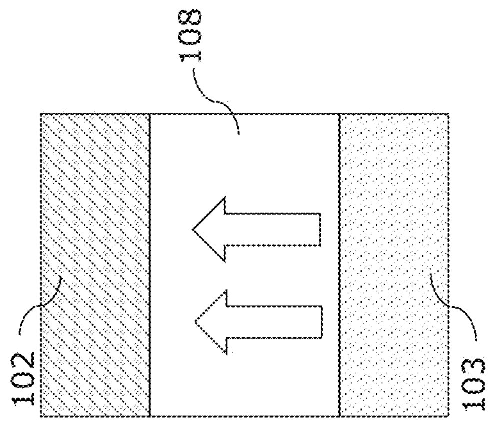
FIG. 1F illustrates a ferroelectric capacitor with remanent polarization (v) where the ferroelectric dipoles point in the direction of the second electrode with no applied electric field.
Figure 1E:
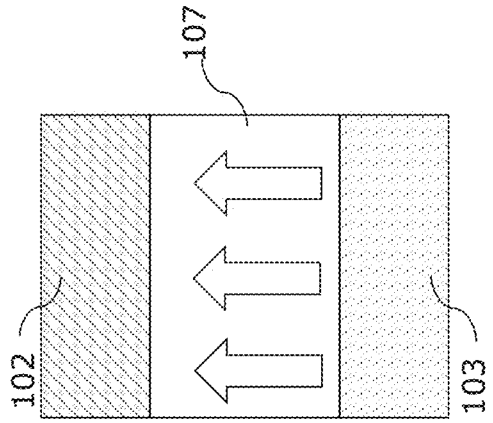
FIG. 1E illustrates a saturated ferroelectric capacitor during the application of an electric field (iv) where the ferroelectric dipoles point in the direction of the second electrode.
Figure 2A:
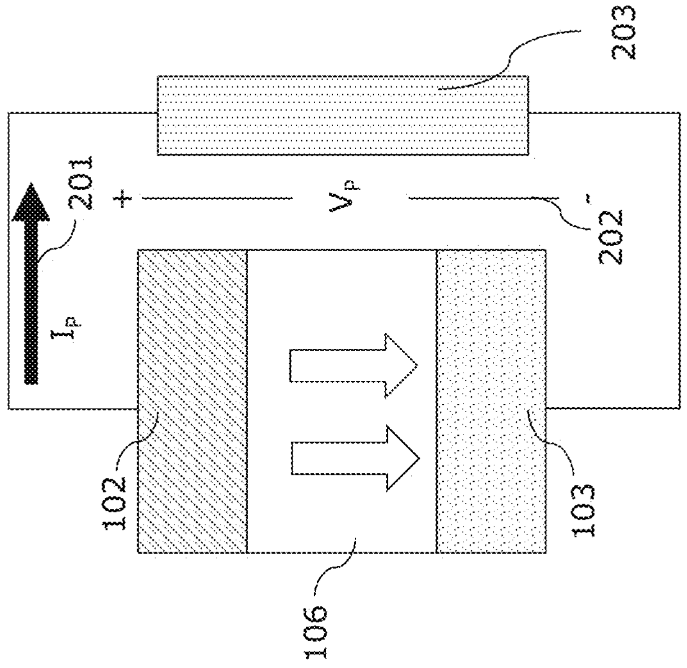
FIG. 2A illustrates a ferroelectric capacitor with a remanent polarization where the ferroelectric dipoles point toward the first electrode. The ferroelectric capacitor is incorporated into a circuit such that a temperature change of the ferroelectric capacitor produces a pyroelectric current.
Figure 2B:
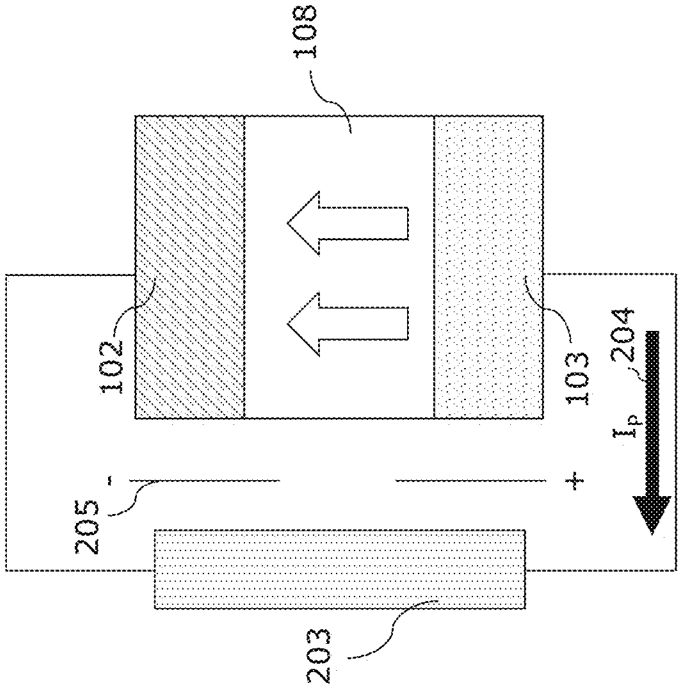
FIG. 2B illustrates a ferroelectric capacitor with a remanent polarization where the ferroelectric dipoles point toward the second electrode. The ferroelectric capacitor is incorporated into a circuit such that a temperature change of the ferroelectric capacitor produces a pyroelectric current.
Figure 16:
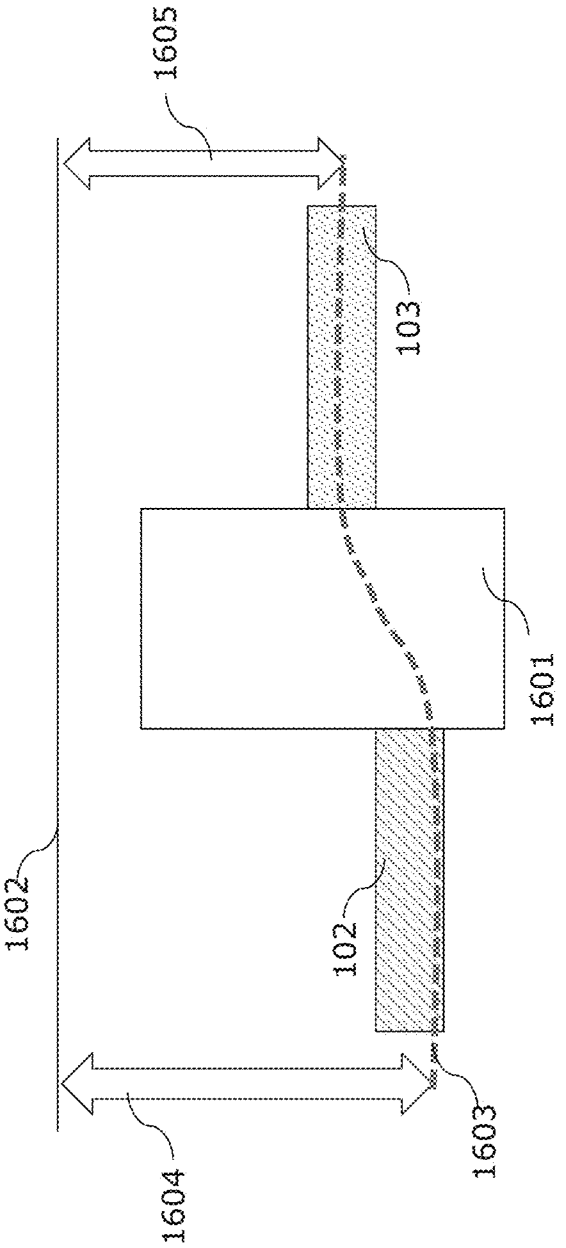
FIG. 16 illustrates the inventive concept whereby the band energy diagram shows a double hysteresis loop material with electrodes of two different workfunctions, thus enabling a nonvolatile pyroelectric device with ON and OFF states.

FIG. 16 illustrates an example of the energy band diagram for the implementation of the nonvolatile pyroelectric switch. With a ferroelectric material, the charge-voltage behavior 101 yields a pyroelectric response at zero volts resulting from the non-zero remanent polarization caused by the alignment of ferroelectric domains. Due to the irreversible changes that occur after poling the ferroelectric from a random domain state (polarization orientation 104 in FIG. 1B) to a polarized state (e.g., polarization state 106 in FIG. 1D), switching from active and inactive pyroelectric states is not achievable with simple bipolar voltage pulsing. In contrast, the double hysteresis loop charge-voltage characteristics, including a positive voltage hysteresis branch 301 and a negative voltage hysteresis branch 302, is characterized by a double hysteresis loop, and neither of the two hysteresis loops is centered around zero electric field. In order to induce the shift needed to center the charge-voltage relation of one of the two hysteresis loops to create a pyroelectric active and a pyroelectric inactive state, electrodes with different workfunctions are needed.

In the following, the inventive concept based on the different workfunction electrode materials is explained in connection with the energy diagram of FIG. 16 with reference to the example implementations shown in FIGS. 4A-15D. The workfunction represents the energy needed to be given to the charge carrier so that it can leave the closed material system. More specifically, the workfuntion represents the difference between an electrode's Fermi level 1603 and the vacuum 1602 level. The workfunction 1604 of the second electrode 102 is larger than the workfunction 1605 of the first electrode 103, as depicted in FIG. 16. The operating principle of the inventive concept is met by the difference of the first electrode workfunction 1605 and the second electrode workfunction 1604, which should not be equal. The workfunction difference can be in the range of 0.1 eV-3.5 eV and more particularly in the range of 0.3 eV-2 eV. FIG. 16 illustrates the energetic outcome of the integration of the different workfunction materials (second electrode 102 and first electrode 103) and the DHL layer 1601 exhibiting pinched hysteresis (comprising an FFE, KAFE, DBFE or FES layer, i.e., layers 401, 501, 601, 701, 801, 901, 1001, 1101) in accordance with the implementation of the inventive concept described herein. Therefore, the energetic value of the second electrode 102 has to be different from the energetic value of the first electrode 103. This energetic difference induces a built-in bias electric field that shifts the charge-voltage characteristics of the DHL layer 1601.

In this specific application the first electrode and the second electrode have a workfunction value difference of 0.4 to 1.5 eV and the first electrode and the second electrode comprise a material of or a combination of: Ti, TiN, TiSi, TiAlN, TaN, TaCN, TaSi, W, WSi, WN, Al, Ru, RuO, $RuO_2$, Re, Pt, Ir, IrO, $IrO_2$, $In_2O_3$, InSnO, SnO, ZnO, Ti, Ni, NiSi, Nb, NbN, Ga, GaN, Mo, MoO, C, Ge, Si, doped Si, SiC or GeSi, providing the 0.4 to 1.5 eV workfunction difference.

The conductive layers of second electrode 102 and first electrode 103 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer. The thickness of the conductive layers of second electrode 102 and first electrode 103 can be in the range of 1 nm to 10 nm or 1 nm to 300 nm.

It is to be understood that the layer stack comprising second electrode 102, DHL material layer 404, 504, 604, 704, 804, 904, 1004, 1104, and first electrode 103 can comprise a single layer of DHL material, or in another example can comprise a multitude of layers of DHL materials, or in another example can comprise additional conductive or isolating interfacial layers, separating the individual layers of DHL material.

Figure 17A:
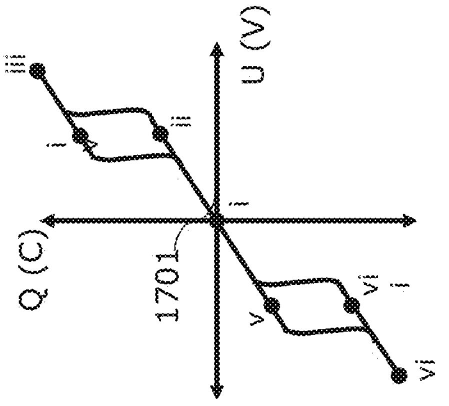
FIG. 17A illustrates the charge-voltage relationship of the double hysteresis loop of the DHL material without any internal electric field.
Figure 17B:
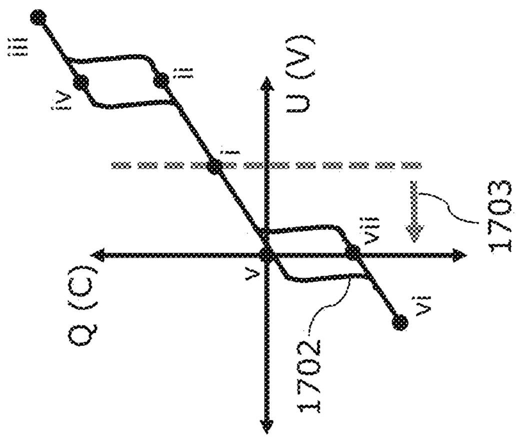
FIG. 17B illustrates the inventive concept where the charge-voltage relationship of the double hysteresis loop is modified with a DHL material with a negative internal electric field in which the negative hysteresis loop branch is centered at or close to 0V applied voltage.
Figure 17C:
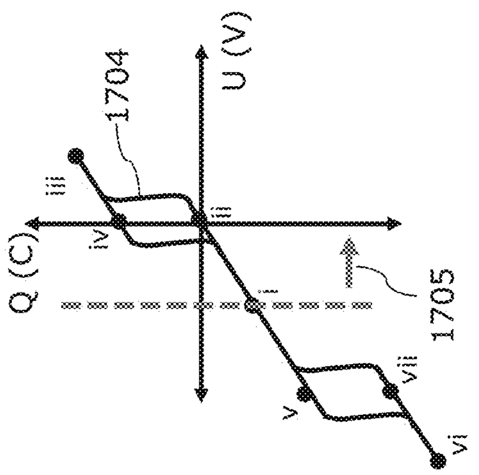
FIG. 17C illustrates the inventive concept where the charge-voltage relationship of the double hysteresis loop is modified with a DHL material with a positive internal electric field in which the positive hysteresis loop branch is centered at or close to 0V applied voltage.

FIG. 17A illustrates the influence of the usage of the electrodes with the same workfunction values on the DHL charge-voltage characteristic 1701, which is in correspondence with a pyroelectric device that cannot be used in the passive mode, that is, with zero external bias. The inventive concept illustrated in FIG. 17B employs a negative internal electric field 1703 to negatively bias the DHL charge-voltage characteristic 1701 and thereby centers the negative hysteresis branch 1702 of the DHL charge-voltage characteristic 1701 at the origin of the charge-voltage characteristic plot (0.0 V,C). As seen in FIG. 17B, the DHL charge-voltage characteristic 1701 is shifted by the negative internal electric field 1703 such that a point along the portion of the negative hysteresis branch 1702 corresponding to state v coincides with the zero applied voltage condition (no external electric field) at the origin of the charge-voltage characteristic plot. FIG. 17C depicts a positive internal electric field 1705 that positively biases the DHL charge-voltage characteristic 1701 and thereby centers the positive hysteresis branch 1704 of the DHL charge-voltage characteristic 1701 at the origin of the charge-voltage characteristic plot (0.0 V,C). As seen in FIG. 17C, the DHL charge-voltage characteristic 1701 is shifted by the positive internal electric field 1705 such that a point along the portion of the positive hysteresis branch 1704 corresponding to state ii coincides with the zero applied voltage condition (no external electric field) at the origin of the charge-voltage characteristic plot. The usage of electrodes with different workfunctions can induce an internal electric field that shifts the DHL charge-voltage characteristic 1701 to center either the negative hysteresis branch 1702 or positive hysteresis branch 1704. Therefore, integration of the different workfunction materials induces a built-in electric field which centers one of the pinched (double) hysteresis around 0 volts and creates the shifted pinched hysteresis branches 1702, 1704 as illustrated in FIG. 17B and FIG. 17C.

Depending on the chosen electrode materials, one of the two pinched loops can be centered. It is of advantage to choose the work function differences between the first and the second electrode such that one of the pinched (double) hysteresis is centered to zero external field as shown in FIG. 17B and FIG. 17C. After centering the one of the double hysteresis loops, a symmetric positive and negative electric field can be applied for setting the state of the pyroelectric device.

Figure 18A:
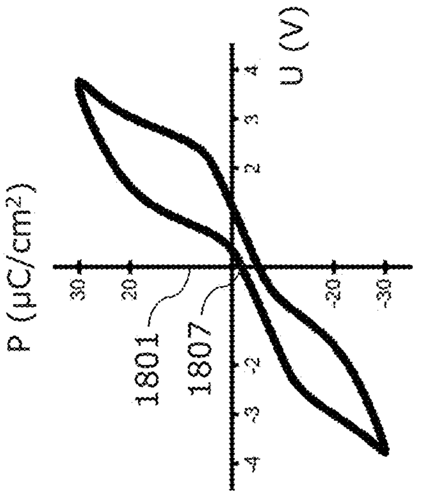
FIG. 18A illustrates the experimentally verified inventive concept to center the negative hysteresis loop of a layered device (FIG. 18B) with a DHL material with a work function difference between two electrodes. It illustrates the polarization-voltage data measured on a layered device comprising TiN/$Zr_{0.87}Hf_{0.13}O_2$/TiN where the $Zr_{0.87}Hf_{0.13}O_2$ is the DHL material. A symmetric double hysteresis loop is observed where only pyroelectric OFF states are available without external voltages.
Figure 18B:
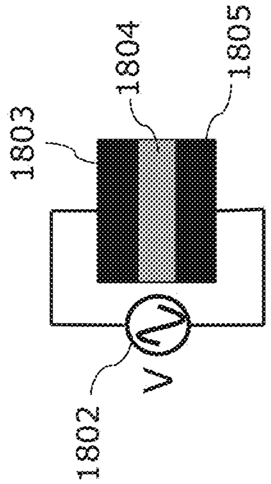
FIG. 18B illustrates a layered device with a DHL material with a work function difference between two electrodes comprising TiN/$Zr_{0.87}Hf_{0.13}O_2$/TiN where the $Zr_{0.87}Hf_{0.13}O_2$ is the DHL material.

FIG. 18B depicts a layered device comprising an 8 nm thick DHL $Zr_{0.9}Hf_{0.1}O_2$ layer 1804 with first TiN electrode 1805 and second TiN electrode 1803 connected to an external voltage source 1802. The measured charge-voltage characteristics 1801 are consistent with a DHL material FIG. 18A. At zero-applied electric field 1807, only a nonpolar state remains that is denoted as a pyroelectric "OFF" state, signifying a very weak or insignificant pyroelectric response. The first TiN electrode 1805 was deposited by physical vapor deposition at room temperature on a Si wafer. TiN electrodes are commonly used with $HfO_2$ and $ZrO_2$ based dielectrics because of the high thermal stability, suitable stress, and mid-gap energy alignment. The DHL $Zr_{0.87}Hf_{0.13}O_2$ layer 1804 was grown at 280° C. by atomic layer deposition with an alternating 8:1 cycle ratio of ZyALD and HyALD precursors with ozone as the oxidizer. The composition $Zr_{0.87}Hf_{0.13}O_2$ was chosen to obtain FFE DHL properties with a large magnitude polarization state. The second TiN electrode 1803 was deposited by physical vapor deposition at room temperature on the DHL $Zr_{0.87}Hf_{0.13}O_2$ layer. A rapid thermal anneal was performed at 500° C. for 20 s in $N_2$ to crystallize the DHL $Zr_{0.87}Hf_{0.13}O_2$ layer 1804, which achieves the desired DHL charge-voltage characteristics 1801. Individual capacitors were formed by evaporating Pt dots through a shadow mask, which were then used as a hard mask for a subsequent SCI wet etch of the second TiN electrode 1803.

Figure 18C:
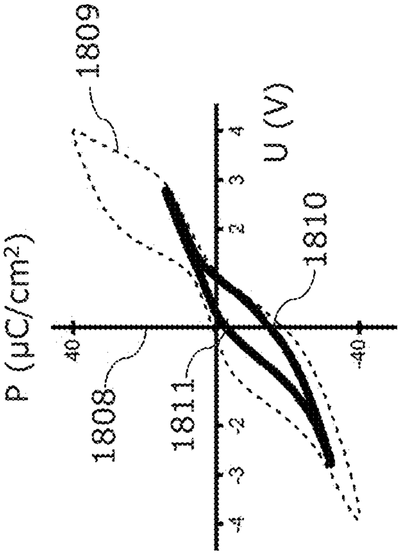
FIG. 18C illustrates the polarization-voltage data measured on a layered device FIG. 18D comprising TiN/$Zr_{0.87}Hf_{0.13}O_2$/$RuO_x$ where the $Zr_{0.87}Hf_{0.13}O_2$ is the DHL material. The higher workfunction of the $RuO_x$ compared to the TiN leads to a centering of the negative branch of the hysteresis loops and two stable zero-bias states, one of which is a pyroelectric ON state and the other a pyroelectric OFF state.
Figure 18D:
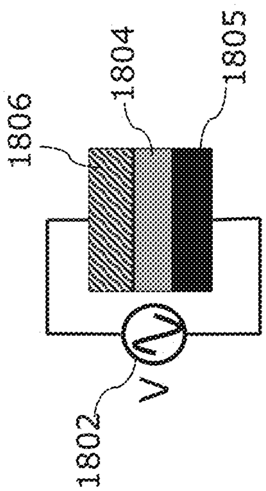
FIG. 18D illustrates a layered device with a DHL material between two electrodes comprising TiN/$Zr_{0.87}Hf_{0.13}O_2$/$RuO_x$ where the $Zr_{0.87}Hf_{0.13}O_2$ is the DHL material.

FIG. 18D depicts a layered device comprising an 8 nm thick DHL $Zr_{0.87}Hf_{0.13}O_2$ layer 1804 with a first TiN electrode 1805 and a second $RuO_x$ electrode 1806 connected to an external voltage source 1802. The workfunction difference between the TiN and $RuO_x$ centers the negative voltage hysteresis branch. The measured charge-voltage characteristics 1808 at higher applied voltages shows the DHL 1809, while a smaller applied voltage window yields repeatable switching between a pyroelectric "OFF" state 1811 and pyroelectric "ON" state 1810 FIG. 18C. The first TiN electrode 1805 was deposited by physical vapor deposition at room temperature on a Si wafer. TIN electrodes are commonly used with $HfO_2$ and $ZrO_2$ based dielectrics because of the high thermal stability, suitable stress, and mid-gap energy alignment. The DHL $Zr_{0.87}Hf_{0.13}O_2$ layer 1804 was grown at 280° C. by atomic layer deposition with an alternating 8:1 cycle ratio of ZyALD and HyALD precursors with ozone as the oxidizer. The composition $Zr_{0.87}Hf_{0.13}O_2$ was chosen to obtain FFE DHL properties with a large magnitude polarization state. The second TiN electrode 1803 was deposited by physical vapor deposition at room temperature on the DHL $Zr_{0.87}Hf_{0.13}O_2$ layer. A rapid thermal anneal was performed at 500° C. for 20 s in $N_2$ to crystallize the DHL $Zr_{0.87}Hf_{0.13}O_2$ layer 1804, which achieves the desired DHL charge-voltage characteristics 1801. The second TiN electrode 1803 was etched by an SCI solution. A second $RuO_x$ electrode 1806 was deposited by physical vapor deposition through a shadow mask to produce formed capacitors.

Figure 18E:
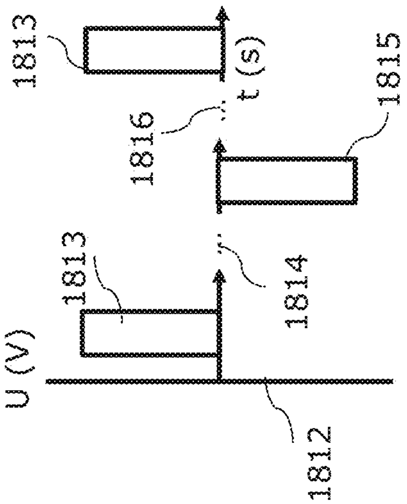
FIG. 18E illustrates a voltage-time relationship by a pulsed measurement sequence to switch the DHL pyroelectric device into pyroelectric ON (active) and OFF (inactive) states.

FIG. 18E depicts a voltage-time relationship 1812 to switch the DHL pyroelectric device. A voltage pulse 1813 is applied to the DHL transducer (i.e., the pyroelectric device) to change its state between a polarized and a non-polarized state, where this change in polarity corresponds, e.g., with a pyroelectric "ON" and "OFF" state. In terms of operation, a DHL pyroelectric device is similar to a ferroelectric pyroelectric device. Poling is accomplished by applying an electric field across the DHL material layer by charging the plates on either side of it, forcing the crystal lattice to adopt a polarized or non-polarized state (depending on the polarity of the charge), thereby setting a pyroelectric active or a pyroelectric inactive state. Sensing in a DHL pyroelectric device is the same as in a ferroelectric pyroelectric device. A temperature change leads to the generation of a pyroelectric current and voltage at the first and second electrode terminals of the transducing circuit element. A voltage pulse 1813 of sufficient magnitude in one polarity may be applied to switch between a polar state (pyroelectric "ON" state 1810) to a nonpolar state (pyroelectric "OFF" state 1811). The nonpolar state (pyroelectric "OFF" state 1811) will persist for a duration of time 1814 in the absence of an applied voltage. During this period of time 1814, the pyroelectric response is inactive and insignificant. A voltage pulse 1815 of significant magnitude in an opposite polarity may be applied to switch between a nonpolar state (pyroelectric "OFF" state 1811) to a polar state (pyroelectric "ON" state 1810). After the application of an opposite polarity voltage pulse 1815, the polar state (pyroelectric "ON" state 1810) will persist for a duration of time 1816 in the absence of an applied voltage. During this time 1816, the pyroelectric response is active and converts changes in temperature to an electrical signal. A subsequent voltage pulse 1813 of sufficient magnitude can switch a polar state (pyroelectric "ON" state 1810) to a nonpolar state (pyroelectric "OFF" state 1811). One cycle is defined as the application of one voltage pulse 1813 of sufficient magnitude to switch into the polar state (pyroelectric "ON" state 1810) followed by an opposite polarity voltage pulse 1815 of sufficient magnitude to switch into a nonpolar state (pyroelectric "OFF" state 1811). DHL materials can be cycled within the range of $10^3$-$10^{16}$ cycles.

The inventive concept applies to the examples illustrated in FIGS. 19A-26B. When the DHL material is poled into a pyroelectric "ON" state (see layers 404, 504, 604, 704, 804, 904, 1004, 1104), an electric current $I_p$ 204 and a voltage $V_p$ 205 is produced during a temperature change of the DHL material. When the DHL material is electrically poled into a pyroelectric "OFF" (see layers 401, 501, 601, 701, 801, 901, 1001, 1101), a negligible electric current $I_p$ 201 and a voltage $V_p$ 202 is produced during a temperature change of the DHL material. By applying voltage pulses to the second and first electrodes, facile switching between a pyroelectric "OFF" and "ON" state establishes the inventive concept for a nonvolatile pyroelectric switch.

Figure 19B:
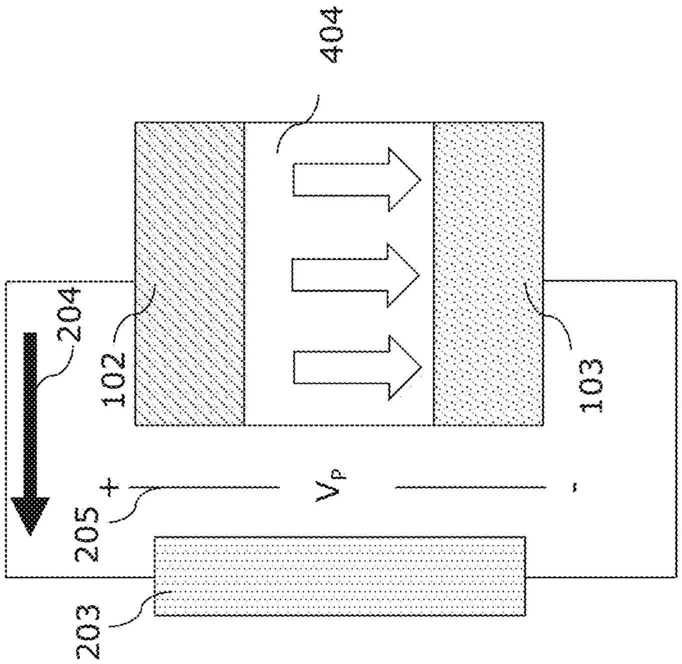
FIG. 19B illustrates the inventive concept of a field-induced ferroelectric capacitor with a built-in positive internal bias, such as between a TiN second and $RuO_x$ first electrode, and in the polar, zero applied bias state such that the polarization points to the first electrode. The polar state yields a pyroelectric current with a change in temperature and constitutes a pyroelectric ON state.
Figure 19A:
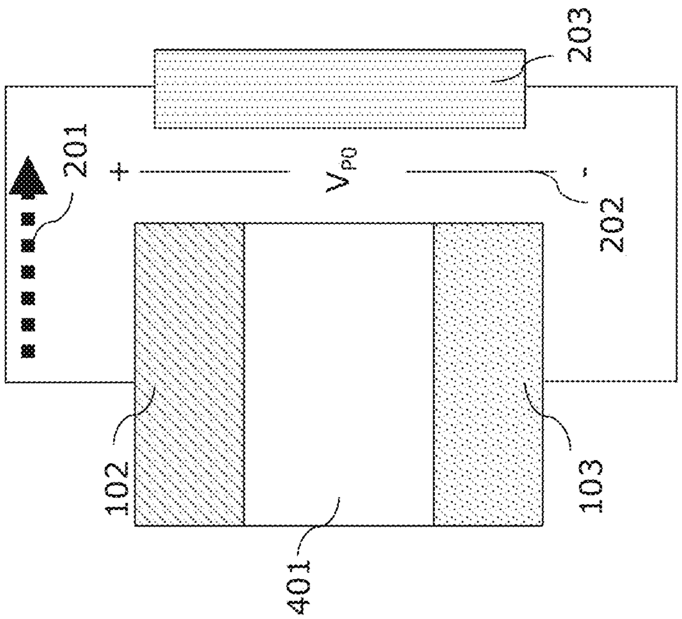
FIG. 19A illustrates the inventive concept of a field-induced ferroelectric capacitor with a built-in positive internal bias, such as between a TiN second and $RuO_x$ first electrode, and in the nonpolar zero applied bias state. The nonpolar state yields a negligible pyroelectric current with a change in temperature and constitutes a pyroelectric OFF state.

FIG. 19A illustrates the pyroelectric inactive state of an FFE DHL material layer 401. The inactive pyroelectric state of the FFE DHL material layer 401 is a nonpolar state and the "OFF" state of the pyroelectric switch. FIG. 19B illustrates the pyroelectric active state where the FFE DHL material has been polarized so that the dipole alignment of the FFE DHL material layer 404 is pointing from a first conducting layer (second electrode 102) to a second conducting layer (first electrode 103). The dipole aligned state of the FFE DHL material layer 404 is a polar state and the "ON" state of the pyroelectric switch. FIG. 19A and FIG. 19B illustrates the switchable "OFF" and "ON" states of the pyroelectric device in which a nonpolar state of layer 401 can be switched by a suitable electric field, as shown in FIG. 18E, so that the dipole alignment of the FFE DHL material layer 404 is pointing from a first conducting layer (second electrode 102) to a second conducting layer (first electrode 103). The two states and their respective transitions into each other by a suitable electric field, as shown in FIG. 18E, embody the inventive concept of a pyroelectric switch.

Figure 20B:
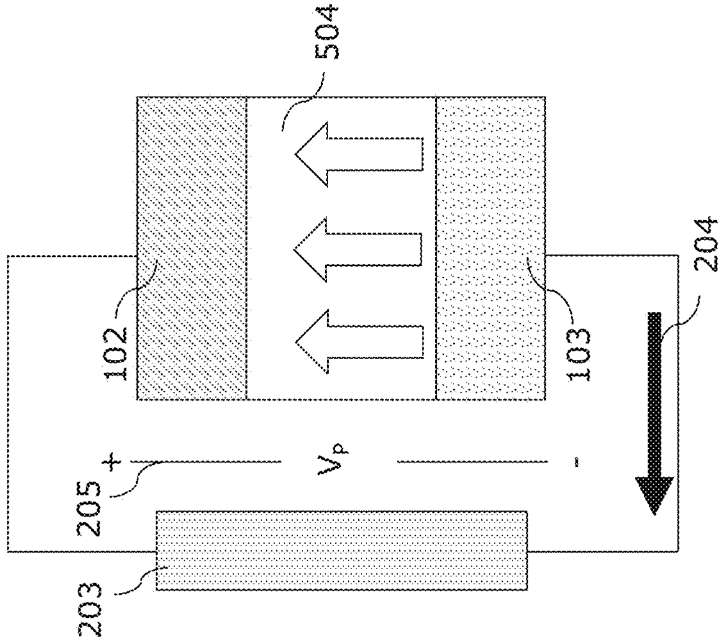
FIG. 20B illustrates the inventive concept of a field-induced ferroelectric capacitor with a built-in negative internal bias, such as between a TiN first and $RuO_x$ second electrode, and in the polar, zero applied bias state such that the polarization points to the second electrode. The polar state yields a pyroelectric current with a change in temperature and constitutes a pyroelectric ON state.
Figure 20A:
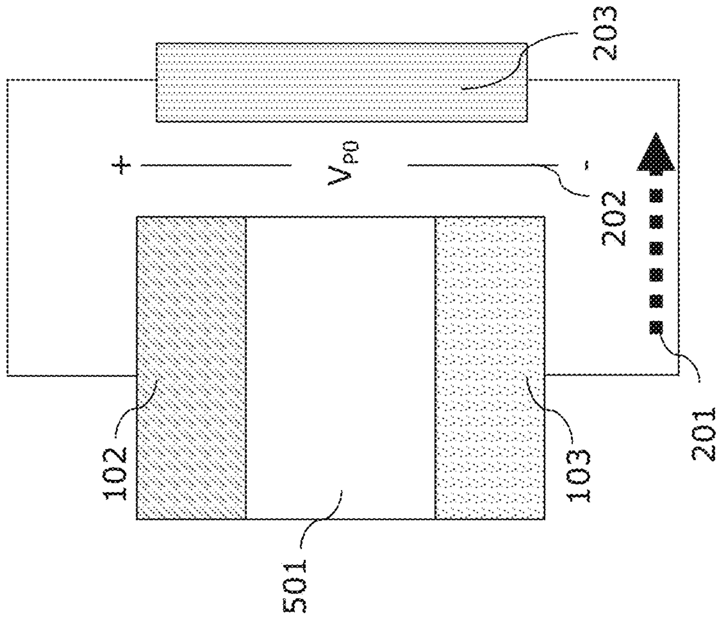
FIG. 20A illustrates the inventive concept of a field-induced ferroelectric capacitor with a built-in negative internal bias, such as between a TiN first and $RuO_x$ second electrode, and in the nonpolar zero applied bias state. The nonpolar state yields a negligible pyroelectric current with a change in temperature and constitutes a pyroelectric OFF state.

FIG. 20A illustrates the pyroelectric inactive state of FFE DHL material layer 501. The inactive pyroelectric state of the FFE DHL material layer 501 is a nonpolar state and the "OFF" state of the pyroelectric switch. FIG. 20B illustrates the pyroelectric active state where the FFE DHL material has been polarized so that the dipole alignment of the FFE DHL material layer 504 is pointing from a second conducting layer (first electrode 103) to a first conducting layer (second electrode 102). The dipole aligned state of the FFE DHL material layer 504 is a polar state and the "ON" state of the pyroelectric switch. FIG. 20A and FIG. 20B illustrates the switchable "OFF" and "ON" states of the pyroelectric device in which a nonpolar state of FFE DHL material layer 501 can be switched by a suitable electric field, as shown in FIG. 18E, so that the dipole alignment of the FFE DHL material layer 504 is pointing from a second conducting layer (first electrode 103) to a first conducting layer (second electrode 102). The two states and their respective transitions into each other by a suitable electric field, as shown in FIG. 18E, embody the inventive concept of a pyroelectric switch.

Figure 21B:
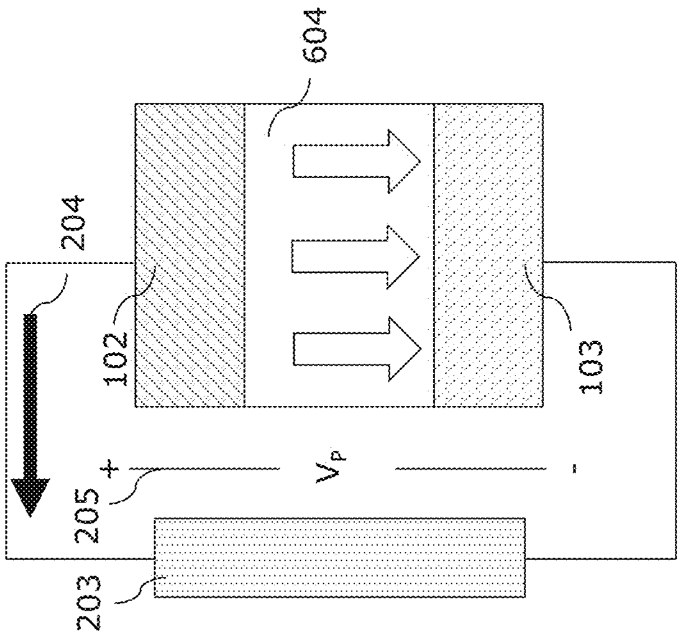
FIG. 21B illustrates the inventive concept of a Kittel-type antiferroelectric capacitor with a built-in positive internal bias, such as between a TiN second and $RuO_x$ first electrode, and in the polar, zero applied bias state such that the polarization points to the first electrode. The polar state yields a pyroelectric current with a change in temperature and constitutes a pyroelectric ON state.
Figure 21A:
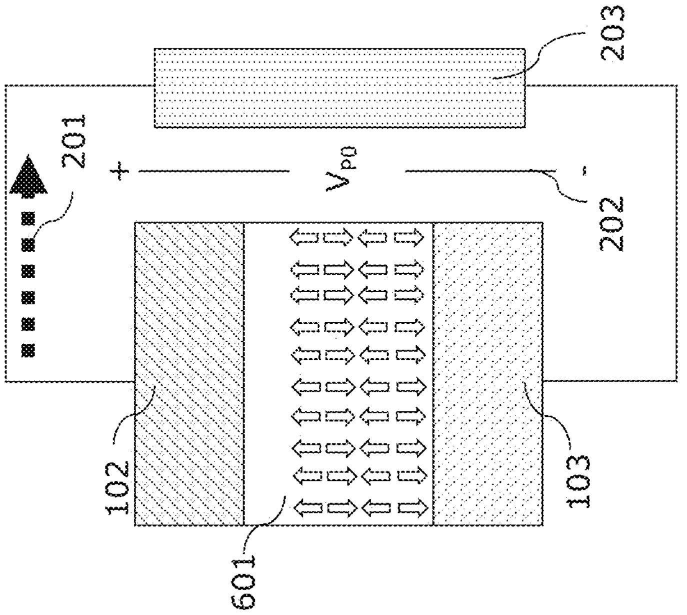
FIG. 21A illustrates the inventive concept of a Kittel-type antiferroelectric capacitor with a built-in positive internal bias, such as between a TiN second and $RuO_x$ first electrode, and in the antipolar zero applied bias state. The antipolar state yields a negligible pyroelectric current with a change in temperature and constitutes a pyroelectric OFF state.

FIG. 21A illustrates the pyroelectric inactive state of KAFE DHL material layer 601. The inactive pyroelectric state of the KAFE DHL material layer 601 is an antipolar state and the "OFF" state of the pyroelectric switch. FIG. 21B illustrates the pyroelectric active state where the KAFE DHL material has been polarized so that the dipole alignment of the KAFE DHL material layer 604 is pointing from a first conducting layer (second electrode 102) to a second conducting layer (first electrode 103). The dipole aligned state of the KAFE DHL material layer 604 is a polar state and the "ON" state of the pyroelectric switch. FIG. 21A and FIG. 21B illustrates the switchable "OFF" and "ON" states of the pyroelectric device in which an antipolar state of KAFE material layer 601 can be switched by a suitable electric field, as shown in FIG. 18E, so that the dipole alignment of the KAFE DHL material layer 604 is pointing from a first conducting layer (second electrode 102) to a second conducting layer (first electrode 103). The two states and their respective transitions into each other by a suitable electric field, as shown in FIG. 18E, embody the inventive concept of a pyroelectric switch.

Figure 22B:
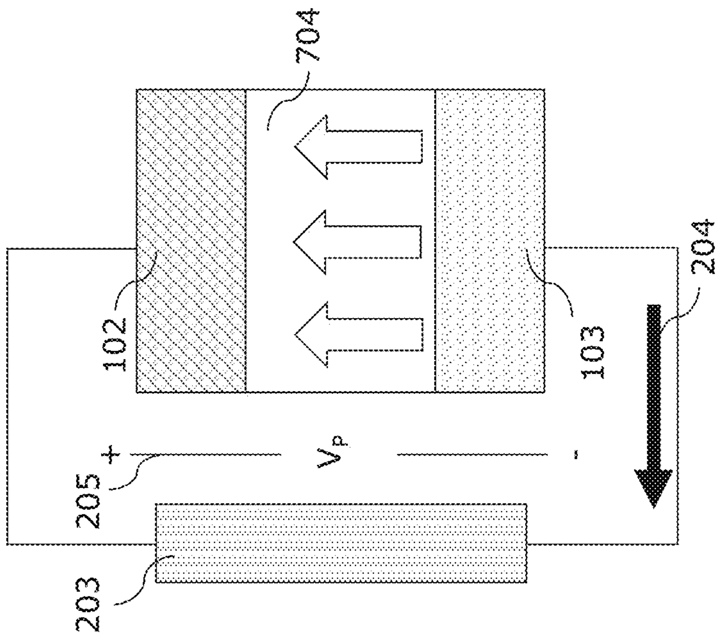
FIG. 22B illustrates the inventive concept of Kittel-type antiferroelectric capacitor with a built-in negative internal bias, such as between a TiN first and $RuO_x$ second electrode, and in the polar, zero applied bias state such that the polarization points to the second electrode. The polar state yields a pyroelectric current with a change in temperature and constitutes a pyroelectric ON state.
Figure 22A:
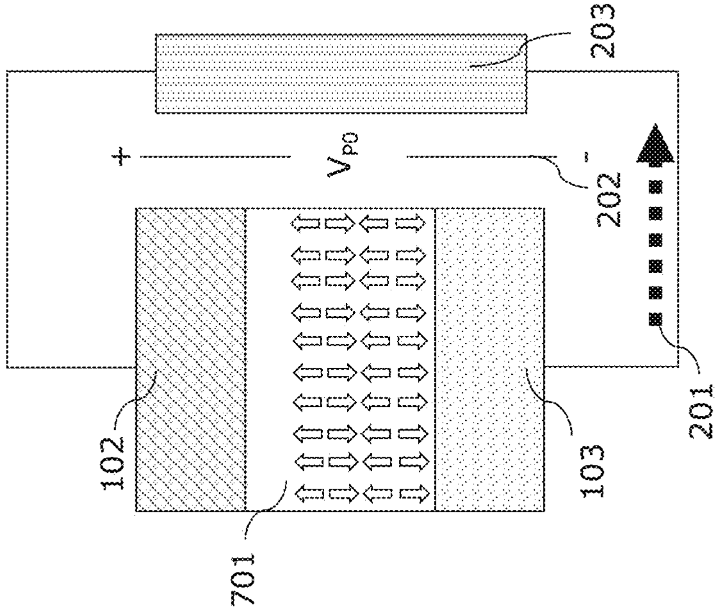
FIG. 22A illustrates the inventive concept of a Kittel-type antiferroelectric capacitor with a built-in negative internal bias, such as between a TiN first and $RuO_x$ second electrode, and in the antipolar zero applied bias state. The nonpolar state yields a negligible pyroelectric current with a change in temperature and constitutes a pyroelectric OFF state.

FIG. 22A illustrates the pyroelectric inactive state of KAFE DHL material layer 701. The inactive pyroelectric state of the KAFE DHL material layer 701 is an antipolar state and the "OFF" state of the pyroelectric switch. FIG. 22B illustrates the pyroelectric active state where the KAFE DHL material has been polarized so that the dipole alignment of the KAFE DHL material layer 704 is pointing from a second conducting layer (first electrode 103) to a first conducting layer (second electrode 102). The dipole aligned state of the KAFE DHL layer 704 is a polar state and the "ON" state of the pyroelectric switch. FIG. 22A and FIG. 22B illustrates the switchable "OFF" and "ON" states of the pyroelectric device in which an antipolar state of KAFE material layer 701 can be switched by a suitable electric field, as shown in FIG. 18E, so that the dipole alignment of the KAFE DHL material layer 704 is pointing from a second conducting layer (first electrode 103) to a second conducting layer (second electrode 102). The two states and their respective transitions into each other by a suitable electric field, as shown in FIG. 18E, embody the inventive concept of a pyroelectric switch.

Figure 23B:
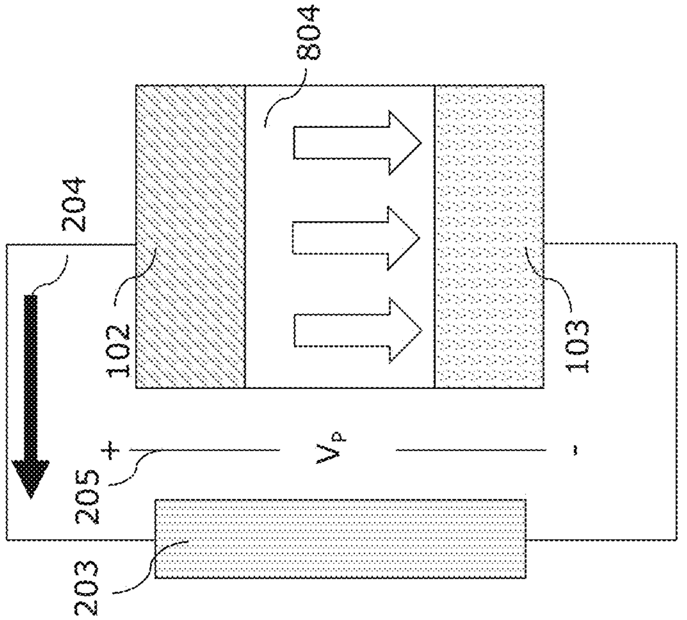
FIG. 23B illustrates the inventive concept of a defect-biased ferroelectric capacitor with a built-in positive internal bias, such as between a TiN second and $RuO_x$ first electrode, and in the polar, zero applied bias state such that the polarization points to the first electrode. The polar state yields a pyroelectric current with a change in temperature and constitutes a pyroelectric ON state.
Figure 23A:
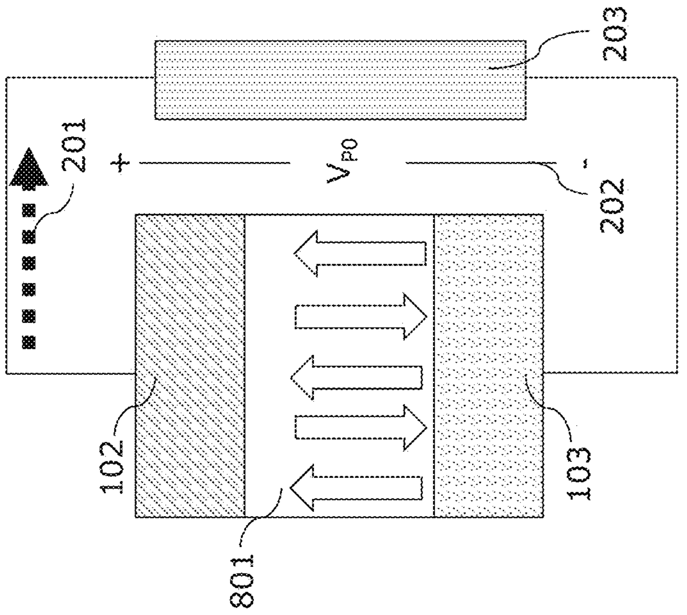
FIG. 23A illustrates the inventive concept of a defect-biased ferroelectric capacitor with a built-in positive internal bias, such as between a TiN second and $RuO_x$ first electrode, and in the net nonpolar zero applied bias state. The net nonpolar state yields a negligible pyroelectric current with a change in temperature and constitutes a pyroelectric OFF state.

FIG. 23A illustrates the pyroelectric inactive state of DBFE DHL material layer 801. The inactive pyroelectric state of the DBFE DHL material layer 801 is a ferroelectric state with pinned domains aligned in random or opposite directions and the "OFF" state of the pyroelectric switch. FIG. 23B illustrates the pyroelectric active state where the DBFE DHL material has been polarized so that the dipole alignment of the DBFE DHL material layer 804 is pointing from a first conducting layer (second electrode 102) to a second conducting layer (first electrode 103). The dipole aligned state of the DBFE DHL material layer 804 is a polar state and the "ON" state of the pyroelectric switch. FIG. 23A and FIG. 23B illustrates the switchable "OFF" and "ON" states of the pyroelectric device in which a pinned randomly polarized state of DBFE material layer 801 can be switched by a suitable electric field, as shown in FIG. 18E, so that the dipole alignment of the DBFE DHL material layer 804 is pointing from a first conducting layer (second electrode 102) to a second conducting layer (first electrode 103). The two states and their respective transitions into each other by a suitable electric field, as shown in FIG. 18E, embody the inventive concept of a pyroelectric switch.

Figure 24B:
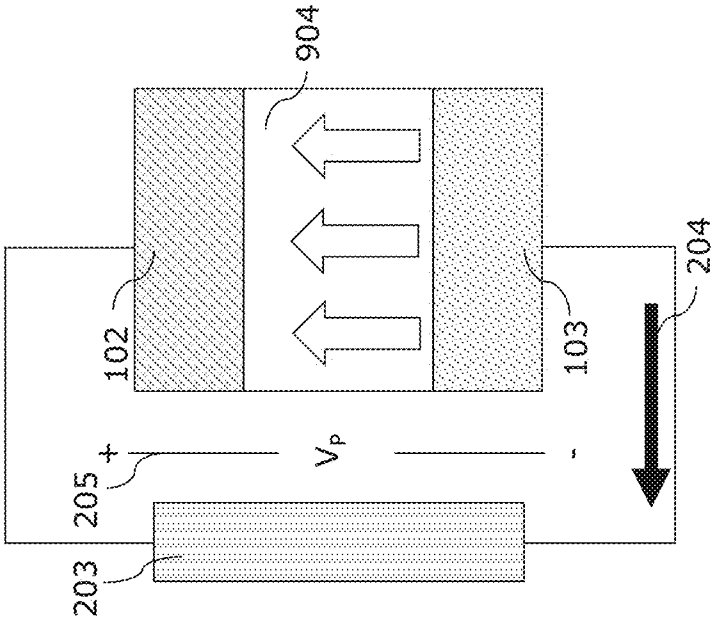
FIG. 24B illustrates the inventive concept of a defect-biased ferroelectric capacitor with a built-in negative internal bias, such as between a TiN first and $RuO_x$ second electrode, and in the polar, zero applied bias state such that the polarization points to the second electrode. The polar state yields a pyroelectric current with a change in temperature and constitutes a pyroelectric ON state.
Figure 24A:
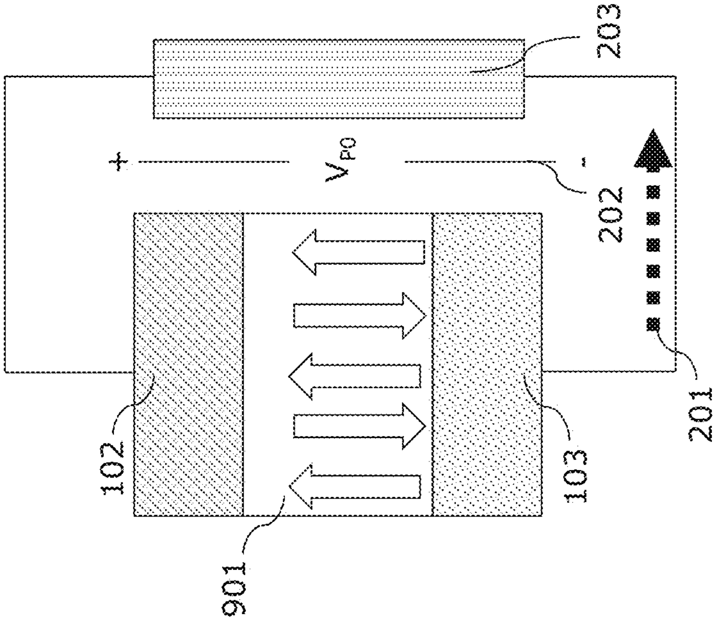
FIG. 24A illustrates the inventive concept of a defect-biased ferroelectric capacitor with a built-in negative internal bias, such as between a TiN first and $RuO_x$ second electrode, and in the net nonpolar zero applied bias state. The net nonpolar state yields a negligible pyroelectric current with a change in temperature and constitutes a pyroelectric OFF state.

FIG. 24A illustrates the pyroelectric inactive state of DBFE DHL material layer 901. The inactive pyroelectric state of the DBFE DHL material layer 901 is a ferroelectric state with pinned domains aligned in random or opposite directions and the "OFF" state of the pyroelectric switch. FIG. 24B illustrates the pyroelectric active state where the DBFE DHL material has been polarized so that the dipole alignment of the DBFE DHL material layer 904 is pointing from a second conducting layer (first electrode 103) to a first conducting layer (second electrode 102). The dipole aligned state of the DBFE DHL material layer 904 is a polar state and the "ON" state of the pyroelectric switch. FIG. 24A and FIG. 24B illustrates the switchable "OFF" and "ON" states of the pyroelectric device in which a pinned randomly polarized state of the DBFE DHL material layer 901 can be switched by a suitable electric field, as shown in FIG. 18E, so that the dipole alignment of the DBFE DHL material layer 904 is pointing from a second conducting layer (first electrode 103) to a first conducting layer (second electrode 102). The two states and their respective transitions into each other by a suitable electric field, as shown in FIG. 18E, embody the inventive concept of a pyroelectric switch.

Figure 25B:
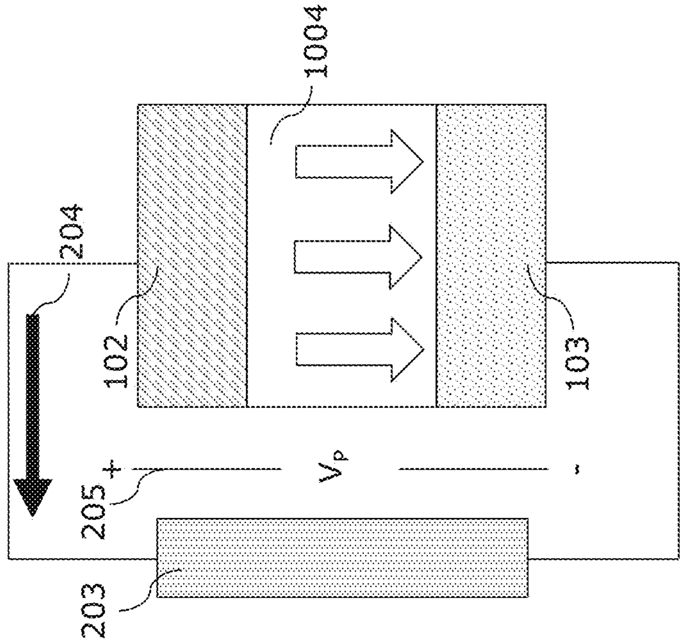
FIG. 25B illustrates the inventive concept of a ferroelastic switching capacitor with a built-in positive internal bias, such as between a TiN second and $RuO_x$ first electrode, and in the out-of-plane polar, zero applied bias state such that the polarization points to the first electrode. The out-of-plane polar state yields a pyroelectric current with a change in temperature and constitutes a pyroelectric ON state.
Figure 25A:
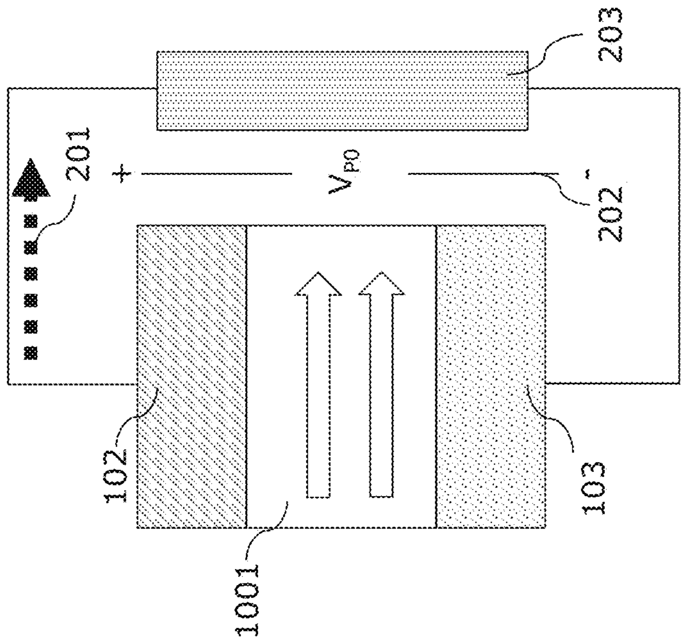
FIG. 25A illustrates the inventive concept of a ferroelastic switching capacitor with a built-in positive internal bias, such as between a TiN second and $RuO_x$ first electrode, and in the in-plane polar, zero applied bias state. The in-plane polar state yields a negligible pyroelectric current with a change in temperature and constitutes a pyroelectric OFF state.

FIG. 25A illustrates the pyroelectric inactive state of FES DHL material layer 1001. The inactive pyroelectric state of the FES DHL material layer 1001 is a ferroelectric state with domains aligned in-plane or parallel to the conducting layers and the "OFF" state of the pyroelectric switch. FIG. 25B illustrates the pyroelectric active state where the FES DHL material has been polarized so that the dipole alignment of the FES DHL material layer 1004 is pointing from a first conducting layer (second electrode 102) to a second conducting layer (first electrode 103). The dipole aligned state of the FES DHL material layer 1004 is a polar state and the "ON" state of the pyroelectric switch. FIG. 25A and FIG. 25B illustrates the switchable "OFF" and "ON" states of the pyroelectric device in which an in-plane polarization state of the FES DHL material layer 1001 can be switched by a suitable electric field, as shown in FIG. 18E, so that the dipole alignment of the FES DHL material layer 1004 is pointing from a first conducting layer (second electrode 102) to a second conducting layer (first electrode 103). The two states and their respective transitions into each other by a suitable electric field, as shown in FIG. 18E, embody the inventive concept of a pyroelectric switch.

Figure 26B:
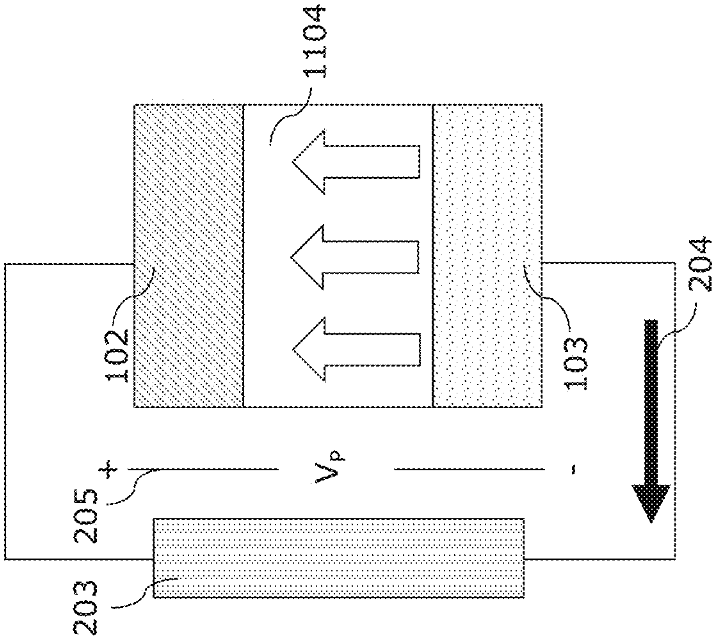
FIG. 26B illustrates the inventive concept of a ferroelastic switching capacitor with a built-in negative internal bias, such as between a TiN first and $RuO_x$ second electrode, and in the out-of-plane polar, zero applied bias state such that the polarization points to the second electrode. The out-of-plane polar state yields a pyroelectric current with a change in temperature and constitutes a pyroelectric ON state.
Figure 26A:
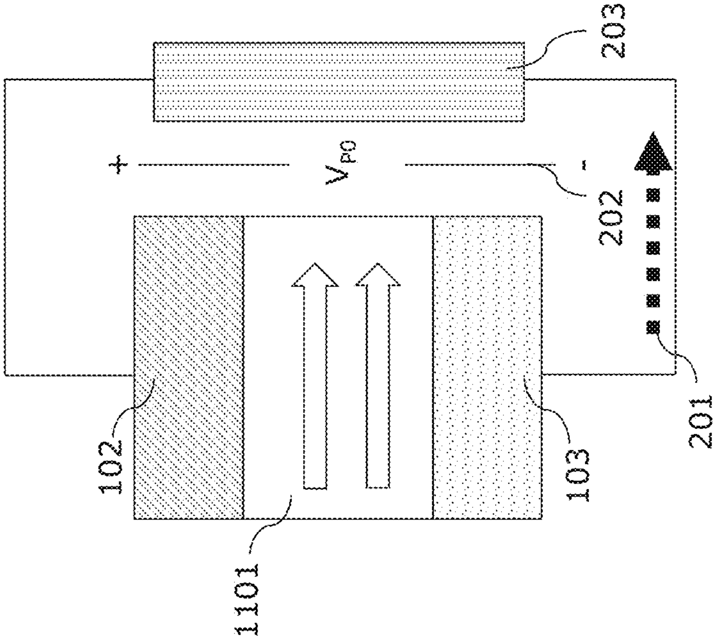
FIG. 26A illustrates the inventive concept of a ferroelastic switching capacitor with a built-in negative internal bias, such as between a TiN first and $RuO_x$ second electrode, and in the in-plane polar, zero applied bias state. The in-plane polar state yields a negligible pyroelectric current with a change in temperature and constitutes a pyroelectric OFF state.

FIG. 26A illustrates the pyroelectric inactive state of an FES DHL material layer 1101. The inactive pyroelectric state of the FES DHL material layer 1101 is a ferroelectric state with domains aligned in-plane or parallel to the conducting layers and the "OFF" state of the pyroelectric switch. FIG. 26B illustrates the pyroelectric active state where the FES DHL material has been polarized so that the dipole alignment of the FES DHL material layer 1104 is pointing from a second conducting layer (first electrode 103) to a first conducting layer (second electrode 102). The dipole aligned state of the FES DHL material layer 1104 is a polar state and the "ON" state of the pyroelectric switch. FIG. 26A and FIG. 26B illustrates the switchable "OFF" and "ON" states of the pyroelectric device in which an in-plane polarization state of the FES DHL material layer 1101 can be switched by a suitable electric field, as shown in FIG. 18E, so that the dipole alignment of the FES DHL material layer 1104 is pointing from a second conducting layer (first electrode 103) to a first conducting layer (second electrode 102). The two states and their respective transitions into each other by a suitable electric field, as shown in FIG. 18E, embody the inventive concept of a pyroelectric switch.

For FIG. 19A to FIG. 26A, a negligible electric current $I_p$ 201 and a negligible voltage $V_P$ 202 is produced during a temperature change of the DHL material. The second electrode 102 is connected by a conductor to one terminal of the load 203 and the first electrode 103 is connected to another terminal of the load 203. For FIG. 19B to FIG. 26B, an electric current $I_p$ 204 and a voltage $V_p$ 205 is produced during a temperature change of the DHL material. The second electrode 102 is connected by a conductor to one terminal of the load 203 and the first electrode 103 is connected to another terminal of the load 203.

Figure 27A:
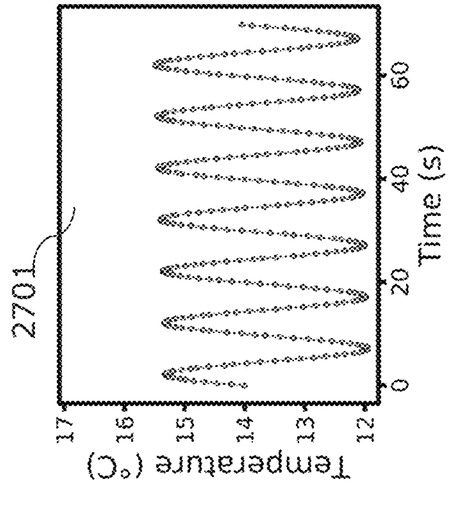
FIG. 27A illustrates proof of the inventive concept showing a sinusoidal temperature change with time 2701 that is applied to the DHL material poled in the pyroelectric "ON" state.
Figure 27B:
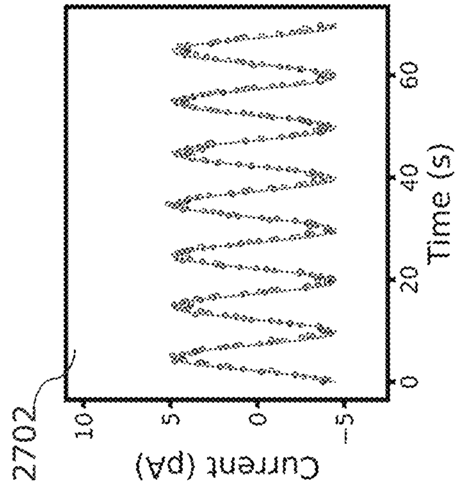
FIG. 27B illustrates proof of the inventive concept showing a sinusoidal electric current vs. time 2702 that is produced from the sinusoidal temperature change 2701 when the DHL material that was poled in the pyroelectric "ON" (active) state. The measurement data is acquired from zero-applied field pyroelectric measurement of a field-induced ferroelectric in the pyroelectric ON state with a pyroelectric current magnitude of approximately 5 pA.
Figure 27D:
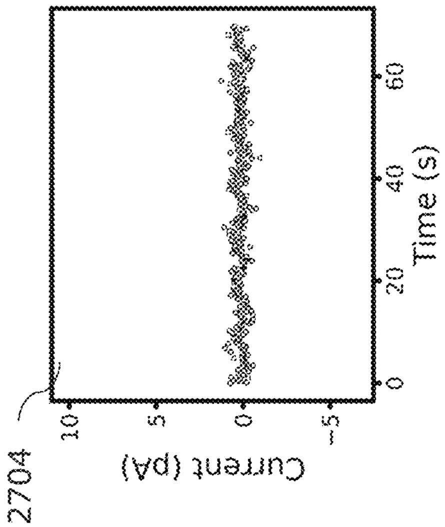
FIG. 27D illustrates proof of the inventive concept showing a sinusoidal electric current vs. time 2704 that is produced from the sinusoidal temperature change 2703 when the DHL material that was poled in the pyroelectric "OFF" (active) state. The measurement data illustrates proof of the inventive concept showing a zero-applied field pyroelectric measurement of a field-induced ferroelectric in the pyroelectric OFF state with a pyroelectric current magnitude of negligible magnitude (<1 pA).
Figure 27C:
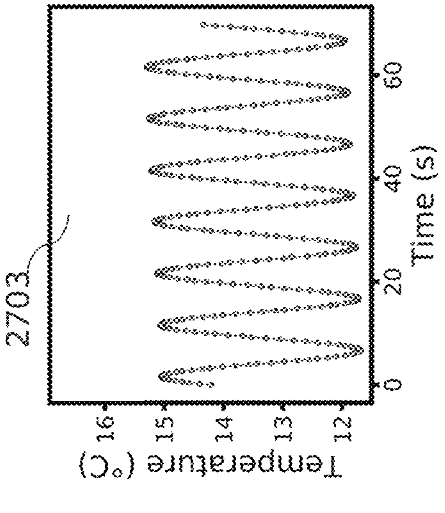
FIG. 27C illustrates proof of the inventive concept showing a sinusoidal temperature change with time 2703 that is applied to the DHL material poled in the pyroelectric "OFF" state.

Measured results of a DHL material as described in detail in FIG. 18B in the pyroelectric "ON" state and pyroelectric "OFF" state are illustrated in FIG. 27A to 27D. A sinusoidal temperature change with time 2701 is applied to the DHL material that was poled in the pyroelectric "ON" state (FIG. 27A). The DHL transducer in the "ON" state produces a sinusoidal current with an amplitude of 5 pA that is phase-shifted with respect to the temperature stimulus 2702 (FIG. 27B). A sinusoidal temperature change with time 2703 is applied to the DHL material that was poled in the pyroelectric "OFF" state (FIG. 27C). A negligible pyroelectric current is produced when the DHL material has been set into the inactive pyroelectric "OFF" state 2704 (FIG. 27D). The pyroelectric "ON" and "OFF" states are toggled by applying bipolar square voltage pulses above the forward transition fields of the DHL material, although the shape of the applied voltage pulse is not limited to square voltage pulses and smaller voltages below the transition fields may be applied for longer times to achieve similar transitions between the pyroelectric "ON" and "OFF" states.

Figure 28:
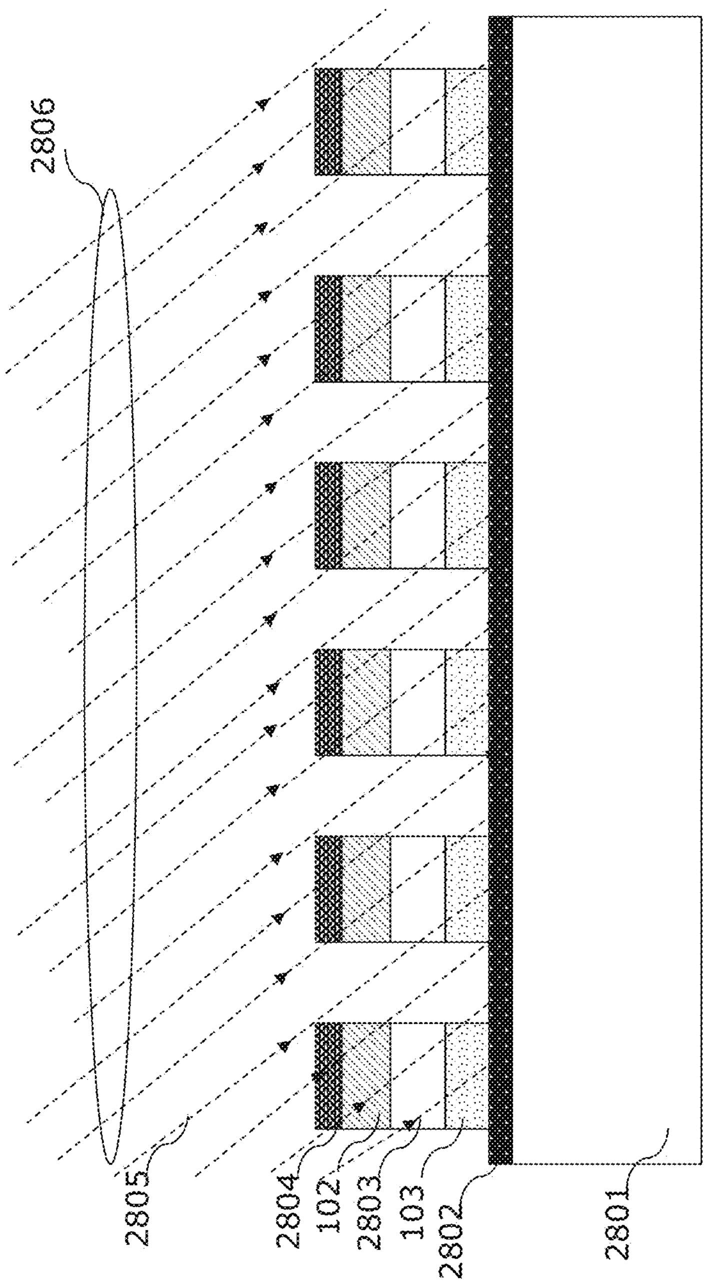
FIG. 28 illustrates environmental radiation optically guided to an array of thermal sensors and pixels on a substrate.

In one example implementation of the inventive concept, FIG. 28, an array of thermal sensor pixels are fabricated on top of a substrate 2801. A thermally insulating layer 2802, which can be patterned to each thermal sensor geometry, can be used to reduce thermal cross-talk between adjacent pixels. Microcavities in the substrate 2801 can also be used to eliminate thermal cross talk between pixels. The stack comprising a conductive layer (second electrode 102), a DHL material layer 2803 which can comprise the DHL material layers 404, 504, 604, 704, 804, 904, 1004, or 1104, and a conductive layer (first electrode 103) is deposited on the substrate 2801 and/or thermally insulating layer 2802. An absorptive radiative material layer 2804 is deposited on top of conductive layer (second electrode 102), facilitating conversion of incoming electromagnetic radiation 2805 to heat. Optics 2806 work in conjunction with a chopper and the DHL material layer 2803 to facilitate conversion of the electromagnetic radiation 2805 to an electrical signal.

Figure 29A:
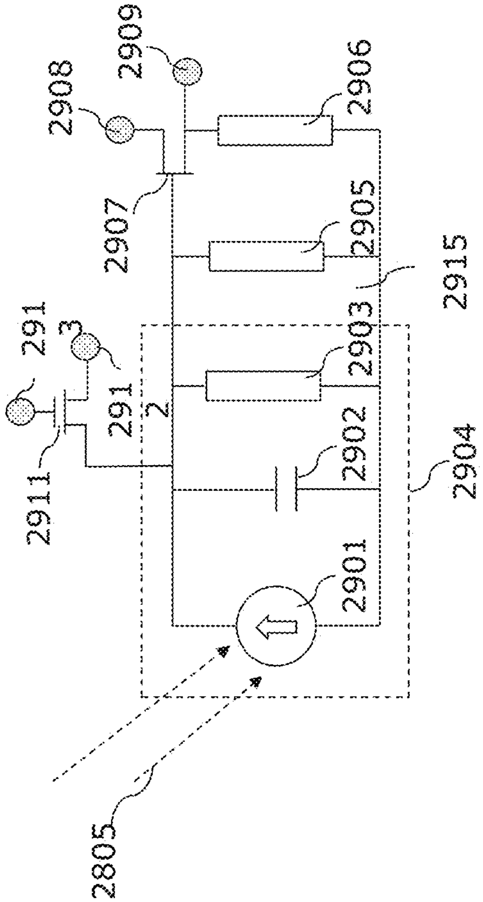
FIGS. 29A and 29B illustrate an irradiated pyroelectric switch element in both the pyroelectric ON and pyroelectric OFF state as incorporated into a voltage readout circuit.
Figure 29B:
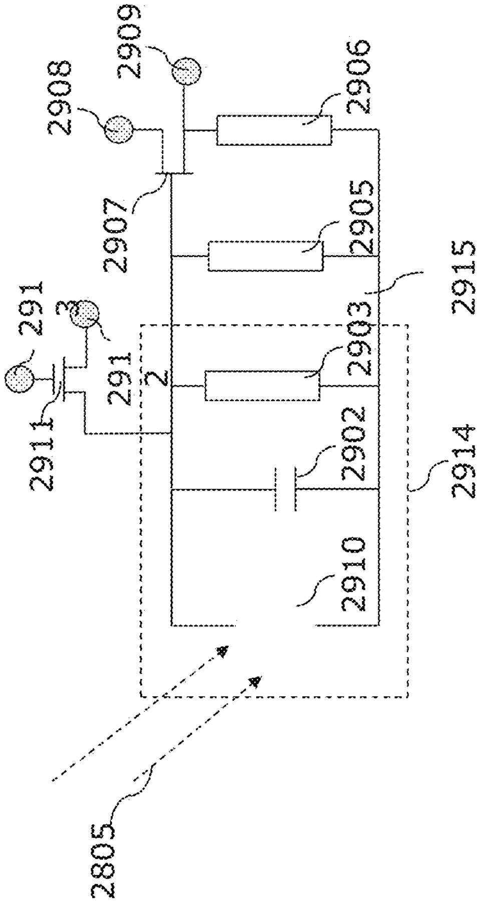

An example of the described pyroelectric switch element incorporated into a voltage readout circuit is shown in FIGS. 29A and 29B. The pyroelectric switch element 2904, 2914 receives incoming electromagnetic radiation 2805. In the "ON" state, FIG. 29A, the irradiated pyroelectric switch element 2904 includes a current source 2901, a parallel capacitance 2902, and a parallel resistance 2903. An input resistor 2905 can optionally be placed in parallel with the pyroelectric element if the pyroelectric parallel resistance is larger than the input resistance of the transistor 2907, although an input resistor 2905 is in general not needed because of the high input resistance when a junction field effect transistor or metal oxide semiconductor field effect transistor is employed. A voltage potential 2908 is applied to one input terminal of the transistor. When a pyroelectric current source 2901 is generated by incoming electromagnetic radiation, an output voltage potential is produced at one terminal of the transistor 2909 with a series connected load resistor 2906. One method for introducing a biasing element to the pyroelectric switch is to connect a transistor 2911 to one of its terminals with a control voltage 2913 and a biasing voltage 2912. When the transistor 2911 is turned on by a suitable control voltage 2913, a biasing voltage 2912 of sufficient magnitude is applied across the pyroelectric switch element 2904, 2914 to put it in an "ON" state with a pyroelectric current source 2901 or an "OFF" state with an open circuit 2910, FIG. 29B. Biasing of the pyroelectric switch element 2904, 2914 is most suitably performed without the input resistor 2905 or by choosing a very large value of resistance such that the input resistor 2905 is much larger than the parallel resistance 2903 of the pyroelectric switch element.

Multiple pyroelectric switch elements 2904 and 2914 may be placed in parallel or in series to obtain the desired voltage output operation of the readout circuit 2915. Biasing of the pyroelectric switch elements 2904 and 2914 may be performed individually or in parallel, with the control circuitry not limited to the examples shown in FIGS. 29A and 29B.

Figure 30A:
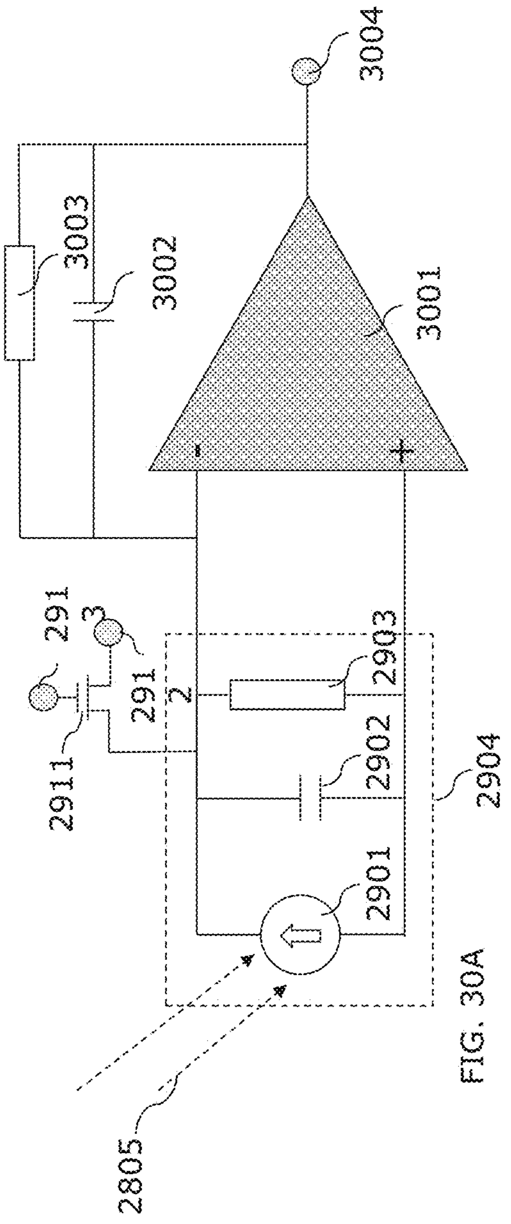
FIGS. 30A and 30B depict an irradiated pyroelectric switch element in both the pyroelectric ON and pyroelectric OFF state as incorporated into a current readout circuit.
Figure 30B:
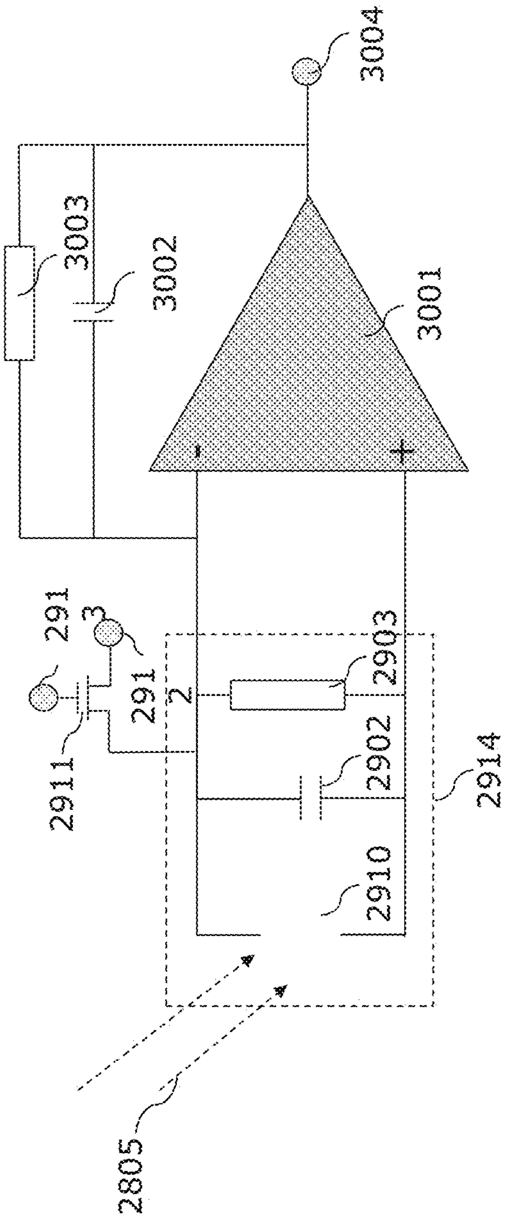

An example of the described pyroelectric switch element incorporated into a current readout circuit is shown in FIGS. 30A and 30B. The pyroelectric switch element 2904, 2914 receives incoming electromagnetic radiation 2805. In the "ON" state, FIG. 30A, the irradiated pyroelectric switch element 2904 includes a current source 2901, a parallel capacitance 2902, and a parallel resistance 2903. One terminal of the pyroelectric switch element 2904, 2914 is connected to one input terminal of an operational amplifier 3001, and the second terminal of the pyroelectric switch element 2904, 2914 is connected to the second input terminal of the operational amplifier 3001. A feedback capacitor 3002 and a parallel feedback resistor 3003 connect one input of the operational amplifier 3001 to the output of the operational amplifier 3004 where the output signal is generated. One method for introducing a biasing element to the pyroelectric switch is to connect a transistor 2911 to one of its terminals with a control voltage 2913 and a biasing voltage 2912. When the transistor 2911 is turned on by a suitable control voltage 2913, a biasing voltage 2912 of sufficient magnitude is applied across the pyroelectric switch element 2904, 2914 to put it in an "ON" state with a pyroelectric current source 2901 or an "OFF" state, FIG. 30B, with an open circuit 2910. Biasing of the pyroelectric switch element 2904, 2914 is most suitably performed by parallel feedback resistor 3003 with a large resistance, which is desirable in any case because the cutoff frequency, given by the inverse product of the feedback resistance and capacitance, needs to be below the measuring frequency.

Turning the pyroelectric element ON and OFF can reduce readout circuitry, FIGS. 29A and 29B and FIGS. 30A and 30B, when more than one pyroelectric element is packaged into an infrared detector. Furthermore, the ON and OFF functionality of the pyroelectric elements can improve infrared detector and imager lifetime. Improved lifetime can be achieved, for example, by deactivating malfunctioning or aging pyroelectric elements and activating operational or non-aged pyroelectric elements through the switching functionality granted by the inventive concept.

Figure 31:
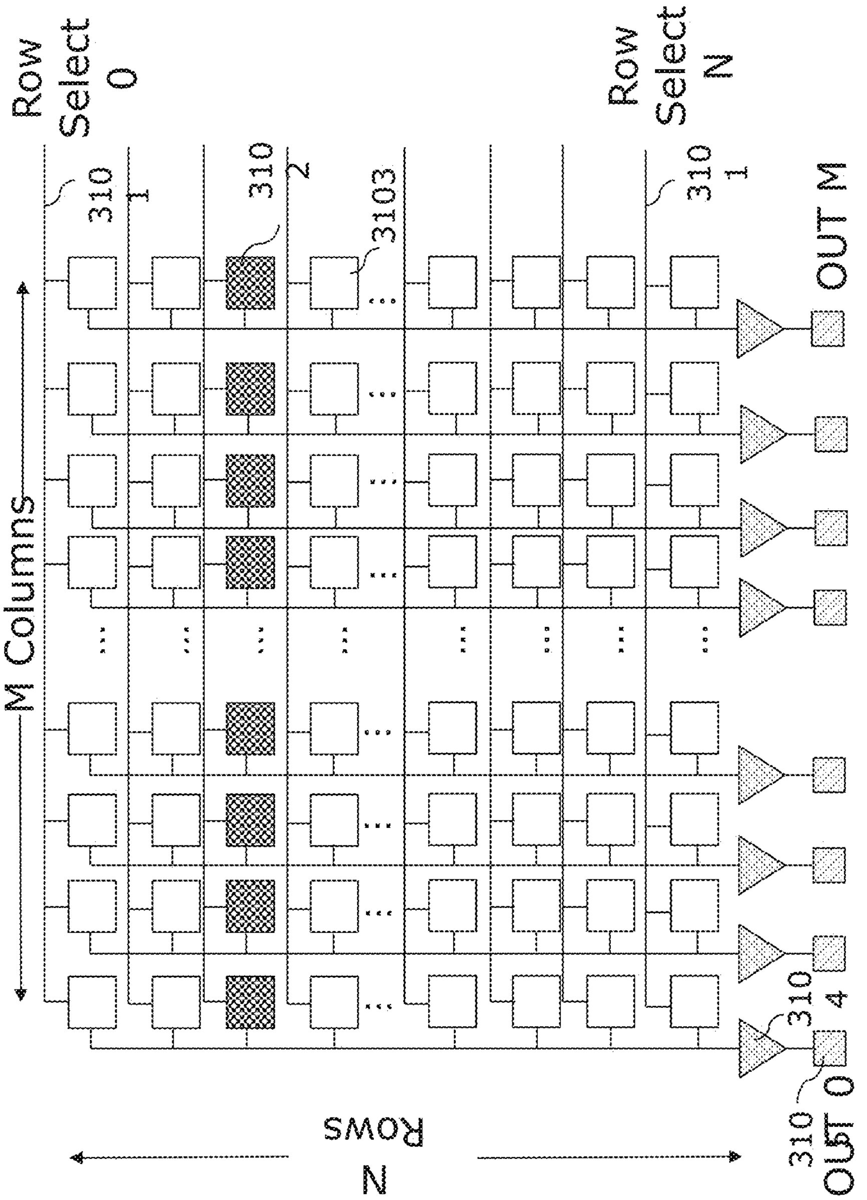
FIG. 31 illustrates a 2-dimensional M×N array of thermal sensor pixels with pyroelectric switch elements. Individual rows of the thermal sensors are activated one at a time and the resulting pyroelectric signal is read through the column outputs, replacing the need to use a chopper to deactivate thermal sensor pixel rows.

FIG. 31 shows an example that employs nonvolatile pyroelectric switches in a 2-dimensional M×N array of thermal sensor pixels. In one implementation, the row select 3101 is used to turn to the ON state a 1×M row of thermal sensor pixels 3102, each containing a pyroelectric switch, where the individual active thermal pixel signals travel along the column, buffered by an amplifier or other readout circuitry 3104 and sent to the output 3105 for further signal processing. The row select 3101 can additionally be used to switch to the OFF state a row of a thermal sensor pixels 3103. In one aspect, the row select employs a transistor connecting the pyroelectric row elements to a voltage bias that places the elements into the ON or OFF state. In this implementation, the single row select transistor can replace the transistors within each pyroelectric element. A voltage applied to the gate of the transistor connects the biasing voltage to switch the pyroelectric switch elements of the thermal sensor pixels 3102 arranged in a row. In one implementation, the thermal sensor pixel array is scanned along the rows in a vertical direction, activating one thermal sensor pixel row at a time to produce a thermal image. One method is to place all nonvolatile pyroelectric switches into the OFF state, activate a row by placing all thermal sensor pixels 3102 in the thermal sensor pixel row into the ON state, read and sample the pyroelectric signal, process the pyroelectric signal for detection and/or imaging, deactivate the thermal sensor row, then activate the next thermal sensor pixel row into the ON state, read and sample the pyroelectric signal, process the pyroelectric signal for detection and/or imaging, and repeating such that all thermal signals from every row have been obtained for constructing a thermal imaging or detection profile. The particular array geometry, activation, and deactivation pattern of the pyroelectric switches are not limited to this implementation and can take on an arbitrary plurality of forms to obtain the desired scanning behavior for infrared sensing and thermal imaging applications. Choppers are used in infrared detection and imaging systems to provide contrast for slow-moving or static objects. Deactivation of thermal sensor pixels in the OFF state can replace the inactive state of a thermal pixel when covered by a chopper, whereas an activated thermal sensor pixel row in the ON state can replace the state when the chopper does not cover a thermal sensor pixel. Since the switching speed of the pyroelectric elements into the ON or OFF states by electrical biasing is extremely fast, limited only by a phase transition or polarization switching speed of the elements (i.e., ranging from picoseconds to hundreds of nanoseconds in magnitude), the readout frequency is not limited by the switching frequency of the pyroelectric elements but will be limited by the thermal and electrical capacitances influencing pixel responsivity. A chopper produces a continuous temperature gradient for static or slowly moving objects, thus providing a kind of thermal refresh to obtain signals in uncooled infrared detectors and imagers. The chopperless design incorporating the inventive concept does not produce such a thermal refresh of the pyroelectric elements, therefore, moving the thermal image across the array elements may be necessary in applications that require imaging static or slowly moving objects, as has been achieved using pyroelectric thermal vidicon camera tubes for instance. The inventive concept produces new functionality that can overcome limitations that choppers cause in uncooled pyroelectric infrared detectors and thermal imagers, greatly simplifying the packaging and design and enhancing the electronic readout of the thermal sensors.

Figure 32:
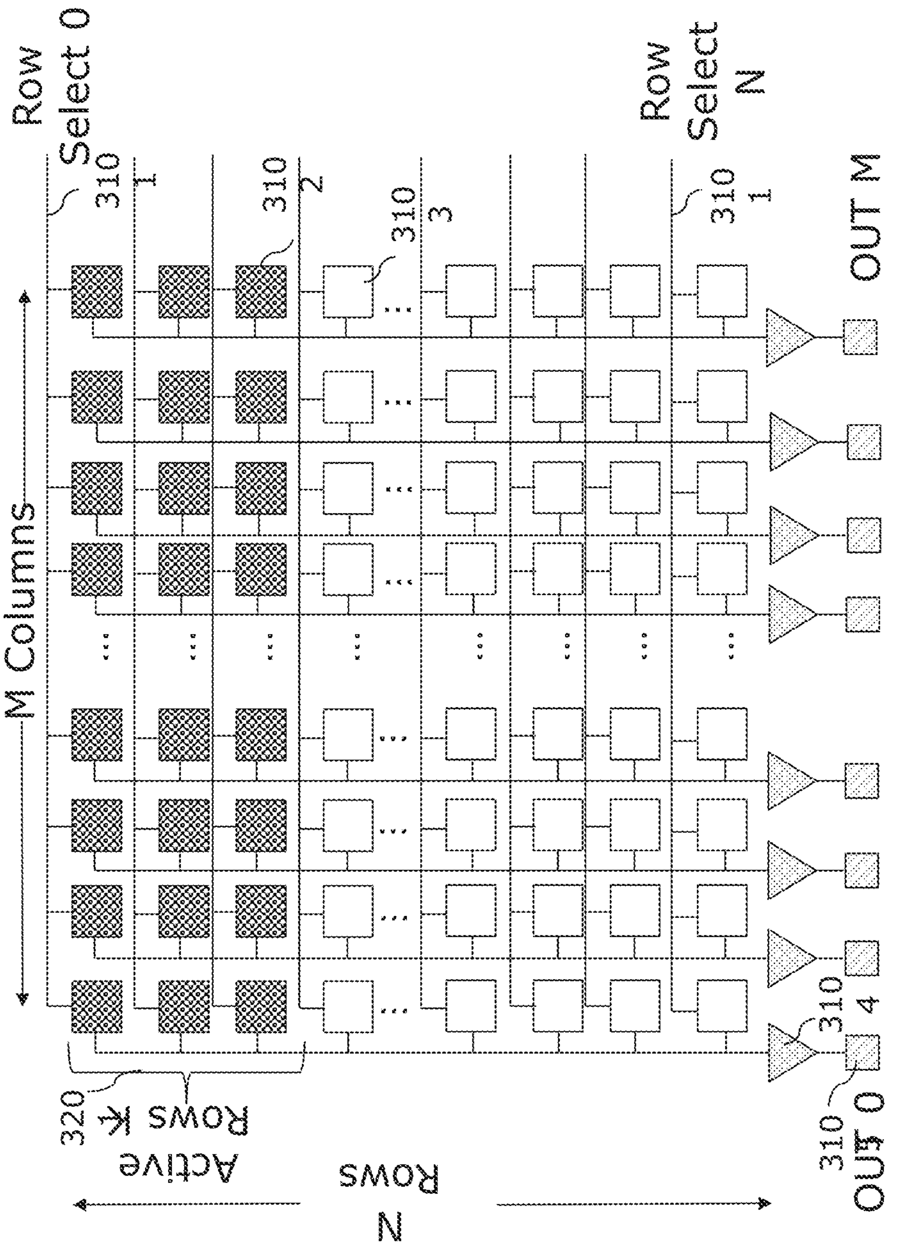
FIG. 32 illustrates a 2-dimensional M×N array of thermal sensor pixels with pyroelectric switch elements. By activating contiguous rows of thermal sensors with pyroelectric switches in the ON state, the signal to noise ratio can be reduced at the cost of a reduction in spatial resolution. Likewise, reducing the number of contiguous activated pyroelectric rows can enhance the spatial resolution of the resulting infrared image. The array with pyroelectric switches has reprogrammable image resolution and signal to noise ratio.

FIG. 32 illustrates an example that employs nonvolatile pyroelectric switches in a 2-dimensional M×N array of thermal sensor pixels to attain adjustable thermal image resolution and signal to noise ratio. Row select 3101 is used to activate one or more contiguous thermal sensor pixel rows 3201, enhancing the thermal pixels' signal to noise ratio with a reduction in thermal image spatial resolution. Any combination of activating one or more contiguous pixel elements into the pyroelectric ON state can increase the signal to noise ratio, thus increasing the pixel size and reducing the number of pixels in the resulting thermal image. Likewise, deactivating contiguous thermal sensor pixels by switching the nonvolatile pyroelectric switches into the OFF state can increase the pixel count and reduce the pixel size, thus producing a higher resolution image at the cost of a lower signal to noise ratio. The adjustability of the pixel count and signal-to-noise ratio by activating or deactivating contiguous pyroelectric elements in the same column is caused by the summation of the pyroelectric signal by all active pyroelectric elements within the same column in the array, as per the example shown in FIG. 32. Thus, when two contiguous rows are activated, the pyroelectric signal is summed on the column line increasing the signal intensity at the cost of spatial imaging resolution. The inventive concept employed to achieve adjustable pixel size and image resolution is not limited to this particular implementation, but can be attained in an arbitrary number of ways by turning the nonvolatile pyroelectric switches into the ON and OFF states for reprogrammable functionality.

Figure 33:
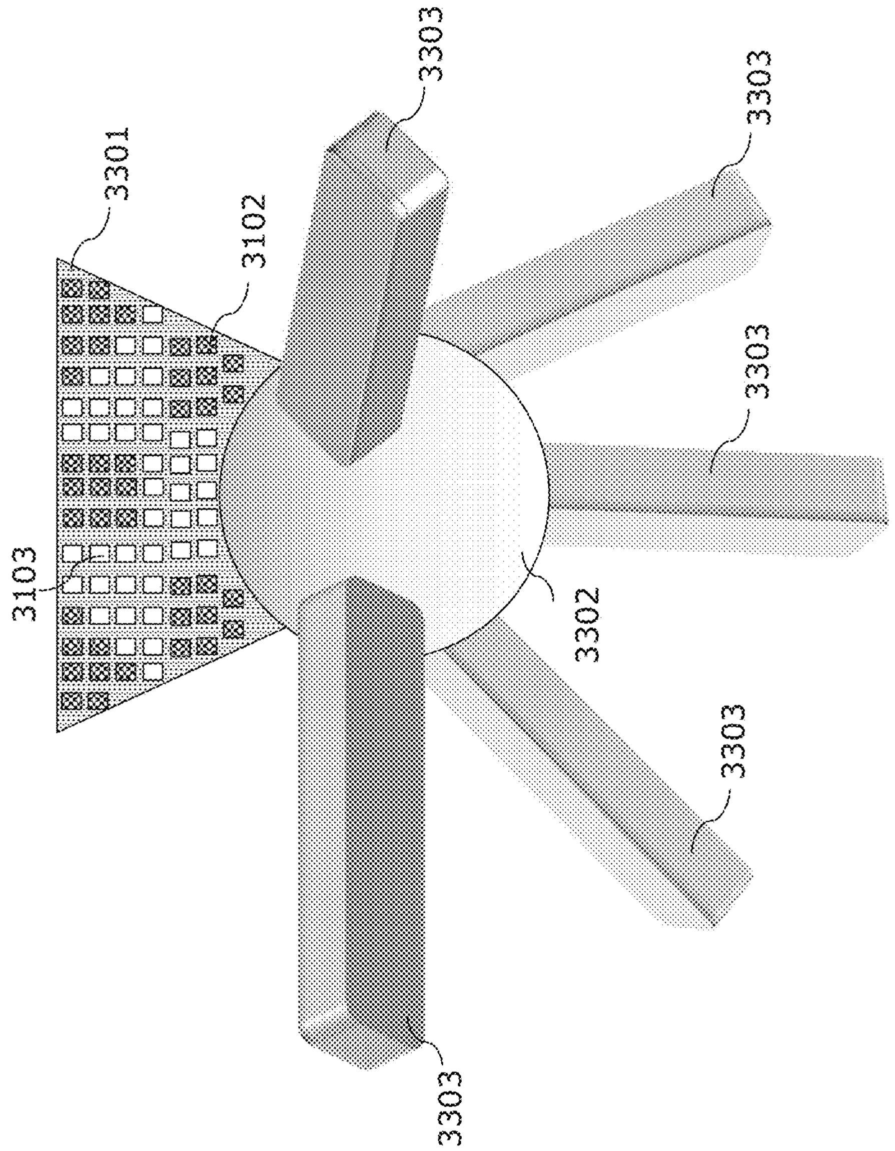
FIG. 33 illustrates an infrared detector employing the nonvolatile pyroelectric switches to detect objects along multiple reprogrammable beam paths.

FIG. 33 illustrates an application of the inventive concept wherein a nonvolatile pyroelectric switch array is incorporated into a package 3302 with appropriate optics for an infrared detector with one or more reprogrammable beam paths 3303 for object detection. The package 3302 contains optics with guided environment electromagnetic radiation 3301 onto the pixel array by suitable design for the spatial detection geometry, such as 1-dimensional, 2-dimensional, or 3-dimensional incident electromagnetic radiation coming from the environment. One or more thermal sensor pixels 3102, each having a pyroelectric switch element, are in the ON state, which produces infrared detection beam paths 3303. One or more thermal sensor pixels 3103, each having a pyroelectric switch, are in the OFF state, preventing incoming environmental radiation from being sensed in the according space as determined by the optics and design of the thermal sensor pixel array. Reprogrammable directional detectors can be used to detect objects in multiple places at one, while excluding places where detection is not needed or wanted. Intruder detection systems, automobiles, and autonomous systems are particular application spaces where directional IR detection can prevent false detections and improve system efficiency.

Figure 34:
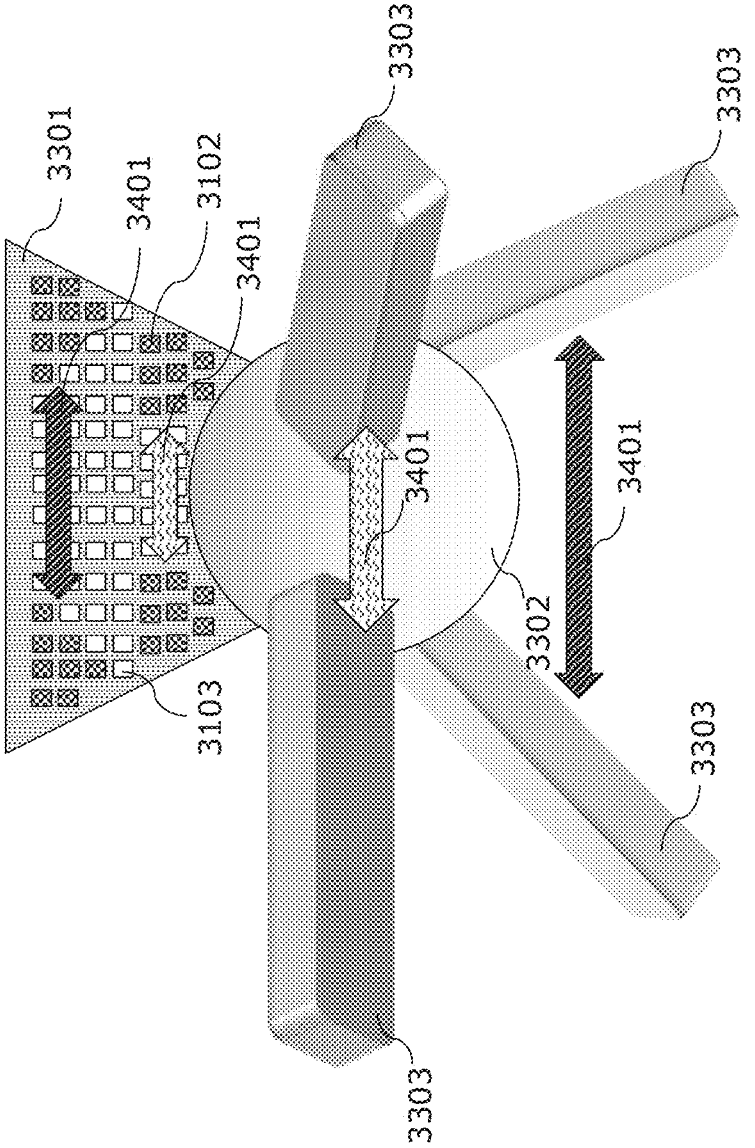
FIG. 34 illustrates an infrared scanning system employing the nonvolatile pyroelectric switches capable of moving multiple, reprogrammable infrared detection beams along paths of interest.
Figure 35:
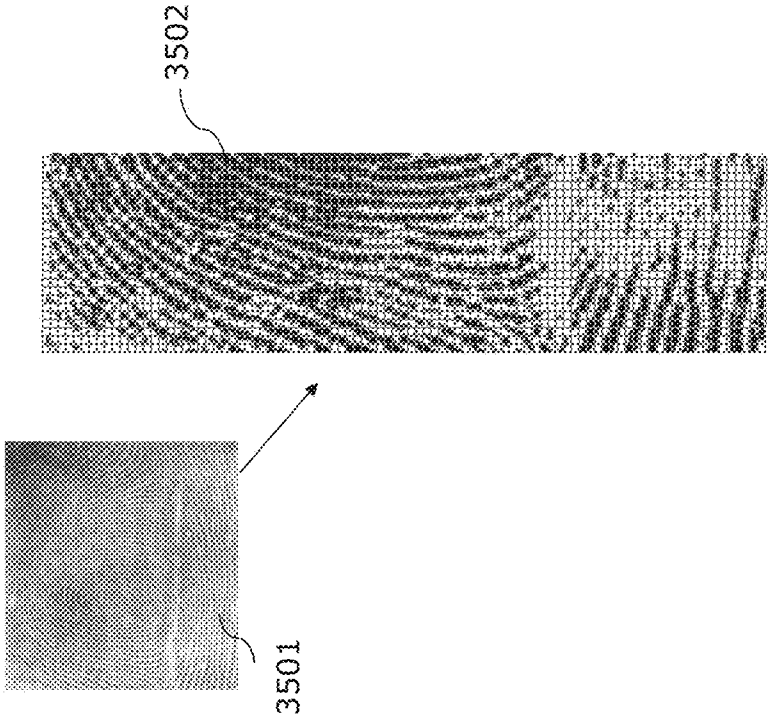
FIG. 35 illustrates a thermal pixel array comprising nonvolatile pyroelectric switches that serves as a security or encryption key, such as in the case of a human fingerprint.

FIG. 34 illustrates an application of the inventive concept wherein a nonvolatile pyroelectric switch array is incorporated into a package 3302 with appropriate optics for an infrared detector with one or more reprogrammable beam paths 3303 that move to scan the environment space. One or more electromagnetic radiation sensing beam paths 3303 are moved by deactivating ON thermal sensor pixels 3102 and activating OFF thermal sensor pixels 3103 according to the desired spatial scanning path 3401. IR scanning of the environment by one or more beam paths 3303 by employing the inventive concept can be used for a variety of security, warfare, tracking, detection, and imaging applications FIG. 35 illustrates a reprogrammable pyroelectric switch array that is used as an activation password, security or encryption key. Biometric data, such as a fingerprint 3501, can be used to program the thermal sensor pixel array with the pyroelectric switches 3502. The stored biometric pattern in the pyroelectric switch pixel array serves as the lock or encryption key for an individual to gain access to a system or place of entry. Any object or thermal signature can serve as a pattern lock and encryption key when stored on the thermal sensor pixel array. For instance, the alignment of the stars from a ground-based IR pyroelectric switch array programmed with a particular star alignment pattern can be made operate a system on any given day on Earth, thus achieving precise timing of a system functionality by using the sky as an activation password via its thermal signature.

Although the specific examples have been illustrated and described herein, it will be appreciated by those of ordinary skilled in the art that a variety of alternate and/or equivalent implementations may be substituted for the specific examples shown and described without departing from the scope of the disclosed concepts. This application is intended to cover any adaptations or variations of the specific examples described herein. Therefore, it is intended that the scope be limited only by the claims and the equivalents thereof.

What is claimed is:

1. A pyroelectric device, comprising:

first and second electrodes that enable a voltage to be applied to the pyroelectric device, wherein a zero applied voltage condition results in the absence of an external electric field in the pyroelectric device; and a material layer between the first and second electrodes, comprising a double hysteresis loop (DHL) material having a charge-voltage characteristic exhibiting first and second hysteresis loops, wherein the material layer resides in a built-in, internal electric field that shifts the charge-voltage characteristic of the DHL material such that a point along one of the first and second hysteresis loops of the charge-voltage characteristic coincides with the zero applied voltage condition to enable the DHL material to persist, in the absence of an external electric field, in a pyroelectric on-state.

2. The pyroelectric device of claim 1, wherein the DHL material is capable of being switched into the pyroelectric on-state by a first voltage pulse being applied to the pyroelectric device via the first and second electrodes, the first voltage pulse having a first polarity and sufficient magnitude to create a first external electric field that switches the DHL material into a pyroelectrically active, polarized state.

3. The pyroelectric device of claim 2, wherein the DHL material is capable of being switched into a pyroelectric off-state by a second voltage pulse being applied to the pyroelectric device via the first and second electrodes, the second voltage pulse having a second polarity and sufficient magnitude to create a second external electric field that switches the DHL material into a pyroelectrically inactive, nonpolarized state.

4. The pyroelectric device of claim 1, wherein, in the pyroelectric on-state, the material layer converts received electromagnetic radiation to an electrical signal, and in a pyroelectric off-state, the material layer produces a negligible pyroelectric current in response to received electromagnetic radiation.

5. The pyroelectric device of claim 1, wherein the DHL material comprises at least one of a polar material, an antipolar material, and a nonpolar material.

6. The pyroelectric device of claim 1, wherein the first electrode comprises a first material having a first workfunction and the second electrode comprises a second material having a second workfunction that is different from the workfunction of the first material, wherein the difference between the first and second workfunctions establishes the built-in, internal electric field.

7. The pyroelectric device of claim 6, wherein the difference between the first and second workfunctions is in a range of 0.1 eV-3.5 eV.

8. The pyroelectric device of claim 6, wherein the difference between the first and second workfunctions is in a range of 0.3 eV-2 eV.

9. The pyroelectric device of claim 1, wherein the DHL material is a band-gap material having a band-gap of at least 0.8 eV.

10. The pyroelectric device of claim 1, wherein the built-in, internal electric field results from electric charge stored in the DHL material, a static defect charge, a surface charge, and/or from an additional layer that introduces a surface charge.

11. The pyroelectric device of claim 1, wherein the DHL material comprises at least one of: an anti-ferroelectric (AFE) material, a field-induced ferroelectric (FFE) material, a relaxor ferroelectric (RFE) material, a ferroelastic switching (FES) material, and a defect-biased ferroelectric (DBFE) material.

12. The pyroelectric device of claim 1, wherein the DHL material comprises at least one of $HfO_2$, $ZrO_2$, $ZrO_2$ doped with one or more of: Al, Ti, Si, Gd, La, Sr, Ge, Y, Sc, and Ca, and $HfO_2$, doped with one or more of: Al, Ti, Si, Gd, La, Sr, Ge, Y, Sc, and Ca.

13. The pyroelectric device of claim 1, wherein the DHL material comprises at least one of $Pb_{1-x}La_x(Zr_{1-y}Ti_y)O_3$, $PbZrO_3$, $BaTiO_3$, and $Pb(Zr_{1-y}Ti_y)O_3$.

14. The pyroelectric device of claim 1, wherein the first electrode and the second electrode comprise a material of or a combination of: Ti, TiN, TiSi, TiAlN, TaN, TaCN, TaSi, W, WSi, WN, Al, Ru, RuO, $RuO_2$, Re, Pt, Ir, IrO, $IrO_2$, $In_2O_3$, InSnO, SnO, ZnO, Ti, Ni, NiSi, Nb, NbN, Ga, GaN, Mo, MoO, C, Ge, Si, doped Si, SiC, and GeSi.

15. An infrared or thermal imaging system comprising:

a plurality of pyroelectric pixels capable of detecting infrared radiation and converting the infrared radiation into electrical signals, wherein individual ones of the pyroelectric pixels comprise a pyroelectric device according to claim 1.

16. A pyroelectric device, comprising:

a layer stack including:

a first electrode having a first workfunction;

a second electrode having a second workfunction, wherein a difference between the first and second workfunctions is in a range of 0.1 eV-3.5 eV; and a band-gap material layer between the first and second electrodes and switchable between a pyroelectric on-state and a pyroelectric off-state.

17. The pyroelectric device of claim 16, wherein the band-gap material layer comprises a double hysteresis loop (DHL) material having a charge-voltage characteristic exhibiting first and second hysteresis loops, the DHL material residing in an internal electric field generated by the difference between the first and second workfunctions, the internal electric field shifting the charge-voltage characteristic of the DHL material to enable the DHL material to be switchable between the pyroelectric on-state and the pyroelectric off-state.

18. The pyroelectric device of claim 16, wherein the band-gap material layer comprises at least one of a polar dielectric material, an antipolar dielectric material, and a nonpolar dielectric material.

19. The pyroelectric device of claim 16, wherein the difference between the first and second workfunctions is in the range of 0.3 eV to 2 eV and the band-gap material layer has a band gap of at least 0.8 eV.

20. The pyroelectric device of claim 16, wherein:

the band-gap material layer is capable of being switched into the pyroelectric on-state by a first voltage pulse being applied to the pyroelectric device via the first and second electrodes, the first voltage pulse having a first polarity and sufficient magnitude to create a first external electric field that switches the band-gap material layer into a pyroelectrically active, polarized state that persists passively in a subsequent absence of the first external electric field; and the band-gap material layer is capable of being switched into the pyroelectric off-state by a second voltage pulse being applied to the pyroelectric device via the first and second electrodes, the second voltage pulse having a second polarity and sufficient magnitude to create a second external electric field that switches the band-gap material layer into a pyroelectrically inactive, nonpolarized state that persists passively in a subsequent absence of the second external electric field.

* * * * *